United States Patent
Shinohara et al.

(10) Patent No.: US 7,659,043 B2
(45) Date of Patent: Feb. 9, 2010

(54) COMPOSITION FOR CONDUCTIVE MATERIALS, CONDUCTIVE MATERIAL, CONDUCTIVE LAYER, ELECTRONIC DEVICE, AND ELECTRONIC EQUIPMENT

(75) Inventors: Takashi Shinohara, Suwa (JP); Yuji Shinohara, Suwa (JP); Koichi Terao, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 490 days.

(21) Appl. No.: 11/665,335

(22) PCT Filed: Oct. 17, 2005

(86) PCT No.: PCT/JP2005/019438

§ 371 (c)(1),
(2), (4) Date: Apr. 13, 2007

(87) PCT Pub. No.: WO2006/043680

PCT Pub. Date: Apr. 27, 2006

(65) Prior Publication Data

US 2009/0088550 A1   Apr. 2, 2009

(30) Foreign Application Priority Data

Oct. 18, 2004 (JP) .............................. 2004-302470

(51) Int. Cl.
*C07C 211/00* (2006.01)
*C07C 211/43* (2006.01)
*G03G 15/02* (2006.01)
*H05B 33/14* (2006.01)
*C08F 26/00* (2006.01)
*G03G 15/00* (2006.01)
*H01L 51/30* (2006.01)

(52) U.S. Cl. ...................... 430/58.8; 526/258; 526/266; 526/312; 526/256; 564/309; 257/40; 313/504; 430/58.05; 430/58.35; 430/58.65; 430/58.75

(58) Field of Classification Search ............. 430/58.05, 430/58.35, 58.65, 58.75, 58.8; 526/256, 526/258, 266, 312; 257/40; 313/504; 564/309
See application file for complete search history.

(56) References Cited

U.S. PATENT DOCUMENTS

| | | | |
|---|---|---|---|
| 5,858,633 A | | 1/1999 | Chen et al. |
| 5,882,831 A | * | 3/1999 | Fuller et al. ................. 430/57.8 |
| 5,929,194 A | | 7/1999 | Woo et al. |
| 6,132,913 A | * | 10/2000 | Fuller et al. ................. 430/591 |
| 6,232,025 B1 | * | 5/2001 | Srinivasan ................. 430/58.4 |
| 6,485,873 B1 | * | 11/2002 | Ohkura et al. ................. 430/83 |
| 6,646,164 B2 | * | 11/2003 | Uemura et al. ............. 564/429 |
| 6,750,608 B2 | * | 6/2004 | Matsuura et al. ............ 313/504 |
| 6,800,410 B2 | * | 10/2004 | Yasutomi et al. .............. 430/35 |
| 6,800,411 B2 | * | 10/2004 | Tong et al. ............... 430/58.05 |
| 7,232,633 B2 | * | 6/2007 | Qi et al. ..................... 430/58.8 |
| 7,309,557 B2 | * | 12/2007 | Yoshizawa et al. ....... 430/124.1 |
| 7,592,112 B2 | * | 9/2009 | Shiino et al. ............... 430/59.1 |
| 7,598,010 B2 | * | 10/2009 | Kita et al. ................. 430/58.85 |
| 2008/0309229 A1 | * | 12/2008 | Steudel et al. .............. 313/504 |
| 2009/0009061 A1 | * | 1/2009 | Shinohara et al. ........... 313/504 |
| 2009/0088550 A1 | | 4/2009 | Shinohara et al. |

FOREIGN PATENT DOCUMENTS

| | | |
|---|---|---|
| JP | A 9-255774 | 9/1997 |
| JP | A 2000-208254 | 7/2000 |
| JP | A-2006-114797 | 4/2006 |
| WO | WO 03/074628 A1 | 9/2003 |

OTHER PUBLICATIONS

Y. Zhang et al., "Photo-Crosslinkable Polymers as Hole-Transport Materials for Organic Light-Emitting Diodes", Journal of Materials Chemistry, vol. 12, May 2002, pp. 1703-1708.
B. Domercq et al., "Photo-Patternable Hole-Transport Polymers for Organic Light-Emitting Diodes", Chemistry of Materials vol. 154, No. 7, Mar. 2003, pp. 1491-1496.
M. Bayerl et al., "Crosslinkable Hole-Transport Materials for Preparation of Multilayer Organic Light Emitting Devices by Spin-Coating", Macromolecular: Rapid Communications, vol. 20, No. 4, 1999, pp. 224-228.

* cited by examiner

Primary Examiner—Susan W Berman
(74) Attorney, Agent, or Firm—Oliff & Berridge, PLC

(57) ABSTRACT

The object of the present invention is to provide a composition for conductive materials from which a conductive layer having a high carrier transport ability can be made, a conductive material formed of the composition and having a high carrier transport ability, a conductive layer formed using the conductive material as a main material, an electronic device provided with the conductive layer and having high reliability, and electronic equipment provided with the electronic device. The composition for conductive materials of the present invention comprising a compound represented by the following general formula (A1): wherein two $R^1$s may be the same or different and each independently represents a straight-chain alkyl group having 2 to 8 carbon atoms, four $R^2$s may be the same or different and each independently represents a hydrogen atom, a methyl group, or an ethyl group, Y represents a group containing at least one substituted or unsubstituted aromatic hydrocarbon ring or substituted or unsubstituted heterocycle, and two $X^1$s may be the same or different and each independently represents a substituent represented by the following general formula (A2): wherein n' is an integer of 3 to 8, $m^1$ s an integer of 0 to 3, and $Z^1$ represents a hydrogen atom, a methyl group or an ethyl group.

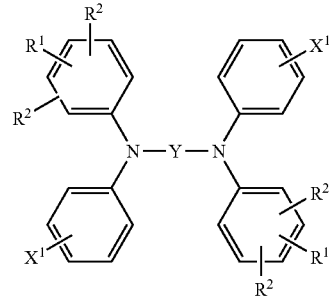

(A1)

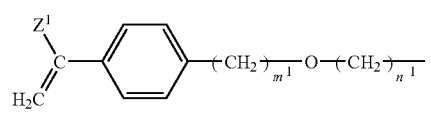

(A2)

75 Claims, 7 Drawing Sheets

COMPOSITION FOR CONDUCTIVE MATERIALS, CONDUCTIVE MATERIAL, CONDUCTIVE LAYER, ELECTRONIC DEVICE, AND ELECTRONIC EQUIPMENT

BACKGROUND OF THE INVENTION

1. Field of the Invention

The present invention relates to a composition for conductive materials, a conductive material, a conductive layer, an electronic device, and electronic equipment, and more specifically to a composition for conductive materials from which a conductive layer having a high carrier transport ability can be made, a conductive material formed of the composition and having a high carrier transport ability, a conductive layer formed using the conductive material as a main material, an electronic device provided with the conductive layer and having high reliability, and electronic equipment provided with the electronic device.

2. Description of the Prior Art

Electroluminescent devices using organic materials (hereinafter, simply referred to as an "organic EL device") have been extensively developed in expectation of their use as solid-state luminescent devices or emitting devices for use in inexpensive large full-color displays.

In general, such an organic EL device has a structure in which a light emitting layer is provided between a cathode and an anode. When an electric field is applied between the cathode and the anode, electrons are injected into the light emitting layer from the cathode side, and holes are injected into the light emitting layer from the anode side.

The injected electrons and holes are recombined in the light emitting layer, which then causes their energy level to return from the conduction band to the valence band. At this time, excitation energy is released as light energy so that the light emitting layer emits light.

In such organic EL devices, it has been known that a layered device structure, in which organic layers formed of organic materials having different carrier transport properties for electrons or holes are provided between a light emitting layer and a cathode and/or an anode, is effective in obtaining a high-efficiency organic EL device with high luminance.

For this purpose, it is necessary to laminate a light emitting layer and organic layers having different carrier transport properties from each other (hereinafter, these layers are collectively referred to as "organic layers") on the electrode. However, in the conventional manufacturing method using an application method, when such organic layers are laminated, mutual dissolution occurs between the adjacent organic layers, thereby causing the problem of deterioration in the light emitting efficiency of a resultant organic EL device, the color purity of emitted light, and/or the pattern precision.

For this reason, in the case where organic layers are laminated, these organic layers have to be formed using organic materials having different solubilities.

In order to solve such a problem, a method for improving the durability of a lower organic layer, that is, the solvent resistance of the lower organic layer has been disclosed (see, for example, JP-A No. 9-255774). In this method, organic materials constituting the lower organic layer are polymerized to improve the solvent resistance of the lower organic layer.

Another method for improving the solvent resistance of a lower organic layer is found in JP-A No. 2000-208254 that discloses a method in which a curing resin is added to an organic material constituting the lower organic layer to cure the organic material together with the curing resin.

However, even in the case where such a method is employed in manufacturing an organic EL device, the characteristics of a resultant organic EL device are not so improved as to meet expectations in actuality.

The problem described above is also raised in thin film transistors using organic materials.

SUMMARY OF THE INVENTION

It is therefore an object of the present invention to provide a composition for conductive materials from which a conductive layer having a high carrier transport ability can be made, a conductive material having a high carrier transport ability obtained by using the composition for conductive materials, a conductive layer obtained by using the conductive material as a main material, a high-reliability electronic device provided with the conductive layer, and electronic equipment provided with the electronic device.

In order to achieve the above object, the present invention is directed to a composition for conductive materials, which comprises a compound represented by the following general formula (A1):

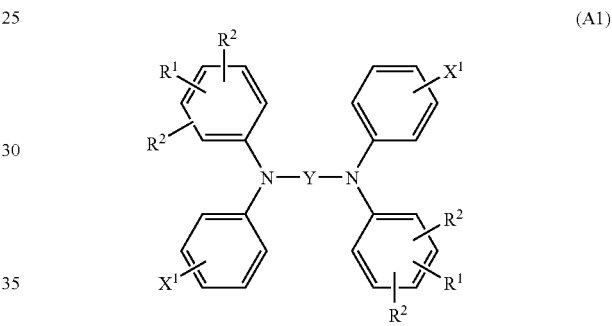

(A1)

wherein two $R^1$s may be the same or different and each independently represents a straight-chain alkyl group having 2 to 8 carbon atoms, four $R^2$s may be the same or different and each independently represents a hydrogen atom, a methyl group or an ethyl group, Y represents a group containing at least one substituted or unsubstituted aromatic hydrocarbon ring or substituted or unsubstituted heterocycle, and two $X^1$s may be the same or different and each independently represents a substituent represented by the following general formula (A2):

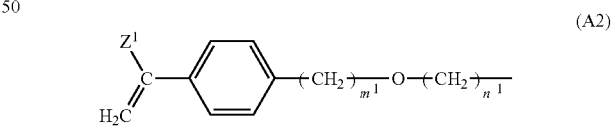

(A2)

wherein $n^1$ is an integer of 3 to 8, $m^1$ is an integer of 0 to 3, and $Z^1$ represents a hydrogen atom, a methyl group or an ethyl group.

According to the present invention described above, it is possible to provide a composition for conductive materials from which a conductive layer having a high carrier transport ability can be made.

In the composition for conductive materials according to the present invention, it is preferred that the group Y contains at least one substituted or unsubstituted aromatic hydrocarbon ring.

This allows a polymer that is obtained by polymerization reaction of the compounds each represented by the above-mentioned general formula (A1) with each other at their respective substituents $X^1$ to exhibit a hole transport ability.

Further, in the composition for conductive materials according to the present invention, it is also preferred that the two substituents $X^1$ are identical with each other.

This makes it possible to prevent the electron density in a resultant polymer from being biased, and thereby enabling to improve a hole transport ability of the polymer.

Further, in the composition for conductive materials according to the present invention, it is also preferred that substituent $X^1$ is bonded to the 3-, 4- or 5-position of the benzene ring.

This makes it possible for adjacent main skeletons to exist at a suitable interval more reliably in a resultant conductive layer.

Furthermore, in the composition for conductive materials according to the present invention, it is also preferred that the two substituents $R^1$ are identical with each other.

This makes it possible for adjacent polymers to exist at a substantially certain interval in a resultant conductive layer. As a result, it becomes possible to reliably decrease the interaction between the adjacent main skeletons of different polymers, thereby enabling the conductive layer to have a high hole transport ability.

Moreover, in the composition for conductive materials according to the present invention, it is also preferred that the substituent $R^1$ is bonded to the 4-position of the benzene ring.

This makes it possible to prevent the adjacent polymers from closely approaching to each other in a resultant conductive layer reliably.

Moreover, in the composition for conductive materials according to the present invention, it is also preferred that the group Y consists of carbon atoms and hydrogen atoms.

This makes it possible for a resultant polymer to have a high hole transport ability, and therefore a resultant conductive layer to be formed can also have a high hole transport ability.

Moreover, in the composition for conductive materials according to the present invention, it is also preferred that the group Y contains 6 to 30 carbon atoms in total.

This also makes it possible for the resultant polymer to have a higher hole transport ability, and therefore the resultant conductive layer to be formed can also have a higher hole transport ability.

Moreover, in the composition for conductive materials according to the present invention, it is also preferred that the group Y contains 1 to 5 aromatic hydrocarbon rings.

This also makes it possible for the resultant polymer to have a higher hole transport ability, and therefore a resultant conductive layer to be formed can also have a higher hole transport ability.

Moreover, in the composition for conductive materials according to the present invention, it is also preferred that the group Y is a biphenylene group or a derivative thereof.

This also makes it possible for the resultant polymer to have a higher hole transport ability, and therefore a resultant conductive layer to be formed can also have a higher hole transport ability.

Moreover, in the present invention, it is also preferred that the composition further comprises a vinyl compound served as a cross-linking agent for cross-linking the compounds each represented by the above-mentioned general formula (A1) with each other at their respective substituents $X^1$.

This makes it possible to obtain a polymer having a link structure produced by polymerization reaction of a substituent $X^1$ and a substituent $X^1$ via the vinyl compound. According to such a polymer, since an interval between main skeletons which are portions of the compounds each represented by the above-mentioned general formula (A1) other than the substituents $X^1$ thereof is maintained at a more appropriate interval, interaction between the main skeletons can be further decreased. As a result, the polymer can exhibit a higher hole transport ability.

In the composition described above, it is preferred that the vinyl compound has at least two reactive groups which are capable of reacting with the substituents $X^1$ of the compounds, respectively.

Such vinyl compound exhibits a higher reactivity. As a result, it is possible to reduce appropriately the number of unreacted substituents $X^1$ remaining in a resultant polymer (conductive material) obtained by the direct polymerization reaction of the substituents $X^1$ of the compounds each represented by the above-mentioned general formula (A1) or by the polymerization reaction of the substituents $X^1$ of the compounds via the vinyl compound. Further, it is also possible to increase the ratio of a chemical structure in which the substituents $X^1$ are cross-linked with each other via the vinyl compound with respect to a chemical structure in which the substituents $X^1$ are directly bonded with each other.

Further, in the composition described above, it is also preferred that the vinyl compound has an adjusting portion positioned between the two reactive groups for adjusting the interval between the reactive groups.

This makes it possible for main skeletons to exist at a more appropriate interval in a chemical structure formed by cross-linking the substituents $X^1$ of the compounds via the vinyl compound having the adjusting portion, and thereby it becomes possible to prevent reliably the interaction between the adjacent main skeletons from occurring. As a result, a conductive material having such a chemical structure at high ratios can exhibit a higher hole transport ability.

Furthermore, in the composition described above, it is also preferred that the adjusting portion has a straight-chain structure.

This makes it possible to improve a hole transport ability of a conductive material to be formed from the composition.

Furthermore, in the composition described above, it is also preferred that the adjusting portion is comprised of a number of atoms, and in the atoms 15 to 50 atoms form the straight-chain structure.

This makes it possible to maintain the interval between the main skeletons at an appropriate distance by which interaction between the main skeletons does not occur in a conductive material to be formed from the composition. Therefore, the conductive material can exhibit a higher hole transport ability.

Moreover, in the composition described above, it is also preferred that the vinyl compound contains as its main ingredient polyethyleneglycol di(meth)acrylate represented by the following general formula (E1).

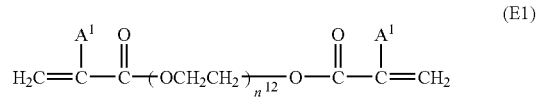

(E1)

where $n^{12}$ is an integer of 5 to 15, and two $A^1$s may be the same or different and each independently represents a hydrogen atom or a methyl group.

This makes it possible to maintain the interval between the main skeletons at an appropriate distance in a conductive material to be formed from the composition. Therefore, the conductive material can exhibit a higher hole transport ability.

Moreover, in the composition described above, it is also preferred that the adjusting portion has a ring structure.

This makes it possible to improve planarity of a conductive material to be formed from the composition. Therefore, transfer of holes is effectively performed between conductive materials in a conductive layer to be formed from the composition. As a result, the hole transport ability of the conductive layer is further improved.

Moreover, in the composition described above, it is also preferred that the ring structure is an aromatic ring.

This makes it possible to enhance the reactivity between the reactive groups and the substituents $X^1$, thereby enabling to further increase the ratio of the chemical structure in which the substituents $X^1$ are cross-linked with each other via the vinyl compound in a conductive material to be formed from the composition.

Moreover, in the composition described above, it is also preferred that at least one of the reactive groups is directly bonded to the ring structure.

This also makes it possible to further enhance the reactivity between the reactive groups and the substituents $X^1$, thereby it enabling to further increase the ratio of the chemical structure in which the substituents $X^1$ are cross-linked with each other via the vinyl compound in a conductive material to be formed from the composition.

Moreover, in the composition described above, it is also preferred that the vinyl compound contains divinylbenzene as its main ingredient.

This also makes it possible to increase the ratio of the chemical structure in which the substituents $X^1$ are cross-linked with each other via the vinyl compound in a conductive material to be formed from the composition while reducing the number of unreacted substituents $X^1$ remaining in the conductive material. As a result, since the interval between the main skeletons can be maintained at an appropriate distance in the conductive material, and thus the conductive material can exhibit a higher hole transport ability.

Further, in the composition described above, it is preferred that the two substituents $X^1$ are identical with each other.

This makes it possible to have the interval between the adjacent skeletons to be more than a certain distance in a resultant conductive material. As a result, it is possible to prevent properly the interaction between the main skeletons from occurring in the conductive material, thereby enabling to improve a hole transport ability of the resultant conductive layer.

Further, in the composition described above, it is also preferred that each substituent $X^1$ is bonded to the 3-, 4- or 5-position of the benzene ring.

This makes it possible for adjacent main skeletons to exist at an appropriate interval more reliably in a resultant polymer to be formed from the composition.

Further, in the composition described above, it is also preferred that the two substituents $R^1$ are identical with each other.

This makes it possible for adjacent polymers to exist at a substantially certain interval in a conductive layer to be formed from the composition. As a result, it becomes possible to reliably decrease the interaction between the main skeletons of different polymers, thereby enabling the conductive layer to have a high hole transport ability.

Further, in the composition described above, it is also preferred that each substituent $R^1$ is bonded to the 4-position of the benzene ring.

This makes it possible to prevent reliably the adjacent polymers from closely approaching to each other in a conductive layer to be formed from the composition.

Further, in the composition described above, it is also preferred that the group Y consists of carbon atoms and hydrogen atoms.

This makes it possible for a resultant polymer to have a high hole transport ability, and therefore a conductive layer to be formed from the polymer can also have a high hole transport ability.

Moreover, in the composition described above, it is also preferred that the group Y contains 6 to 30 carbon atoms in total.

This also makes it possible for the resultant polymer to have a higher hole transport ability, and therefore a conductive layer to be formed from the polymer can also have a higher hole transport ability.

Moreover, in the composition described above, it is also preferred that the group Y contains 1 to 5 aromatic hydrocarbon rings.

This also makes it possible for the resultant polymer to have a higher hole transport ability, and therefore a conductive layer to be formed from the polymer can also have a higher hole transport ability.

Moreover, in the composition described above, it is also preferred that the group Y is a biphenylene group or a derivative thereof.

This also makes it possible for the resultant polymer to have a higher hole transport ability, and therefore a conductive layer to be formed from the polymer can also have a higher hole transport ability.

In the composition for conductive materials according to the present invention, it is also preferred that the group Y contains at least one substituted or unsubstituted heterocycle.

According to the composition for conductive materials described above, it is possible to easily adjust characteristics of a carrier transport ability in a resultant polymer.

In the composition described above, it is preferred that the two substituents $X^1$ are identical with each other.

This makes it possible to properly prevent the electron density in a resultant polymer from being biased, and thereby enabling to improve a carrier transport ability of the polymer.

Further, in the composition described above, it is also preferred that each substituent $X^1$ is bonded to the 3-, 4- or 5-position of the benzene ring.

This makes it possible for adjacent main skeletons to exist at an appropriate interval more reliably in a conductive layer to be formed from the composition.

Further, in the composition described above, it is also preferred that the two substituents $R^1$ are identical with each other.

This makes it possible for adjacent polymers to exist at a substantially certain interval in a conductive layer to be formed from the composition. As a result, it becomes possible to reliably decrease the interaction between the main skeletons of different polymers, thereby enabling the conductive layer to have a high carrier transport ability.

Further, in the composition described above, it is also preferred that each substituent $R^1$ is bonded to the 4-position of the benzene ring.

This makes it possible to prevent reliably the adjacent polymers from closely approaching to each other in a resultant conductive layer.

Further, in the composition described above, it is also preferred that the heterocycle contains at least one heteroatom selected from the group comprising nitrogen, oxygen, sulfur, selenium and tellurium.

By selecting such a heterocyclic ring which contains such a kind of heteroatom, the energy level of the valence and conduction bands or the size of the band gap of the polymer easily changes, so that it is possible to change the characteristics of the carrier transport ability of the polymer reliably.

Further, in the composition described above, the heterocycle may be either of an aromatic heterocycle or a nonaromatic heterocycle, but the aromatic heterocycle is more preferable.

By using such an aromatic heterocycle, it is possible to prevent the electron density of the main skeleton with a conjugated chemical structure from being biased, that is, it is possible to prevent the localization of π electrons appropriately. As a result, the carrier transport ability of the polymer is prevented from being impaired.

Further, in the composition described above, it is preferred that the group Y contains 1 to 5 heterocycles.

By allowing the group Y to have such a number of heterocyclic rings, it is possible to sufficiently change the energy level of the valence and conduction bands or the size of the band gap of the polymer.

Further, in the composition described above, it is preferred that the group Y contains at least one substituted or unsubstituted aromatic hydrocarbon ring in addition to the heterocycle.

By selecting such a group containing a heterocycle and an aromatic hydrocarbon ring as the group Y, it is possible to impart a desired carrier transport property to the polymer more reliably.

Further, in the composition described above, it is preferred that the group Y contains two aromatic hydrocarbon rings respectively bonded to each N in the general formula (A1) directly and at least one heterocycle existing between these aromatic hydrocarbon rings.

This makes it possible to prevent the electron density in the polymer from being biased, and thereby enabling each polymer to have an even carrier transport ability.

Furthermore, in the composition described above, it is preferred that the group Y contains 2 to 75 carbon atoms in total.

According to this composition, the solubility of the compound represented by the general formula (A1) in a solvent tends to be increased, so that there is an advantage in that the range of the choices of solvents to be used in preparing the composition for conductive materials becomes wide.

In the present invention, it is also preferred that the above composition further comprises a vinyl compound in addition to the compound represented by the above-mentioned general formula (A1).

This makes it possible to obtain a polymer having a link structure produced by polymerization reaction of a substituent $X^1$ and a substituent $X^1$ with the vinyl compound. According to such a polymer, since an interval between main skeletons which are portions of the compounds each represented by the above-mentioned general formula (A1) other than the substituents $X^1$ thereof is maintained at a more appropriate interval, interaction between the main skeletons can be further decreased. As a result, the polymer can exhibit a higher carrier transport ability.

In the composition described above, it is preferred that the vinyl compound has at least two reactive groups which are capable of reacting with the substituents $X^1$ of the compounds, respectively.

Such a vinyl compound exhibits a higher reactivity. As a result, it is possible to reduce appropriately the number of unreacted substituents $X^1$ remaining in a resultant polymer (conductive material) obtained by the direct polymerization reaction of the substituents $X^1$ of the compounds each represented by the above-mentioned general formula (A1) or by the polymerization reaction of the substituents $X^1$ of the compounds via the vinyl compound. Further, it is also possible to increase the ratio of a chemical structure in which the substituents $X^1$ are cross-linked with each other via the vinyl compound with respect to a chemical structure in which the substituents $X^1$ are directly bonded with each other.

Further, in the composition described above, it is also preferred that the vinyl compound has an adjusting portion positioned between the two reactive groups for adjusting the interval between the reactive groups.

This makes it possible for main skeletons to exist at a more proper interval in a chemical structure formed by cross-linking the substituents $X^1$ of the compounds via the vinyl compound having the adjusting portion, and thereby it becomes possible to prevent reliably the interaction between the main skeletons from occurring. As a result, a conductive material having such a chemical structure at high ratios can exhibit a higher carrier transport ability.

Furthermore, in the composition described above, it is also preferred that the adjusting portion has a straight-chain structure.

This makes it possible to improve a carrier transport ability in a conductive material to be formed from the composition.

Furthermore, in the composition described above, it is also preferred that the adjusting portion is comprised of a number of atoms, and in the atoms 15 to 50 atoms form the straight-chain structure.

This makes it possible to maintain the interval between the main skeletons at an appropriate distance by which interaction between the main skeletons does not occur in a conductive material to be formed from the composition. Therefore, the conductive material can exhibit a higher carrier transport ability.

Moreover, in the composition described above, it is also preferred that the vinyl compound contains as its main ingredient polyethyleneglycol di(meth)acrylate represented by the following general formula (E1).

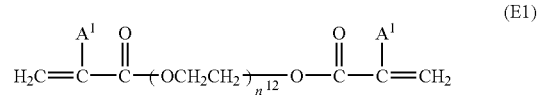

(E1)

where $n^{12}$ is an integer of 5 to 15, and two $A^1$s may be the same or different and each independently represents a hydrogen atom or a methyl group.

This makes it possible to maintain the interval between the main skeletons at an appropriate distance in a conductive material to be formed from the composition. Therefore, the conductive material can exhibit a higher carrier transport ability.

Moreover, in the composition described above, it is also preferred that the adjusting portion contains a ring structure.

This makes it possible to improve planarity of a conductive material to be formed from the composition. Therefore, transfer of carriers is effectively performed between conductive materials in a conductive layer to be formed from the composition.

Moreover, in the composition described above, it is also preferred that the ring structure is an aromatic ring.

This makes it possible to enhance the reactivity between the reactive groups and the substituents $X^1$, thereby enabling to further increase the ratio of the chemical structure in which the substituents $X^1$ are cross-linked with each other via the vinyl compound in a conductive material to be formed from the composition.

Moreover, in the composition described above, it is also preferred that at least one of the reactive groups is directly bonded to the ring structure.

This also makes it possible to further enhance the reactivity between the reactive groups and the substituents $X^1$, thereby enabling to further increase the ratio of the chemical structure in which the substituents $X^1$ are cross-linked with each other via the vinyl compound in a conductive material to be formed from the composition.

Moreover, in the composition described above, it is also preferred that the vinyl compound contains divinylbenzene as its main ingredient.

This also makes it possible to increase the ratio of the chemical structure in which the substituents $X^1$ are cross-linked with each other via the vinyl compound in a conductive material to be formed from the composition while reducing the number of unreacted substituents $X^1$ remaining in the conductive material. As a result, since the interval between the main skeletons can be maintained at an appropriate distance, and thus the obtained conductive material can exhibit a higher carrier transport ability.

In the composition described above, it is preferred that the two substituents $X^1$ are identical with each other.

This makes it possible to have the interval between the adjacent skeletons to be more than a certain distance in a resultant polymer. As a result, it is possible to prevent properly the interaction between the main skeletons from occurring in the resultant polymer, thereby enabling to improve a carrier transport ability of the resultant polymer.

Further, in the composition described above, it is also preferred that each substituent $X^1$ is bonded to the 3-, 4- or 5-position of the benzene ring.

This makes it possible for adjacent main skeletons to exist at a suitable interval more reliably in a resultant conductive polymer.

Further, in the composition described above, it is also preferred that the two substituents $R^1$ are identical with each other.

This makes it possible for adjacent polymers to exist at a substantially certain interval in a conductive layer to be formed from the composition. As a result, it becomes possible to decrease the interaction between the adjacent main skeletons of different polymers reliably, thereby enabling the conductive layer to have a high carrier transport ability.

Further, in the composition described above, it is also preferred that each substituent $R^1$ is bonded to the 4-position of the benzene ring.

This makes it possible to prevent reliably the adjacent polymers from closely approaching to each other in a resultant conductive layer to be formed from the composition.

Further, in the composition described above, it is also preferred that the heterocycle contains at least one heteroatom selected from the group comprising nitrogen, oxygen, sulfur, selenium and tellurium.

By selecting such a heterocyclic ring which contains such a kind of heteroatom, the energy level of the valence and conduction bands or the size of the band gap of the polymer easily changes, so that it is possible to change the characteristics of the carrier transport ability of the polymer appropriately.

Further, in the composition described above, the heterocycle may be either of an aromatic heterocycle or a nonaromatic heterocycle, but the aromatic heterocycle is more preferable.

By using such an aromatic heterocycle, it is possible to prevent the electron density of the main skeleton with a conjugated chemical structure from being biased, that is, it is possible to prevent the localization of π electrons appropriately. As a result, the carrier transport ability of the polymer is prevented from being impaired.

Further, in the composition described above, it is preferred that the group Y contains 1 to 5 heterocycles.

By allowing the group Y to have such a number of heterocyclic rings, it is possible to change the energy level of the valence and conduction bands or the size of the band gap of the polymer sufficiently.

Further, in the composition described above, it is preferred that the group Y contains at least one substituted or unsubstituted aromatic hydrocarbon ring in addition to the heterocycle.

By selecting such a group containing a heterocycle and an aromatic hydrocarbon ring as the group Y, it is possible to impart a desired carrier transport property to the polymer more reliably.

Further, in the composition described above, it is preferred that the group Y contains two aromatic hydrocarbon rings respectively bonded to each N in the general formula (A1) directly and at least one heterocycle existing between these aromatic hydrocarbon rings.

This makes it possible to prevent the electron density in the polymer from being biased, thereby enabling each polymer to have an even carrier transport ability.

Furthermore, in the composition described above, it is preferred that the group Y contains 2 to 75 carbon atoms in total.

According to such a composition, the solubility of the compound represented by the general formula (A1) in a solvent tends to be increased, so that there is an advantage in that the range of the choices of solvents to be used in preparing the composition for conductive materials becomes wide.

Another aspect of the present invention is directed to a conductive material obtained by direct polymerization reaction or polymerization reaction via a vinyl compound of substituents $X^1$ of compounds each represented by the following general formula (A1) and contained in the composition for conductive materials of the present invention:

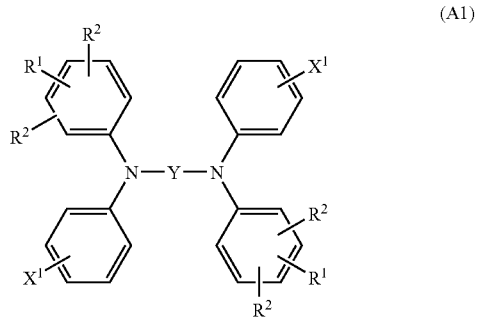

(A1)

wherein two $R^1$s may be the same or different and each independently represents a straight-chain alkyl group having 2 to 8 carbon atoms, four $R^2$s may be the same or different and each independently represents a hydrogen atom, a methyl group, or an ethyl group, Y represents a group containing at least one substituted or unsubstituted aromatic hydrocarbon ring or substituted or unsubstituted heterocycle, and two $X^1$s may be the same or different and each independently represents a substituent represented by the following general formula (A2):

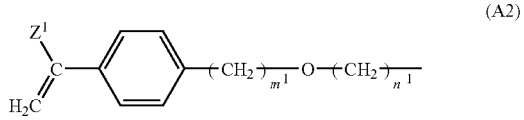

(A2)

wherein $n^1$ is an integer of 3 to 8, $m^1$ is an integer of 0 to 3, and $Z^1$ represents a hydrogen atom, a methyl group or an ethyl group.

According to the conductive material described above, it is possible to produce a conductive layer (polymer) having a high carrier transport ability.

In the conductive material described above, it is preferred that the compounds are polymerized by light irradiation.

By employing light irradiation, it is possible to select the area where polymerization reaction of the compounds each represented by the above-mentioned general formula (A1) occurs as well as the degree of the polymerization in a resultant conductive layer relatively easily.

In the conductive material described above, it is preferred that both the compound and the vinyl compound are polymerized by light irradiation.

In this case, it is also possible to select the area where polymerization reaction of the compounds each represented by the above-mentioned general formula (A1) and the vinyl compound occurs as well as the degree of the polymerization in a resultant conductive layer relatively easily.

Other aspect of the present invention is directed to a conductive layer mainly comprising the conductive material as described above. Such a conductive layer can have a high hole transport ability.

In this case, it is preferred that the conductive layer is used for a hole transport layer. Such a hole transport Layer can also have a high hole transport ability.

In this case, it is preferred that the average thickness of the hole transport layer is in the range of 10 to 150 nm.

When such a hole transport layer is used in an organic EL device, it is possible to increase the reliability of the organic EL device.

Further, the conductive layer of the present invention described above may be used for an electron transport layer. Such an electron transport layer can also have a high electron transport ability.

In this case, it is preferred that the average thickness of the electron transport layer is in the range of 10 to 150 nm.

When such an electron transport layer is used in an organic EL device, it is possible to increase the reliability of the organic EL device.

Furthermore, the conductive layer of the present invention described above may be used for an organic semiconductor layer. Such an organic semiconductor layer can exhibit excellent semiconductor characteristics.

In this case, it is preferred that the average thickness of the organic semiconductor layer is in the range of 0.1 to 1,000 nm.

When such an organic semiconductor layer is used in an organic thin film transistor, it is possible to increase the reliability of the organic thin film transistor.

The other aspect of the present invention is directed to an electronic device comprising a laminated body which includes the conductive layer as described above. Such an electronic device can have high reliability.

Examples of the electronic device may include a light emitting device and a photoelectric transducer. These light emitting device and photoelectric transducer can also have high reliability.

In this case, it is preferred that the light emitting device includes an organic EL device. Such an organic EL device can also have high reliability.

In the present invention, examples of the electronic device may also include a switching element. Such a switching element can also have high reliability.

In this case, it is preferred that the switching element includes an organic thin film transistor. Such an organic thin film transistor can also have high reliability.

Yet other aspect of the present invention is directed to electronic equipment provided with the electronic device described above. Such electronic equipment can also have high reliability.

These and other objects, structures and effects of the present invention will be more apparent when the following description of the preferred embodiments will be considered taken in conjunction with the appended drawings.

BEST MODE FOR CARRYING OUT THE INVENTION

Figure 1:
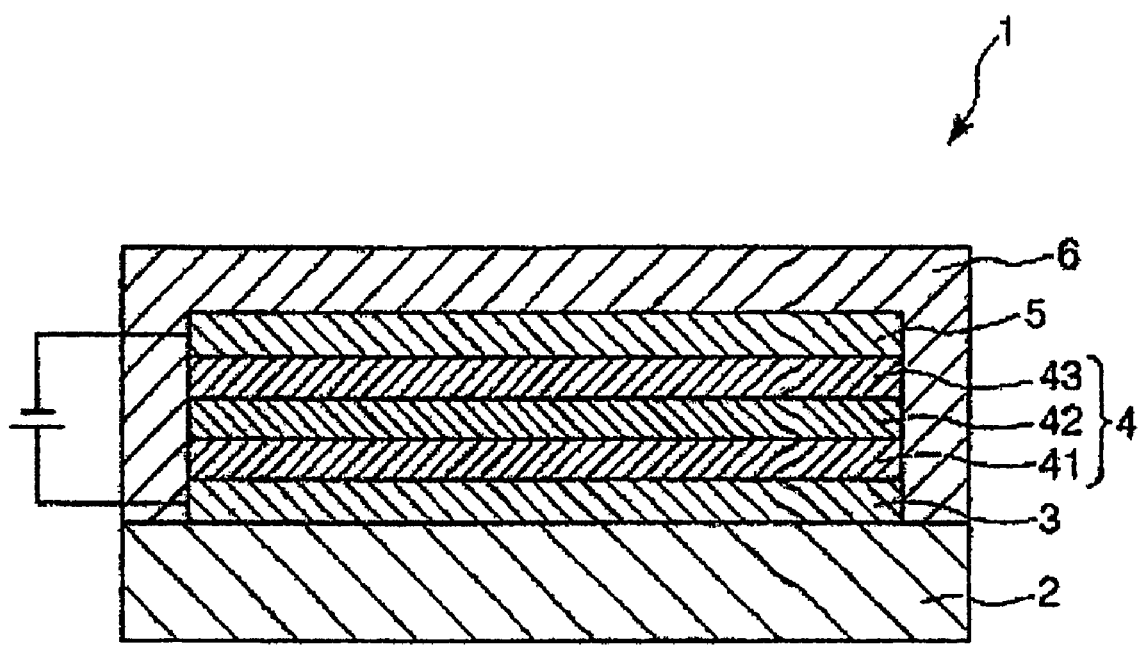
FIG. 1 is a cross-sectional view which shows an example of an organic EL device.

Hereinbelow, a composition for conductive materials, a conductive material, a conductive layer, an electronic device, and electronic equipment according to the present invention will be described in detail with reference to preferred embodiments shown in the accompanying drawings.

(Conductive Layer)

First, a conductive layer obtained by using a conductive material according to the present invention as its main material (that is, a conductive layer according to the present invention) will be described.

A conductive material according to the present invention contains as its main ingredient a polymer obtained by direct polymerization reaction at substituents $X^1$ of compounds (which are an arylamine derivative) each represented by the following general formula (A1), that is, a polymer in which main skeletons of the compounds which are portions of the compounds other than the substituents $X^1$ thereof are linked via a chemical structure formed by the direct reaction between the substituents $X^1$ (hereinafter, this chemical structure is collectively called as "first link structure").

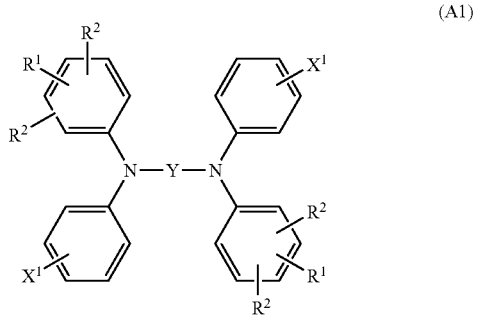

(A1)

wherein two $R^1$s may be the same or different and each independently represents a straight-chain alkyl group having 2 to 8 carbon atoms; four $R^2$s may be the same or different and each independently represents a hydrogen atom, a methyl group, or an ethyl group; two $X^1$s may be the same or different and each independently represents a substituent represented by the following general formula (A2); and Y represents a group containing at least one substituted or unsubstituted aromatic ring hydrocarbon or a group containing at least one substituted or unsubstituted heterocycle.

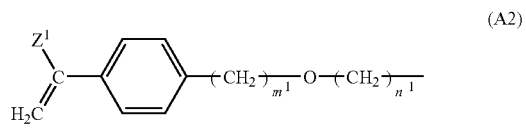

(A2)

wherein $n^1$ is an integer of 3 to 8, $m^1$ is an integer of 0 to 3, and $Z^1$ represents a hydrogen atom, a methyl group or an ethyl group.

Such a polymer has a structure in which the main skeletons are repeatedly linked via the first link structure, that is, a structure in which the main skeletons repeatedly exist at a predetermined interval. Therefore, the interaction between the adjacent main skeletons decreases.

Each main skeleton has a conjugated chemical structure, and a unique spread of the electron cloud thereof contributes to smooth transportation of carriers (holes or electrons) in the polymer.

For this reason, the polymer exhibits a high carrier transport ability. Therefore, a conductive layer obtained by using such a polymer as its main material also has a high carrier transport ability.

If the interval between the main skeletons in the polymer is too small, interaction between the adjacent main skeletons tends to be strong. On the other hand, if the interval between the main skeletons in the polymer is too large, it becomes difficult to transfer carriers between the main skeletons, causing the carrier transport ability of the polymer to be impaired.

The structure of the substituent $X^1$, that is the general formula (A2), is determined in view of these facts. Specifically, it is preferred that the substituent $X^1$ represented by the general formula (A2) has a straight-chain carbon-carbon link in which $n^1$ is 3 to 8 and $m^1$ is 0 to 3, preferably $n^1$ is 4 to 6 and $m^1$ is 1 or 2. Further, it is also preferred that the total of $n^1$ and $m^1$ is 3 to 11, and more preferably 5 to 8.

In this regard, it is sufficient that $n^1$ and $m^1$ satisfy the above-mentioned ranges, respectively, or the total of $n^1$ and $m^1$ satisfies the above-mentioned range. However, it is more preferable that $n^1$ and $m^1$ satisfy both the above-mentioned relations. This makes it possible for the adjacent main skeletons to exist at an appropriate interval in a resultant polymer, thereby decreasing the interaction between the adjacent main skeletons in the resultant polymer more reliably. In addition, since transfer of carriers between the main skeletons are carried out reliably, the resultant polymer can have a high carrier transport ability.

Further, it is also preferred that each of the two substituents $X^1$ contains substantially the same total number of $n^1$ and $m^1$, more preferably the same total number of $n^1$ and $m^1$. This makes it possible for the adjacent main skeletons to exist at an interval of a substantially same distance. As a result, it is possible to prevent reliably the electron density in the polymer from being biased. This makes it possible to improve the carrier transport ability of the polymer.

As shown in the general formula (A2), each substituent $X^1$ has a styrene derivative group formed by introducing a substituent $Z^1$ to a styrene group as its functional group at one end thereof. Therefore, a benzene ring exists in the first link structure.

The benzene ring has a conjugated structure. Therefore, in the case where the benzene ring and the main skeleton having a conjugated chemical structure are too close to each other, that is, for example, in the case where the benzene ring is linked to the main skeleton via an ether bond or in the case where the total of $n^1$ and $m^1$ is 2, interaction occurs between the adjacent main skeletons through the benzene ring.

However, in the conductive material of the present invention, the linkage between the main skeleton and the benzene ring is formed by $n^1$ and $m^1$ the total of which is three or more, that is three or more methylene groups and an ether bond. This makes it possible to maintain the interval between the main skeleton and the benzene ring at a suitable condition. With this result, it is possible to prevent or suppress interaction from occurring between the adjacent main skeletons appropriately.

Further, the substituent $Z^1$ is a Hydrogen atom, a methyl group or an ethyl group, wherein the substituent $Z^1$ is selected in accordance with the total of $n^1$ and $m^1$, that is the total number of methylene groups.

For example, in the case where the total number is small, a methyl group or an ethyl group is selected as the substituent $Z^1$. Since a methyl group and an ethyl group are an electron-releasing substituent, it is possible to bias electrons to the side of the main skeleton by selecting a methyl group or an ethyl group as the substituent $Z^1$. With this result, it is possible to prevent appropriately interaction from occurring between the adjacent main skeletons which are existed through the benzene rings.

Because of the reasons stated in the above, it is preferred that the two substituents $X^1$ are substantially identical to each other, and more preferably exactly identical to each other. In such a case, since the two substituents $X^1$ have substantially the same steric structure, the above described effects can be exhibited more conspicuously. As a result, it is possible to prevent or suppress interaction from occurring between the adjacent main skeletons appropriately, thereby enabling the carrier transport ability of the polymer to be improved further.

In this regard, it is to be noted that since the styrene derivative group has a high reactivity, it is possible to form a polymer having a long chain length relatively easily by polymerization reaction of the two substituents $X^1$.

Further, in the case of styrene derivative group, a by-product other than the product obtained by bonding of the substituents $X^1$ is hard to be formed when the substituents $X^1$ are polymerized together, that is, when the styrene derivative groups are polymerized or bonded together. Therefore, it is possible to prevent impurities from entering into a resultant conductive material reliably.

Furthermore, it is to be noted that the substituent $X^1$ may be bonded to the 2-, 3-, 4-, 5- or 6-position of the benzene ring, but preferably bonded to the 3-, 4- or 5-position. This makes it possible to exhibit the effect obtained by linking the adjacent main skeletons via the first link structure conspicuously. Namely, it is possible for the adjacent main skeletons to exist at an appropriate interval more reliably.

Next, a description will be made with regard to the main skeletons which contribute to carrier transportation in a resultant polymer.

As described above, the substituent $R^1$ has a straight-chain alkyl group having 2 to 8 carbon atoms, preferably 3 to 6 carbon atoms. This makes it possible for adjacent polymers to exist at a suitable internal by preventing the adjacent polymers from closely approaching to each other by steric hindrance of the substituent $R^1$. As a result, it becomes possible to reliably decrease the interaction between the main skeletons of different polymers in a conductive layer to be formed, thereby enabling the conductive layer to have a high carrier transport ability.

Preferably, the two substituents $R^1$ contain substantially the same number of carbon atoms, more preferably the same number of carbon atoms. This makes it possible for the adjacent polymers to exist at an interval of a certain distance in the conductive layer. As a result, the density of polymers in the conductive layer becomes uniform.

Further, the substituent $R^1$ may be bonded to any of the 2- to 6-position of a benzene ring, but preferably it is bonded to the 4-position. This makes it possible to exhibit the effect of introduction of the substituents $R^1$ more conspicuously. Namely, it is possible to prevent the adjacent polymers from closely approaching to each other.

Furthermore, as described above, the substituent $R^2$ is a hydrogen atom, a methyl group, or an ethyl group, and the substituent $R^2$ is selected in accordance with the number of carbon in the substituent $R^1$. Specifically, when the number of carbon in the substituent $R^1$ is large, a hydrogen atom is selected as the substituent $R^2$, while when the number of carbon in the substituent $R^1$ is small, a methyl group or an ethyl group is selected as the substituent $R^2$.

In the compound represented by the above-mentioned general formula (A1) (hereinafter, simply referred to as "compound (A1)"), it is possible to change the carrier transport properties of the polymer by appropriately setting the chemical structure of a group (or a linking group) Y. The reason for this can be considered as follows. In the polymer, the energy level of the valence and conduction bands or the size of the band gap is changed according to changes in the spread of the electron cloud (i.e., distribution of electrons) in the main skeleton which contributes to carrier transportation.

In the compound (A1), the group Y contains at least one substituted or unsubstituted aromatic hydrocarbon ring or at least one substituted or unsubstituted heterocyclic ring. By selecting kinds of the aromatic hydrocarbon ring and/or heterocyclic ring appropriately, it is possible to adjust carrier transport properties in a resultant polymer relatively easily.

For example, by selecting a structure constituted from unsubstituted aromatic hydrocarbon ring as the group Y, it is possible to obtain a polymer which can exhibit a hole transport ability. In particular, by selecting a structure consisting of carbon atoms and hydrogen atoms as the group Y, it is also possible to obtain a polymer which can exhibit a higher hole transport ability.

In more details, as for the structure constituted from the unsubstituted aromatic hydrocarbon ring, those represented by the following chemical formulas (C1) to (C16) can be mentioned.

(C1) to (C16)

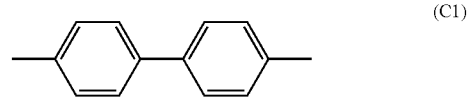

(C1)

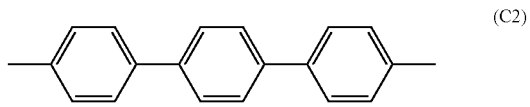

(C2)

(C3)

(C4)

(C5)

(C6)

(C7)

-continued (C8) 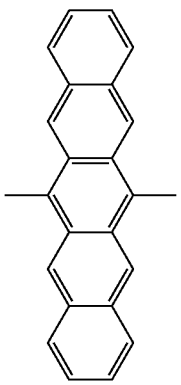

(C9) 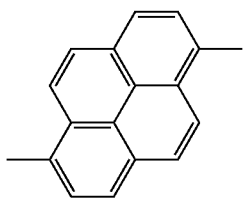

(C10) 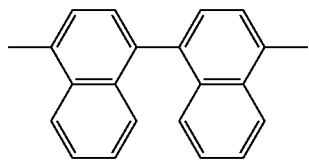

(C11) 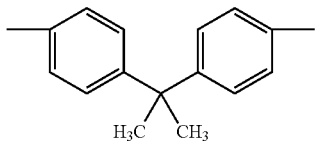

(C12) 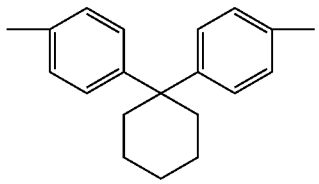

(C13) 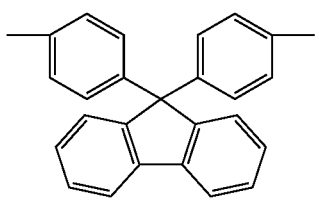

(C14) 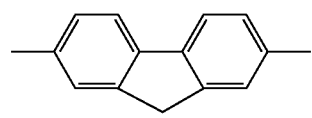

(C15) 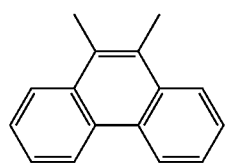

-continued (C16) 

(C17) 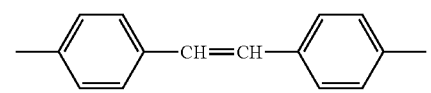

In this case, it is preferred that the group Y has 6 to 30 carbon atoms, more preferably 10 to 25 carbon atoms, and even more preferably 10 to 20 carbon atoms, in total.

Further, in the group Y, it is preferred that the number of aromatic hydrocarbon ring is 1 to 5, more preferably 2 to 5, and even more preferably 2 to 3.

Taking the above-mentioned factors into account, in the compound (A1) a biphenylene group represented by the chemical formula (C1) or its derivative is considered to be a particularly preferable structure as the group Y.

By selecting such a group, the hole transport property of the resultant polymer becomes excellent, and thus the resultant conductive layer can also have an excellent hole transport ability.

Next, by selecting a structure which contains at least one substituted or unsubstituted heterocyclic ring as the group Y, it is possible to control the carrier transport ability of the resultant polymer relatively easily.

In this connection, it is preferred that such a heterocyclic ring contains at least one heteroatom selected from among nitrogen, oxygen, sulfur, selenium, and tellurium. By selecting such a heterocyclic ring that contains such a kind of heteroatom, it is easy to change the energy level of tile valence and conduction bands or the size of the band gap of the polymer.

The heterocyclic ring may be either an aromatic heterocycle or a nonaromatic heterocycle, but an aromatic heterocycle is preferably used. By using an aromatic heterocycle, it is possible to prevent the electron density of the main skeleton with a conjugated chemical structure from being biased, that is, it is possible to prevent localization of π electrons appropriately. As a result, the carrier transport ability of the polymer is prevented from being impaired.

The group Y preferably contains 1 to 5 heterocyclic rings, more preferably 1 to 3 heterocyclic rings. In the case where the group Y contains 2 or more heterocyclic rings, these rings may be the same or different. By allowing the group Y to have such a number of heterocyclic rings, it is possible to sufficiently change the energy level of the valence and conduction bands or the size of the band gap of the polymer.

In the case where the group Y contains at least one substituted or unsubstituted heterocyclic ring, the group Y may further contain at least one aromatic hydrocarbon ring in addition to the at least one heterocyclic ring. By selecting a group containing a heterocycle and an aromatic hydrocarbon ring as the group Y, it is possible to impart a desired carrier transport property to the polymer more reliably.

As for the group Y, a group which contains two aromatic hydrocarbon rings each bonded to each N in the general formula (1) directly and at least one heterocyclic ring which exists between these aromatic hydrocarbon rings is particularly preferred. By using such a group Y, it is possible to prevent reliably the electron density of the polymer from being biased. As a result, the polymer can have an even (uniform) carrier transport ability.

The group Y preferably has 2 to 75 carbon atoms, more preferably 2 to 50 carbon atoms, in total. If the group Y has too many carbon atoms in total, the solubility of the compound represented by the general formula (A1) in a solvent tends to be lowered depending on the kind of substituent $X^1$ used, creating a possibility that the range of the choices of solvents to be used in preparing the composition for conductive materials according to the present invention becomes narrow.

On the other hand, by setting the total number of carbon atoms contained in the group Y to a value within the above range, it is possible to maintain the planarity of the main skeleton. As a result, the carrier transport ability of the polymer is prevented from being impaired reliably.

Taking these factors into account, as a structure constituted from unsubstituted heterocyclic rings, such structures as represented by any one of the following chemical formulas (D1) to (D20) are considered to be preferable structures.

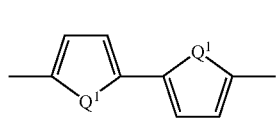
(D1)

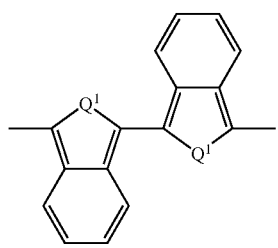
(D2)

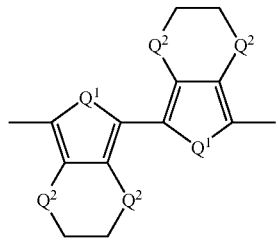
(D3)

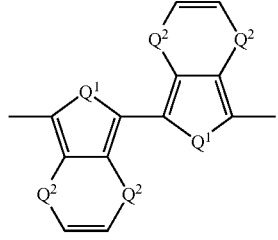
(D4)

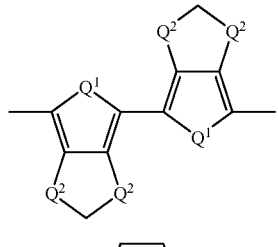
(D5)

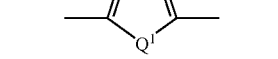
(D6)

-continued

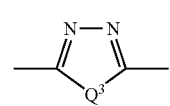
(D7)

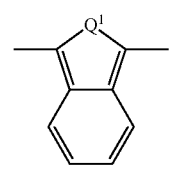
(D8)

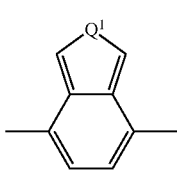
(D9)

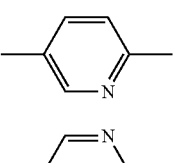
(D10)

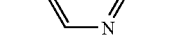
(D11)

(D12)

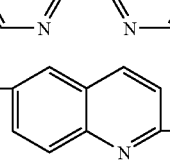
(D13)

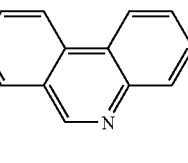
(D14)

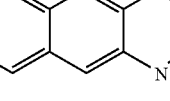
(D15)

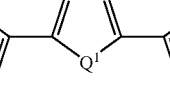
(D16)

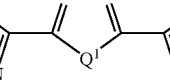
(D17)

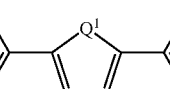
(D18)

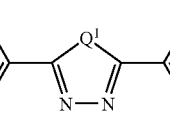
(D19)

-continued

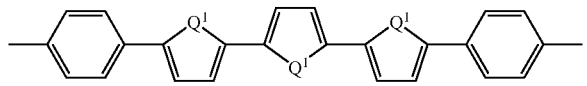
(D20)

Note that in these chemical formulas each $Q^1$ may be the same or different and each independently represent N-$T^1$, S, O, Se, or Te (where $T^1$ represents H, $CH_3$, or Ph), each $Q^2$ may be the same or different and each independently represent S or O, and each $Q^3$ may be the same or different and each independently represent N-$T^3$, S, O, Se, or Te (where $T^3$ represents H, $CH_3$, $C_2H_5$ or Ph).

By appropriately determining the chemical structure of the group Y as described above, a polymer obtained by selecting, for example, anyone of the chemical formulas (D2), (D16), (D18) and (D20) as the group Y can exhibit a high hole transport ability as compared to a polymer obtained by selecting the chemical formula (D17) and can exhibit an especially high hole transport ability as compared to a polymer obtained by selecting the chemical formula (D8) or (D19).

On the contrary, a polymer obtained by selecting any one of the chemical formulas (D8), (D17) and (D19) as the group Y can exhibit a high electron transport ability as compared to a polymer obtained by the chemical formula (D2) or (D16). Further, the polymer obtained by selecting any one of the chemical formulas (D8), (D17) and (D19) as the group Y can also exhibit an especially high electron transport ability as compared with a polymer obtained by selecting the chemical formula (D18) or (D20).

Further, the unsubstituted heterocyclic ring and/or the unsubstituted aromatic hydrocarbon ring contained in the group Y may introduce a substituent so long as the planarity of the main skeleton is not greatly affected. Examples of such a substituent include an alkyl group having a relatively small number of carbon atoms such as a methyl group or an ethyl group or and a halogen group and the like.

Now, in the present invention, it is preferred that the polymer contains a second link structure produced by polymerization reaction(s) of a substituent $X^1$ and a substituent $X^1$ with a vinyl compound in addition to the first link structure produced by the direct polymerization reaction of the substituents $X^1$ as described above. According to such a polymer, since an interval between the main skeletons is maintained at a suitable interval, interaction between the main skeletons can be further decreased. As a result, the polymer containing the second link structure can exhibit a sufficiently high carrier transport ability.

In such a polymer, it is preferred that in the substituent $X^1$ represented by the general formula (A2) has a straight-chain carbon-carbon link in which $n^1$ is 3 to 8 and $m^1$ is 0 to 3, preferably $n^1$ is 4 to 6 and $m^1$ is 1 or 2. Further, it is also preferred that the total of $n^1$ and $m^1$ is 3 to 11, and more preferably 5 to 8. In this regard, it is sufficient that $n^1$ and $m^1$ satisfy the above-mentioned ranges, respectively, or the total of $n^1$ and $m^1$ satisfies the above-mentioned range. However, it is more preferable that $n^1$ and $m^1$ satisfy both the above-mentioned relations.

This makes it possible for main skeletons to exist at an appropriate interval in a resultant polymer in spite of the case where the first linking structure and/or the second link structure is produced, thereby reliably decreasing the interaction between the adjacent main skeletons in the resultant polymer.

In addition, it is also possible to transfer carriers between the main skeletons more reliably so that the resultant polymer has a high carrier transport ability.

Further, it is also preferred that each of the two substituents $X^1$ contains substantially the same total number of $n^1$ and $m^1$, more preferably the same total number of $n^1$ and $m^1$. This makes it possible for the main skeletons to exist at an interval larger than a certain distance in spite of the case that the first linking structure and/or the second link structure is formed. As a result, it is possible to prevent interaction from occurring between the adjacent main skeletons in the polymer, thereby improving the carrier transport ability of the polymer.

Because of the reasons stated in the above, it is preferred that the two substituents $X^1$ are substantially identical to each other, and more preferably identical to each other. In such a case, since the two substituents $X^1$ have substantially the same steric structure, the above described effects can be exhibited more conspicuously. As a result, it is possible to prevent or suppress interaction from occurring between the adjacent main skeletons appropriately, thereby enabling the carrier transport ability of the polymer to be improved further.

The vinyl compound used in the present invention has at least one reactive group that can react with the substituent $X^1$ (hereinafter, simply referred to as "reactive group").

The reactive group is a reactive portion at which the substituents $X^1$ of the compounds each represented by the above-mentioned general formula (A1) are cross-linked together via the vinyl compound. Examples of such a reactive group include a vinyl group, a (meth)acryloyl group and the like. Since these reactive groups exhibit high reactivity, a vinyl compound having such a reactive group also exhibits high reactivity.

Therefore, when the substituents $X^1$ of the compounds each represented by the above-mentioned general formula (A1) are bonded together by direct polymerization reaction or by polymerization reaction via the vinyl compound, the reaction between the substituent $X^1$ and the reactive group progresses effectively. As a result, it is possible to reduce the amount of unreacted substituents $X^1$ remaining in a resultant polymer to be formed from the composition.

In this regard, in order to further reduce the amount of unreacted substituents $X^1$ remaining in the resultant polymer, it is preferred to select a vinyl compound having two or more reactive groups. Since use of such a vinyl compound increases reactive portions to be reacted with the substituents $X^1$, it is possible to exhibit higher reactivity with the substituent $X^1$. As a result, the effects described above can be exhibited more conspicuously. Further, it is also possible to increase the ratio of a chemical structure in which the substituents $X^1$ are cross-linked with each other via the vinyl compound (that is, the second link structure) with respect to a chemical structure in which the substituents $X^1$ are directly bonded to each other (that is, the first link structure).

Further, in the process of formation of a polymer in which the second link structures are contained, since the vinyl compound has a smaller molecular weight than an oligomer of the polymer and has a reactive group which is the same kind as the substituent $X^1$, the vinyl compound can come close to the substituent $X^1$ remaining in the oligomer without receiving any influence of steric hindrance and electric interference from the oligomer. As a result, it is possible to increase the ratio of polymerization reaction via the vinyl compound, that is the ratio of the second link structure, in the resultant polymer to be formed, while appropriately reducing the amount of unreacted substituents $X^1$.

Further, in order to maintain the interval between the main skeletons at a more appropriate distance, it is preferred to select a vinyl compound having two reactive groups and an adjusting portion positioned between the two reactive groups for adjusting the interval between the reactive groups. This makes it possible to prevent reliably the interaction between the main skeletons from occurring in the chemical structure in which the substituents $X^1$ are cross-linked with each other via the vinyl compound. As a result, a conductive material having such a chemical structure at high ratios can exhibit a higher hole transport ability.

In this regard, it is to be noted that even in the case where the first link structure is formed between the main skeletons, it is possible to decrease the interaction between the main skeletons since the main skeletons are separately existed by the substituents $X^1$. However, in the case where the second link structure is formed between the main skeletons, that is in the case where the substituents $X^1$ are bonded together by the polymerization reaction via the vinyl compound, it is possible to maintain the interval between the main skeletons at a more appropriate distance, thereby enabling to further decrease the interaction between the main skeletons.

Hereinbelow, a description will be made with regard to the representative example where a vinyl compound has two reactive groups and an adjusting portion positioned between the reactive groups.

Such an adjusting portion may be either of a straight chain structure, a branching structure, a ring structure, or a combination of these. Among them, an adjusting portion having a straight chain structure or a ring structure is preferred.

In the case where the adjusting portion has a straight chain structure, a carrier transport ability is improved in a resultant polymer. Such an effect becomes conspicuous when the polymer has a relatively low molecular weight, that is when degree of polymerization is relatively low.

Further, in the case where the adjusting portion has a ring structure, it is possible to improve planarity of a resultant polymer to be formed from the composition. Therefore, transfer of carriers is effectively carried out between the polymers in a conductive layer to be formed from the composition, and thus a carrier transport ability of the conductive layer becomes superior.

In this regard, it is to be noted that in the case where the adjusting portion is formed form a non-conjugated molecular structure such as saturated hydrocarbon, the non-conjugated molecular structure exits between the benzene ring of the substituent $X^1$ (that is, the benzene ring of the styrene derivative group) and the benzene ring of the main skeleton in a resultant polymer. Therefore, even in the case where the interval between the main skeleton and the benzene ring of the substituent $X^1$ is made relatively small, it is possible to prevent interaction from occurring between the adjacent main skeletons through the benzene ring of the substituent $X^1$ due to the existence of the non-conjugated molecular structure.

Examples of the vinyl compound having such an adjusting portion with the straight chain structure include 1,3 butyleneglycol dimethacrylate, 1,4 butanediol dimethacrylate, 1,5 petandiol dimethacrylate, 1,6 hexanediol dimethacrylate, ethyleneglycol dimethacrylate, diethyleneglycol dimethacrylate, tryethyleneglycol dimethacrylate, tetraethyleneglycol dimethacrylate, polyethyleneglycol dimethacrylate, polyestertype dimethacrylate, bis(methacryloxyethyl) phosphate, neopentylglycol dimethacrylate, dipropyleneglycol dimethacrylate, polypropyleneglycol dimethacrylate, and the like.

In the case of the vinyl compound having the adjusting portion with the straight chain structure, it is preferred that the adjusting portion is comprised of a number of atoms, and in the atoms preferably 15 to 50 atoms, and more preferably 20 to 30 atoms form the straight-chain structure. This makes it possible to maintain the interval between the main skeletons at an appropriate distance by which interaction between the main skeletons does not occur in a resultant polymer to be formed from the composition. Therefore, the polymer can exhibit a higher carrier transport ability.

Due to the reasons described above, as for the vinyl compound having the adjusting portion with the straight chain structure, polyethyleneglycol di(meth)acrylate represented by the following general formula (E1).

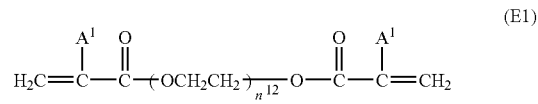

(E1)

where $n^{12}$ is an integer of 5 to 15, and two $A^1$s may be the same or different and each independently represents a hydrogen atom or a methyl group.

This makes it possible to maintain the interval between the main skeletons at an appropriate distance in a resultant polymer to be formed from the composition. Therefore, the polymer can exhibit a higher carrier transport ability.

In the above-mentioned general formula (E1), it is preferred that $n^{12}$ is in the range of 6 to 9. By setting $n^{12}$ within the above range, the effect mentioned above is exhibited more conspicuously.

Further, examples of the vinyl compound having an adjusting portion with a ring structure include divinylbenzene, 2,2-bis(4-(meth)acryloxypolyethoxyphenyl)propane, and the like.

In the vinyl compound having the adjusting portion with the ring structure, the ring structure may be constituted from a hydrocarbon ring or a hetero ring, and preferably the ring structure is constituted from an aromatic ring, and more preferably the ring structure is constituted from an aromatic hydrocarbon ring. This makes it possible to improve reactivity between the reactive group and the substituent $X^1$, and thus it is possible to further increase a ratio of a chemical structure which is formed by cross-linking the substituents $X^1$ via the vinyl compound in a resultant polymer.

Such a vinyl compound may be the type in which the reactive group is bonded to the ring structure thereof through other structure, but preferably the reactive group is bonded to the ring structure directly. Further, in the case where there are two reactive groups, it is sufficient that one of the reactive groups is bonded to the ring structure directly, but it is preferred that both the reactive groups are bonded to the ring structure directly. This makes it possible to exhibit the effect mentioned above more conspicuously.

Due to the reasons stated in the above, as for the vinyl compound having the adjusting portion with the ring structure, a vinyl compound in which two vinyl groups are bonded to a benzene ring directly, that is divinylbenzene is particularly preferred.

By using such a vinyl compound, it is possible to increase a ratio of a chemical structure formed by cross-linking the substituents $X^1$ via the vinyl compound in a resultant polymer, while decreasing the amount of unreacted substituents $X^1$ remaining in the polymer. This makes it possible to maintain the interval between the main skeletons at a more appropriate distance, and thus the resultant polymer can exhibit the effect described above more conspicuously.

Further, it is also preferred that the two reactive groups are positioned with respect to the ring structure so that the reactive groups are mostly far away from to each other. In other word, it is preferred that the two reactive groups positioned with respect to the ring structure so that the reactive groups form a line symmetry relationship in a state that they are bonded to the ring structure. Specifically, in the case of the divinylbenzene, the two vinyl groups are bonded to the 1-position and the 6-position, respectively. This makes it possible to decrease interaction between the main skeletons which are bonded via the divinylbenzene more appropriately. As a result, a resultant polymer to be formed from the composition can exhibit a higher carrier transport ability.

As described above, as for the vinyl compound, a vinyl compound comprised of as its major component polyethyleneglycol di(meth)acrylate represented by the above-mentioned general formula (E1) or divinylbenzene is particularly preferred.

In this regard, it is to be noted that when using a relatively low molecular weight vinyl compound such as polyethyleneglycol di(meth)acrylate represented by the above-mentioned general formula (E1) or divinylbenzene, there is a merit that the reactivity between the substituents $X^1$ and the reactive group can be further enhanced.

Namely, since the low molecular weight vinyl compounds enter among unreacted substituents $X^1$ effectively, polymerization reaction between the substituent $X^1$ and the reactive group can be made at high ratios. Therefore, it is possible to increase a ratio of the chemical structure formed by cross-linking the substituents $X^1$ via the vinyl compound.

In the meantime, in view of the fact that the vinyl compound is used for cross-linking the substituents $X^1$ of the compounds each represented by the above-mentioned general formula (A1), vinyl compounds having one reactive group or three or more reactive groups can be used in addition to the vinyl compound mentioned above.

Examples of such a vinyl compound having one reactive group include styrene, vinyltoluene, α-methylstyrene, α-chlorostyrene, 2-vinylpiridine, methyl(meth)acrylate, n-butyl(meth)acrylate, glycidyl(meth)acrylate. 2-ethylhexyl (meth)acrylate, n-stearyl(meth)acrylate, lauryl(meth)acrylate, tridecyl(meth)acrylate, 2-hydroxyethyl(meth)acrylate, hydroxypropyl(meth)acrylate, 2-methoxyethyl(meth)acrylate, butoxyethyl(meth)acrylate, ethoxyethyl(meth)acrylate, methyltriglycol(meth)acrylate, cyclohexyl(meth)acrylate, tetrahydrofurfuryl(meth)acrylate, benzyl(meth)acrylate, cyanoethyl(meth)acrylate, (meth)acryloxyethylphsphate, N-methylol(meth)acrylamide, N,N-dimethyl(meth)acrylamide, diacetone(meth)acrylamide, allylglycidylether, diethylaminoethyl(meth)acrylate, (meth)acrylate and the like.

Examples of a vinyl compound having three reactive groups include pentaerythritol tri(meth)acrylate, trimethylolethane tri(meth)acrylate, trimethylolpropane tri(meth)acrylate, and the like.

Further, examples of a vinyl compound having four reactive groups include tetramethylolmethane tetra(meth)acrylate and the like.

The conductive layer formed of the conductive material mentioned above has excellent solvent resistance, because it is mainly formed of a polymer obtained by polymerization reaction. As a result, in the case where the upper layer is formed onto the conductive layer in contact therewith, it is possible to prevent assuredly the conductive layer from being swelled up or dissolved by the solvent or dispersant contained in a material for forming the upper layer.

Further, the polymer is obtained by reacting or bonding the styrene derivative groups of the substituents $X^1$ directly or via the vinyl compound. Since each of such styrene derivative group and vinyl group exhibits a particularly excellent bonding stability, it is possible to prevent the conductive layer from being swelled up or dissolved reliably.

Furthermore, in the case where electronic devices (which will be described later in details) are manufactured using a laminated body having such a conductive layer, it is possible to prevent the constituent material of the conductive layer and the constituent material of a contacting Layer which is in contact with the conductive layer from being mutually dissolved with the elapse of time at the boundary between the conductive layer and the contacting layer assuredly since the conductive layer is mainly formed of the polymer described above. As a result, it is possible to prevent the characteristics of the electronic devices from being deteriorated with the elapse of time.

(Organic Electroluminescent Device)

Next, an embodiment of the electronic device according to the present invention will be described. In this embodiment, the electronic device of the present invention is embodied as an organic electroluminescent device (hereinafter, simply referred to as an "organic EL device") that is a light emitting device.

FIG. 1 is a cross-sectional view which shows an example of the organic EL device.

The organic EL device 1 shown in FIG. 1 includes a transparent substrate 2, an anode 3 provided on the substrate 2, an organic EL layer 4 provided on the anode 3, a cathode 5 provided on the organic EL layer 4 and a protection layer 6 provided so as to cover these layers 3, 4 and 5.

The substrate 2 serves as a support for the organic EL device 1, and the layers described above are formed on the substrate 2.

As a constituent material of the substrate 2, a material having a light-transmitting property and a good optical property can be used.

Examples of such a material include various resins such as polyethylene terephthalate, polyethylene naphthalate, polypropylene, cycloolefin polymer, polyamide, polyethersulfone, polymethylmethacrylate, polycarbonate, and polyarylate, and various glass materials, and the like. At least one of these materials can be used as a constituent material of the substrate 2.

The thickness of the substrate 2 is not particularly limited, but is preferably in the range of about 0.1 to 30 mm, more preferably in the range of about 0.1 to 10 mm.

The anode 3 is an electrode which injects holes into the organic EL layer 4 (that is, into a hole transport layer 41 described later). This anode 3 is made substantially transparent (which includes transparent and colorless, colored and transparent, or translucent) so that light emission from the organic EL layer 4 (that is, from a light emitting layer 42 described later) can be visually identified.

From such a viewpoint, a material having a high wore function, excellent conductivity, and a light transmitting property is preferably used as the constituent material of the anode 3 (hereinafter, referred to as "anode material").

Examples of such an anode material include oxides such as ITO (Indium Tin Oxide), $SnO_2$, Sb-containing $SnO_2$, and Al-containing ZnO, Au, Pt, Ag, Cu, and alloys containing two or more of them. At least one of these materials can be used as an anode material.

The thickness of the anode 3 is not limited to any specific value, but is preferably in the range of about 10 to 200 nm, more preferably in the range of about 50 to 150 nm. If the thickness of the anode 3 is too thin, there is a case that a function of the anode 3 will not be sufficiently exhibited. On the other hand, if the anode 3 is too thick, there is a case that the light transmittance will be significantly lowered depending on, for example, the kind of anode material used, thus resulting in an organic EL device that is not suitable for practical use.

It is to be noted that conductive resins such as polythiophene, polypyrrole, and the like can also be used as the anode material.

On the other hand, the cathode 5 is an electrode which injects electrons into the organic EL layer 4 (that is, into an electron transport layer 43 described later).

As a constituent material of the cathode 5 (hereinafter, referred to as "cathode material"), a material having a low work function is preferably used.

Examples of such a cathode material include Li, Mg, Ca, Sr, La, Ce, Er, Eu, Sc, Y, Yb, Ag, Cu, Al, Cs, Rb, and alloys containing two or more of them. At least one of these materials can be used as a cathode material.

Particularly, in the case where an alloy is used as a cathode material, an alloy containing a stable metallic element such as Ag, Al, or Cu, specifically an alloy such as MgAg, AlLi, or CuLi is preferably used. The use of such an alloy as a cathode material makes it possible to improve the electron injection efficiency and stability of the cathode 5.

The thickness of the cathode 5 is preferably in the range of about 1 nm to 1 μm, more preferably in the range of about 100 to 400 nm. If the thickness of the cathode 5 is too thin, there is a case that a function of the cathode 5 will not be sufficiently exhibited. On the other hand, if the cathode 5 is too thick, there is a case that the light emitting efficiency of the organic EL device 1 will be lowered.

The organic EL layer 4 is provided between the anode 3 and the cathode 5. The organic EL layer 4 includes the Sole transport layer 41, the light emitting layer 42, and the electron transport layer 43. These layers 41, 42 and 43 are formed on the anode 3 in this order.

The hole transport layer 41 has the function of transporting holes, which are injected from the anode 3, to the light emitting layer 42. The electron transport layer 43 has the function of transporting electrons, which are injected from the cathode 5, to the light emitting layer 42.

As a constituent material for one of the hole transport layer 41 and the electron transport layer 43 or for both the layers 41, 43, the conductive material according to the present invention can be used.

For example, in the case where the conductive material of the present invention is used as the constituent material of the hole transport layer 41, a compound having a chemical structure of the group Y which is constituted from a substituted or unsubstituted aromatic hydrocarbon ring can be used.

In more detail, compounds having chemical structures of the group Y represented by the above-mentioned chemical formulas (C1) to (C-16) can be used.

In this regard, it is to be noted that the constituent material of the electron transport layer 43 are not limited to specific materials, and various materials can be used for the electron transport layer 43.

Examples of such materials that can be used for the electron transport layer 43 include: benzene-based compounds (starburst-based compounds) such as 1,3,5-tris[(3-phenyl-6-tri-fluoromethyl)quinoxaline-2-yl]benzene (TPQ1), and 1,3, 5-tris[{3-(4-t-butylphenyl)-6-trisfluoromethyl}quinoxaline-2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds such as BBOT; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD), BMD, BND, BDD, and BAPD; triazole-based compounds such as triazole, and 3,4, 5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; florene-based compounds such as florene; metallic or non-metallic phthalocyanine-based compounds such as phthalocyanine, copper phthalocyanine, and iron phthalocyanine; and various metal complexes such as 8-hydroxyquinoline aluminum ($Alq_3$), and complexes having benzooxazole or benzothiazole as a ligand. These compounds may be used singly or in combination of two or more of them.

In the case where both of the hole transport layer 41 and the electron transport layer 43 are formed using the conductive material according to the present invention as a main material, a constituent material of the hole transport layer 41 and a constituent material of the electron transport layer 43 are selected in consideration of their hole transport ability and electron transport ability.

Specifically, these constituent materials are selected so that the hole transport ability of the hole transport layer 41 becomes relatively higher than that of the electron transport layer 43 and the electron transport ability of the hole transport layer 41 becomes relatively lower than that of the electron transport layer 43. In other words, these constituent materials are selected so that the electron transport ability of the electron transport layer 43 becomes relatively higher than that of the hole transport layer 41 and the hole transport ability of the electron transport layer 43 becomes relatively lower than that of the hole transport layer 41.

For example, in the case where a polymer of a compound represented by the general formula (A1) in which the group Y has a chemical structure represented by the chemical formula (D18) or (D20) is used as a conductive material for forming a hole transport layer 41, a conductive material for forming an electron transport layer 43 is preferably a polymer of a compound represented by the general formula (A1) in which the group Y has a chemical structure represented by the chemical formula (D7) or (D19). In this case, a polymer of a compound represented by the general formula (A1) in which the group Y has a chemical structure represented by the chemical formula (D17) may also be used as a conductive material for forming the electron transport layer 43. In the case where a polymer of a compound represented by the general formula (A1) in which the group Y has a chemical structure represented by the chemical formula (D7), (D19), or (D17) is used as a conductive material for forming an electron transport layer 43, the conductive material for forming the hole transport layer 41 may also be a polymer of a compound represented by the general formula (A1) in which the group Y has a chemical structure represented by the chemical formula (D2) or (D16).

Further, the volume resistivity of the hole transport layer 41 is preferably $10\Omega\cdot cm$ or larger, more preferably $10^2\Omega\cdot cm$ or larger. This makes it possible to provide an organic EL device 1 having a higher light emitting efficiency.

The thickness of the hole transport layer 41 is not limited to any specific value, but is preferably in the range of about 10 to 150 nm, more preferably in the range of about 50 to 100 nm. If the thickness of the hole transport layer 41 is too thin, there is a case that a pin hole may be produced. On the other hand, if the thickness of the hole transport layer 41 is too thick, there is a case that the transmittance of the hole transport layer 41 may be lowered so that the chromaticity (hue) of luminescent color of the organic EL device 1 is changed.

The thickness of the electron transport layer 43 is not limited to any specific value, but is preferably in the range of about 1 to 100 nm, more preferably in the range of about 20 to 50 nm. If the thickness of the electron transport layer 43 is too thin, there is a case that a pin hole may be produced, thereby causing a short-circuit. On the other hand, if the electron transport layer 43 is too thick, there is a case that the value of resistance may become high.

Further, the conductive material according to the present invention is particularly useful for forming a relatively thin hole transport layer 41 or electron transport layer 43.

When a current flows between the anode 3 and the cathode 5 (that is, a voltage is applied across the anode 3 and the cathode 5), holes are moved in the hole transport layer 41 and electrons are moved in the electron transport layer 43, and the holes and the electrons are then recombined in the light emitting layer 42. Then, in the light emitting layer 42, excitons are produced by energy released upon the recombination, and the excitons release energy (in the form of fluorescence or phosphorescence) or emit light when returning to the ground state.

Any material can be used as a constituent material of the light emitting layer 42 (hereinafter, referred to as "light emitting material") so long as it can provide a field where holes can be injected from the anode 3 and electrons can be injected from the cathode 5 during the application of a voltage to allow the holes and the electrons to be recombined.

Such light emitting materials include various low-molecular light emitting materials and various high-molecular light emitting materials (which will be mentioned below). At least one of these materials can be used as a light emitting material.

In this regard, it is to be noted that the use of a low-molecular light emitting material makes it possible to obtain a dense light emitting layer 42, thereby improving the light emitting efficiency of the light emitting layer 42. Further, since a high-molecular light emitting material is relatively easily dissolved in a solvent, the use of such a high-molecular light emitting material makes it easy to form a light emitting layer 42 by means of various application methods such as an ink-jet method and the like. Furthermore, if the low-molecular light emitting material and the high-molecular light emitting material are used together, it is possible to obtain the synergistic effect resulting from the effect of the low-molecular light emitting material and the effect of the high-molecular light emitting material. That is, it is possible to obtain the effect that a dense light emitting layer 42 having excellent light emitting efficiency can be easily formed by means of various application methods such as the ink-jet method and the like.

Examples of such a low-molecular light emitting material include: benzene-based compounds such as distyrylbenzene (DSB), and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene and N,N'-bis(2,5-di-t-butylphenyl)-3,4,9,10-perylene-di-carboxy imide (BPPC); coronene-based compounds such as coronene; anthracene-based compounds such as anthracene and bis-styrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acre dine; stilbene-based compounds such as stilbene; thiophene-based compounds such as 2,5-dibenzooxazolethiophene; benzooxazole-based compounds such as benzooxazole; benzoimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spiro compounds such as 2,2',7,7'-tetraphenyl-9,9'-spirobifluorene; metallic or non-metallic phthalocyanine-based compounds such as phthalocyanine ($H_2Pc$) and copper phthalocyanine; florene-based compounds such as florene; and various metallic complexes such as 8-hydroxyquinoline aluminum ($Alq_3$), tris(4-methyl-8-quinolinolate)aluminum (III) ($Almq_3$), (8-hydroxyquinoline) zinc ($Znq_2$), (1,10-phenanthroline)-tris-(4,4,4-trifluoro-1-(2-thienyl)-butane-1,3-dionate) europium (III) ($Bu(TTA)_3(phen)$), fac-tris(2-phenylpyridine) iridium ($Ir(ppy)_3$), and (2,3,7,8,12,13,17,18-octaethyl-21H, 23H-porphin) platinum (II).

Examples of a high-molecular light emitting material include polyacetylene-based compounds such as trans-type polyacetylene, cis-type polyacetylene, poly(di-phenylacetylene) (PDPA), and poly(alkyl, phenylacetylene) (PAPA); polyparaphenylenevinylene-based compounds such as poly(para-phenylenevinylene) (PPV), poly(2,5-dialkoxy-para-phenylenevinylene) (RO-PPV), cyano-substituted-poly(para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene) (MEH-PPV); polythiophene-based compounds such as poly(3-alkylthiophene) (PAT), and poly(oxypropylene) triol (POPT); polyfluorene-based compounds such as poly(9,9-dialkylfluorene) (PDAF), α,ω-bis[N,N'-di(methylphenyl)aminophenyl]-poly[9,9-bis(2-ethylhexyl)fluorene-2,7-diyl] (PF2/6 am4), poly(9,9-dioctyl-2,7-divinylenefluorenyl)-alt-co(anthracene-9,10-diyl); polyparaphenylene-based compounds such as poly(para-phenylene) (PPP), and poly(1,5-dialkoxy-para-phenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylylphenylsilane) (PBPS).

Further, the conductive material according to the present invention can also be used as the light emitting material depending on the combination of constituent materials used for forming a hole transport layer 41 and an electron transport layer 43.

For example, in the case where poly(thiophene/styrenesulfonic acid) such as poly(3,4-ethylenedioxythiophene/styrenesulfonic acid) or an arylamine compound such as N,N'- bis(1-naphthyl)-N,N'-diphenyl-Benzedrine(α-NPD) is used as a constituent material of the hole transport layer 41 and a triazole-based compound such as 3,4,5-triphenyl-1,2,4-triazole or an oxadiazole compound such as 2-(4-t-butylphenyl)-5-(biphenyl-4-yl)-1,3,5-oxadiazole (PBD) is used as a constituent material of the electron transport layer 43, a polymer of the compound represented by the general formula (1) in which the group Y has a chemical structure represented by the chemical formula (D12) or (D14) can be used as a conductive material for forming a light emitting layer 42.

The thickness of the light emitting layer 42 is not limited to any specific value, but is preferably in the range of about 10 to 150 nm, more preferably in the range of about 50 to 100 nm. By setting the thickness of the light emitting layer to a value within the above range, recombination of holes and electrons efficiently occurs, thereby enabling the light emitting efficiency of the light emitting layer 42 to be further improved.

It is to be noted here that any one of the electron transport layer 41, the light emitting layer 42, and the electron transport layer 43 in the organic EL device 1 may be formed using the conductive material according to the present invention or all the layers 41, 42, and 43 may be formed using the conductive material according to the present invention.

Although, in the present embodiment, each of the light emitting layer 42, the hole transport layer 41, and the electron transport layer 43 is separately provided, they may be formed into a hole-transportable light emitting layer which combines the hole transport layer 41 with the light emitting layer 42 or an electron-transportable light emitting layer which combines the electron transport layer 43 with the light emitting layer 42. In this case, an area in the vicinity of the boundary between the hole-transportable light emitting layer and the electron transport layer 43 or an area in the vicinity of the boundary between the electron-transportable light emitting layer and the hole transport layer 41 functions as the light emitting layer 42.

Further, in the case where the hole-transportable light emitting layer is used, holes injected from an anode into the hole-transportable light emitting layer are trapped by the electron transport layer, and in the case where the electron-transportable light emitting layer is used, electrons injected from a cathode into the electron-transportable light emitting layer are trapped in the electron-transportable light emitting layer. In both cases, there is an advantage in that the recombination efficiency of holes and electrons can be improved.

In this regard, it is to be noted that between the adjacent layers in the layers 3, 4 and 5, any additional layer may be provided according to its purpose. For example, a hole injecting layer for improving the injection efficiency of holes from the anode 3 may be provided between the hole transport layer 41 and the anode 3, or an electron injecting layer for improving the injection efficiency of electrons from the cathode 5 may be provided between the electron transport layer 43 and the cathode 5. In such a case where the organic EL device 1 includes a hole injecting layer and/or an electron injecting layer, the conductive material according to the present invention can be used as a constituent material of the hole injecting layer and/or the electron injecting layer.

As a constituent material of a hole injecting layer other than the conductive material according to the present invention, for example, copper phthalocyanine, 4,4',4''-tris(N,N-phenyl-3-methylphenylamino)triphenylamine (M-MTDATA), or the like can be used.

As described above, the protection layer 6 is provided so as to cover the layers 3, 4 and 5 constituting the organic EL device 1. This protection layer 6 has the function of hermetically sealing the layers 3, 4 and 5 constituting the organic EL device 1 to shut off oxygen and moisture. By providing such a protection layer 6, it is possible to obtain the effect of improving the reliability of the organic EL device 1 and the effect of preventing the alteration and deterioration of the organic EL device 1.

Examples of a constituent material of the protect ion layer 6 include Al, Au, Cr, Nb, Ta and Ti, alloys containing them, silicon oxide, various resin materials, and the like. In this regard, it is to be noted that in the case where a conductive material is used as a constituent material of the protect ion layer 6, it is preferred that an insulating film is provided between the protection layer 6 and each of the layers 3, 4 and 5 to prevent a short circuit therebetween, if necessary.

The organic EL device 1 can be used for a display, for example, but it can also be used for various optical purposes such as a light source and the like.

In the case where the organic EL device 1 is used for a display, the drive system thereof is not particularly limited, and either of an active matrix system or a passive matrix system may be employed.

The organic EL device 1 as described above can be manufactured in the following manner, for example.

[A1] Step of Forming Anode

First, a substrate 2 is prepared, and then an anode 3 is formed on the substrate 2.

The anode 3 can be formed by, for example, chemical vapor deposition (CVD) such as plasma CVD, thermal CVD, and laser CVD, vacuum deposition, sputtering, dry plating such as ion plating, wet plating such as electrolytic plating, immersion plating, and electroless plating, thermal spraying, a sol-gel method, a MOD method, bonding of a metallic foil, or the like.

[A2] Step of Forming Hole Transport Layer

[A2-1]

First, a composition for conductive materials of the present invention (hereinafter, also referred to as a "hole transport material") is applied or supplied onto the anode 3.

In the case where the composition for conductive materials contains a vinyl compound in addition to a compound represented by the general formula (A1), the mixing ratio between the compound represented by the general formula (A1) and the vinyl compound in the composition for conductive materials is preferably 9:1 to 3:2, more preferably 4:1 to 7:3, in terms of mole ratio, which are slightly changed depending on the kinds of the vinyl compound. By setting the mixing ratio of the vinyl compound within the above range, it is possible for main skeletons to exist at a more appropriate interval in a resultant polymer.

In the application of the hole transport material, various application methods such as a spin coating method, a casting method, a micro gravure coating method, a gravure coating method, a bar coating method, a roll coating method, a wire-bar coating method, a dip coating method, a spray coating method, a screen printing method, a flexographic printing method, an offset printing method, an ink-jet method, and the like can be employed. According to such an application method, it is possible to relatively easily supply the hole transport material onto the anode 3.

In the case where the composition for conductive materials are prepared using a solvent or dispersion medium, examples of such a solvent or dispersion medium include: inorganic solvents such as nitric acid, sulfuric acid, ammonia, hydrogen peroxide, water, carbon disulfide, carbon tetrachloride, and ethylene carbonate; and various organic solvents such as ketone-based solvents e.g. methyl ethyl ketone (MEK), acetone, diethyl ketone, methyl isobutyl ketone (MIBK), methyl isopropyl ketone (MIPK), and cyclohexanone, alcohol-based solvents e.g., methanol, ethanol, isopropanol, ethylene glycol, diethylene glycol (DEG), and glycerol, ether-based solvents e.g., diethyl ether, diisopropyl ether, 1,2-dimethoxy ethane (DME),1,4-dioxane, tetrahydrofuran (THF), tetrahydropyran (THP), anisole, diethylene glycol dimethyl ether (diglyme), and diethylene glycol ethyl ether (Carbitol), cellosolve-based solvents e.g., methyl cellosolve, ethyl cellosolve, and phenyl cellosolve, aliphatic hydrocarbon-based solvents e.g., hexane, pentane, heptane, and cyclohexane, aromatic hydrocarbon-based solvents e.g., toluene, xylene, and benzene, aromatic heterocyclic compound-based solvents e.g., pyridine, pyrazine, furan, pyrrole, thiophene, and methyl pyrrolidone, amide-based solvents e.g., N,N-dimethylformamide (DMF) and N,N-dimethylacetamide (DMA), halogen compound-based solvents e.g., dichloromethane, chloroform, and 1,2-dichloroethane, ester-based solvents e.g., ethyl acetate, methyl acetate, and ethyl formate, sulfur compound-based solvents e.g., dimethyl sulfoxide (DMSO) and sulfolane, nitrile-based solvents e.g., acetonitrile, propionitrile, and acrylonitrile, organic acid-based solvents e.g., formic acid, acetic acid, trichloroacetic acid, and trifluoroacetic acid, and mixed solvents containing them.

It is to be noted that the composition for conductive materials preferably contains a polymerization initiator. By adding a polymerization initiator to the composition for conductive materials, it is possible to promote direct polymerization reaction of substituents $X^1$ or polymerization reaction of substituents $X^1$ via the vinyl compound when predetermined treatment such as heating or light irradiation is carried out in the next step [A2-2].

Examples of such a polymerization initiator include, but are not limited thereto, photopolymerization initiators such as photo-radical polymerization initiators and cationic photopolymerization initiators, heat polymerization initiators, and anaerobic polymerization initiators. Among them, photo-radical polymerization initiators are particularly preferably used. By using such photo-radical polymerization initiator, it is possible to promote direct polymerization reaction of substituents $X^1$ or polymerization reaction of substituents $X^1$ via the vinyl compound in the next step [A2-2] relatively easily.

As such a photo-radical polymerization initiator, various photo-radical polymerization initiators can be used. Examples of such photo-radical polymerization initiators include benzophenone-based photo-radical polymerization initiator, benzoin-based photo-radical polymerization initiator, acetophenone-based photo-radical polymerization initiator, benzyketal-based photo-radical polymerization initiator, mihilarsketone-based photo-radical polymerization initiator, acylphosphine oxide-based photo-radical polymerization initiator, keto-coumarin-based photo-radical polymerization initiator, xanthene-based photo-radical polymerization initiator, and thioxanthene-based photo-radical polymerization initiator, and the like.

Further, in the case where a photopolymerization initiator is used as a polymerization initiator, a sensitizer suitable for the photopolymerization initiator may be added to the composition for conductive materials.

[A2-2]

Next, the hole transport material supplied onto the anode 3 is irradiated with light.

By this light irradiation, substituents $X^1$ of the compounds each represented by the general formula (A1) and contained in the hole transport material are polymerized directly or via the vinyl compound to obtain a polymer (that is, a conductive material according to the present invention). As a result, a hole transport layer 41 mainly comprised of the conductive material according to the present invention is formed con the anode 3.

By forming a hole transport layer 41 using the conductive material according to the present invention as its main material, it is possible to prevent the hole transport layer 41 from swelling and being dissolved due to a solvent or dispersion medium contained in a light emitting layer material to be supplied onto the hole transport layer 41 in the next step [A3]. As a result, mutual dissolution between the hole transport layer 41 and the light emitting layer 42 is reliably prevented.

In addition, by forming a hole transport layer 41 using the conductive material (that is, the polymer) according to the present invention as its main material, it is also possible to prevent reliably the mixing of the constituent materials of the hole transport layer 41 and the light emitting layer 42 from occurring near the boundary between these layers 41 and 42 in a resultant organic EL device 1 with the lapse of time.

The weight-average molecular weight of the polymer is not particularly limited, but is preferably in the range of about 1,000 to 1,000,000, more preferably in the range of about 10,000 to 300,000. By setting the weight-average molecular weight of the polymer to a value within the above range, it is possible to suppress or prevent the swelling and dissolution of the polymer more reliably.

It is to be noted that the hole transport layer 41 may contain a monomer or oligomer of the compound represented by the general formula (A1) and/or a monomer or oligomer of the vinyl compound to the extent that mutual dissolution between the hole transport layer 41 and the light emitting layer 42 can be prevented.

As light with which the hole transport material is irradiated, for example, infrared rays, visible light, ultraviolet rays, or X-rays can be used. These types of light can be used singly or in combination of two or more of them. Among them, ultraviolet rays are particularly preferably used. By using ultraviolet rays, it is possible to easily and reliably polymerize the substituents $X^1$ directly or via the vinyl compound.

The wavelength of ultraviolet rays to be used for light irradiation is preferably in the range of about 100 to 420 nm, more preferably in the range of about 150 to 400 nm.

The irradiation intensity of ultraviolet rays is preferably in the range of about 1 to 600 mW/cm$^2$, more preferably in the range of about 1 to 300 mW/cm$^2$.

Further, the irradiation time of ultraviolet rays is preferably in the range of about 60 to 600 seconds, more preferably in the range of about 90 to 500 seconds.

By setting each of the wavelength, irradiation intensity, and irradiation time of ultraviolet rays to a value within the above range, it is possible to relatively easily control the progress of polymerization reaction of the hole transport material supplied onto the anode 3.

It is to be noted that the resultant hole transport layer 41 may be subjected to heat treatment in the atmosphere or an inert atmosphere or under reduced pressure (or under vacuum) when necessary. By doing so, it is possible to dry (that is, it is possible to remove a solvent or a dispersion medium) or solidify the hole transport layer 41. The hole transport layer 41 may be dried by means other than heat treatment.

Further, examples of predetermined treatment for polymerizing the substituents $X^1$ directly or via the vinyl compound other than light irradiation include heating and anaerobic treatment. Among these treatment methods, light irradiation as described above is preferably employed. By employing light irradiation, it is possible to relatively easily select the area where a polymerization reaction is carried out and the degree of polymerization.

[A3] Step of Forming Light Emitting Layer

Next, a light emitting layer 42 is formed on the hole transport layer 41.

The light emitting layer 42 can be formed by, for example, applying onto the hole transport layer 41, a light emitting layer material (that is, a material for forming a light emitting layer) obtained by dissolving the light emitting material as described above in a solvent or dispersing the light emitting material in a dispersion medium.

As solvents or dispersion media in which the light emitting material is to be dissolved or dispersed, the same solvents or dispersion media that have been mentioned with reference to the step of forming the hole transport layer [A2] can be used.

Further, as methods for applying the light emitting layer material onto the hole transport layer 41, the same application methods that have been mentioned with reference to the step of forming the hole transport layer [2A] can be employed.

[A4] Step of Forming Electron Transport Layer

Next, an electron transport layer 43 is formed on the light emitting layer 42.

In the case where a constituent material of the electron transport layer 43 is formed of the conductive material according to the present invention, the electron transport layer 43 can be formed using the composition for conductive materials according to the present invention in the same manner that has been described with reference to the step of forming the hole transport layer [A2].

On the other hand, in the case where a constituent material of the electron transport layer 43 is not formed of the conductive material according to the present invention, the electron transport layer 43 can be formed using the known electron transport materials described above in the same manner that has been described with reference to the step of forming the light emitting layer [A3].

It is to be noted that in the case where the light emitting layer 42 is not formed using a polymer such as the conductive material according to the present invention, a solvent or dispersion medium in which the composition for conductive materials for use in forming the electron transport layer 43 is to be dissolved or dispersed is selected from among those which do not cause swelling and dissolution of the light emitting layer 42. By using such a solvent or a dispersion medium, it is possible to prevent mutual dissolution between the light emitting layer 42 and the electron transport layer 43 reliably.

[A5] Step of Forming Cathode

Next, a cathode 5 is formed on the electron transport layer 43.

The cathode 5 can be formed by, for example, vacuum deposition, sputtering, bonding of a metallic foil, or the like.

[A6] Step of Forming Protection Layer

Next, a protection layer 6 is formed so as to cover the anode 3, the organic EL layer 4, and the cathode 5.

The protection layer 6 can be formed or provided by, for example, bonding a box-like protection corer made of the material as mentioned above by the use of various curable resins (adhesives).

As for such curable resins, all of thermosetting resins, photocurable resins, reactive curable resins, and anaerobic curable resins can be used.

The organic EL device 1 is manufactured through these steps as described above.

(Organic Thin Film Transistor)

Next, another embodiment of the electronic device according to the present invention will be described. In this embodiment, the electronic device of the present invention is embodied as an organic thin film transistor that is a switching element (hereinafter, simply referred to as an "organic TFT").

FIG. 2(a) is a cross-sectional view of an organic TFT 10, and FIG. 2(b) is a plan view of the organic TFT 10. It is to be noted that in the following description, the upper side and the lower side in FIG. 2(a) will be referred to as "upper side" and "lower side", respectively.

Figure 2:
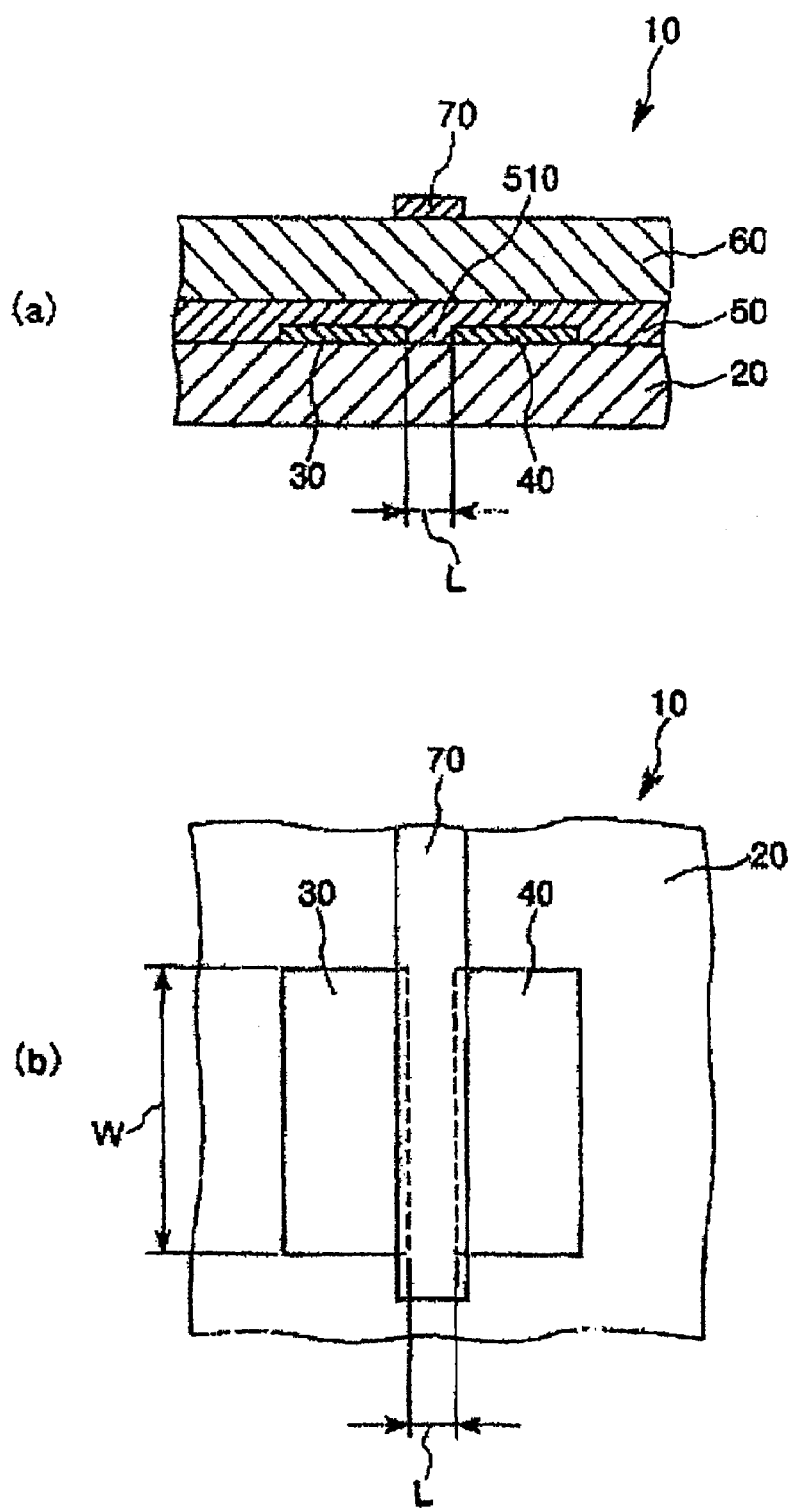
FIG. 2(a) is a cross-sectional view of an organic TFT.
FIG. 2(b) is a plan view of the organic TFT.

The organic TFT 10 shown in FIG. 2 is provided on a substrate 20. On the substrate 20, a source electrode 30, a drain electrode 40, an organic semiconductor layer (that is, a conductive layer according to the present invention) 50, a gate insulating layer 60, and a gate electrode 70 are laminated in this order from the side of the substrate 20.

Specifically, in the organic TFT 10, the source electrode 30 and the drain electrode 40 are separately provided on the substrate 20, and the organic semiconductor layer 50 is provided so as to cover these electrodes 30 and 40. On the organic semiconductor layer 50, the gate insulating layer 60 is provided. On the gate insulating layer 60, the gate electrode 70 is provided so as to overlap with at least a region between the source electrode 30 and the drain electrode 40.

In the organic TFT 10, the region in the organic semiconductor layer 50 which is existed between the source electrode 30 and the drain electrode 40 functions as a channel region 510 where carriers are moved. Hereinafter, the length of the channel region 510 in a direction that carriers are moved, that is, the distance between the source electrode 30 and the drain electrode 40 is referred to as "channel length L", and the length of the channel region 510 in a direction orthogonal to the direction of the channel length L is referred to as "channel width W".

The organic TFT 10 is an organic TFT having a structure in which the source electrode 30 and the drain electrode 40 are provided so as to be closer to the substrate 20 than the gate electrode 70 provided through the gate insulating layer 60. That is, the organic TFT 10 is an organic TFT having a top gate structure.

Hereinbelow, components of the organic TFT 10 will be described one by one.

The substrate 20 supports the layers (or the components) constituting the organic TFT 10. As such a substrate 20, for example, the same substrate that has been described with reference to the substrate 2 of the organic EL device 1 can be used. Alternatively, a silicon substrate or a gallium arsenide substrate may be used as the substrate 20.

On the substrate 20, the source electrode 30 and the drain electrode 40 are provided side by side at a predetermined distance in the direction of the channel length L.

The constituent material of the source electrode 30 and the drain electrode 40 is not particularly limited so long as it has conductivity. Examples of such a constituent material include metallic materials such as Pd, Pt, Au, W, Ta, Mo, Al, Cr, Ti, Cu, and alloys containing two or more of them, conductive oxide materials such as ITO, FTO, ATO, and $SnO_2$, carbon materials such as carbon black, carbon nanotube, and fullerene, and conductive polymeric materials such as polyacetylene, polypyrrole, polythiophene e.g., PEDOT (polyethylenedioxythiophene), polyaniline, poly(p-phenylene), poly(p-phenylenevinylene), polyfluorene, polycarbazole, polysilane, and derivatives thereof. Among them, the conductive polymeric materials are usually doped with iron chloride, iodine, strong acid, organic acid, or a polymer such as polystyrenesulfonic acid so as to have conductivity when used. These conductive materials can be used singly or in combination of two or more of them.

The thickness of each of the source electrode 30 and the drain electrode 40 is not particularly limited, but is preferably in the range of about 30 to 300 nm, more preferably in the range of about 50 to 200 nm.

The distance between the source electrode 30 and the drain electrode 40, that is, the channel length L is preferably in the range of about 2 to 30 μm, more preferably in the range of about 2 to 20 μm.

The channel width W is preferably in the range of about 0.1 to 5 mm, more preferably in the range of about 0.3 to 3 mm.

As described above, the organic semiconductor layer 50 is provided on the substrate 20 so as to cover the source electrode 30 and the drain electrode 40. As a constituent material of the organic semiconductor Layer 50, the conductive material according to the present invention can be used.

As described above, by appropriately setting the chemical structure of the group Y of the compound represented by the general formula (1), it is possible to impart a desired carrier transport property to a resultant polymer (that is, to a conductive material according to the present invention).

Therefore, the conductive material according to the present invention is useful for forming an organic semiconductor layer 50 because it is possible to impart good semiconductivity to the polymer by appropriately setting the chemical structure of the group Y.

As a conductive material constituting such an organic semiconductor layer 50, for example, a polymer of the compound represented by the general formula (A1) in which the group Y has a chemical structure represented by the chemical formula (D2), (D3), (D16), (D17), or (D20) is preferably selected.

The thickness of the organic semiconductor layer 50 is preferably in the range of about 0.1 to 1,000 nm, more preferably in the range of about 1 to 500 nm, and even more preferably in the range of about 10 to 100 nm. By setting the thickness of the organic semiconductor layer 50 to a value within the above range, it is possible to prevent an increase in size of the organic TFT 10 (especially, an increase in thickness of the organic TFT 10) while maintaining a high carrier transport ability of the organic TFT 10.

By using the organic semiconductor Layer 50 which is obtained by using a polymer such as the conductive material according to the present invention as its main material, it is possible to obtain an organic TFT 10 having reduced size and weight. In addition, it is also possible for the organic TFT 10 to have excellent flexibility. Such an organic TFT 10 is suitably used for a switching element of a flexible display provided with the organic EL devices described above.

The organic semiconductor layer 50 is not limited to one provided so as to cover the source electrode 30 and the drain electrode 40. The organic semiconductor layer 50 should be provided in at least the region between the source electrode 30 and the drain electrode 40 (that is, in at least the channel region 510).

As described above, the gate insulating layer 60 is provided on the organic semiconductor layer 50.

The gate insulating layer 60 is provided to insulate the gate electrode 70 from the source electrode 30 and the drain electrode 40.

The gate insulating layer 60 is preferably formed using an organic material (especially, an organic polymeric material) as its main material. By using an organic polymeric material as a main material of the gate insulating layer 60, it is possible to form the gate insulating layer 60 easily as well as to bring the gate insulating layer 60 into closer contact with the organic semiconductor layer 50.

Examples of such an organic polymeric material include polystyrene, polyimide, polyamideimide, polyvinylphenylene, polycarbonate (PC), acrylic resins such as polymethylmethacrylate (PMMA), fluorinated resins such as polytetrafluoroethylene (PTFE), phenolic resins such as polyvinyl phenol and novolac resins, and olefin-based resins such as polyethylene, polypropylene, polyisobutylene, and polybutene. These organic polymeric materials may be used singly or in combination of two or more of them.

The thickness of the gate insulating layer 60 is not particularly limited, but is preferably in the range of about 10 to 5,000 nm, more preferably in the range of about 100 to 1,000 nm. By setting the thickness of the gate insulating layer 60 to a value within the above range, it is possible to prevent the size of the organic TFT 10 from being increased (especially, an increase in thickness of the organic TFT 10) while reliably insulating the gate electrode 70 from the source electrode 3 and the drain electrode 40.

It is to be noted that the gate insulating layer 60 is not limited to one comprised of a single layer and may have two or more layers.

As described above, the gate electrode 70 is provided on the gate insulating layer 60.

As constituent materials of the gate electrode 70, the same constituent materials that have been mentioned with reference to the source electrode 30 and the drain electrode 40 can be used.

The thickness of the gate electrode 70 is not particularly limited, but is preferably in the range of about 0.1 to 5,000 nm, more preferably in the range of about 1 to 5,000 nm, even more preferably in the range of about 10 to 5,000 nm.

In the organic TFT 10 as described above, the amount of current flowing between the source electrode 30 and the drain electrode 40 is controlled by changing voltage applied to the gate electrode 70.

Namely, in the OFF-state where voltage is not applied to the gate electrode 70, only a little current flows even by applying voltage across the source electrode 30 and the drain electrode 40 because carriers hardly exist in the organic semiconductor layer 50. On the other hand, in the ON-state where voltage is applied to the gate electrode 70, an electric charge is induced in the surface of the organic semiconductor layer 50 that is in contact with the gate insulating layer 60 so that a channel for carriers is formed in the channel region 510. In such a state, by applying voltage across the source electrode 30 and the drain electrode 40, it is possible to allow carriers (holes or electrons) to pass through the channel region 510.

Such an organic TFT 10 as described above can be manufactured in the following manner, for example.

Figure 3:
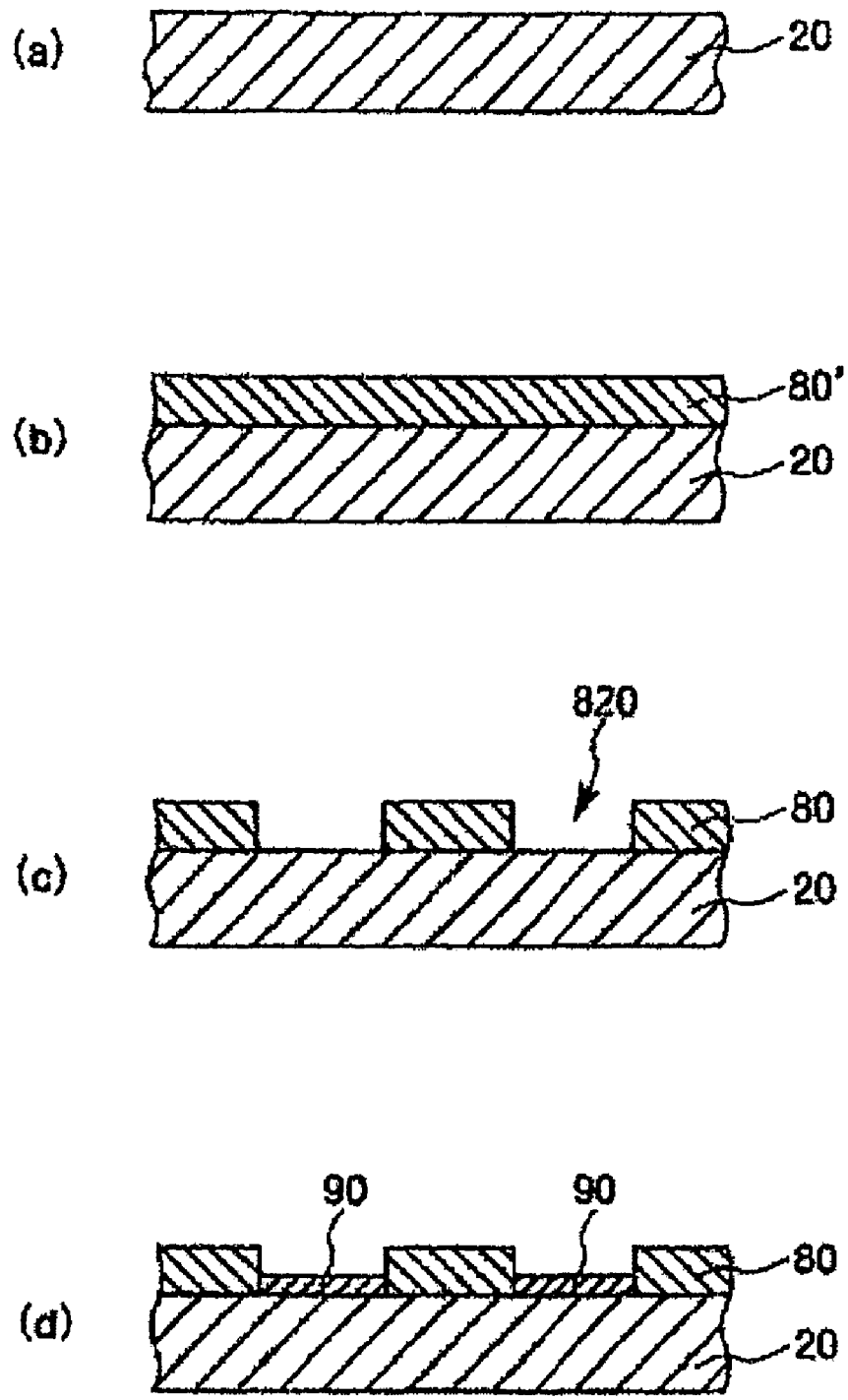
FIG. 3(a) to FIG. 3(d) are illustrations which explain the manufacturing method of the organic TFT shown in FIG. 2.
Figure 4:
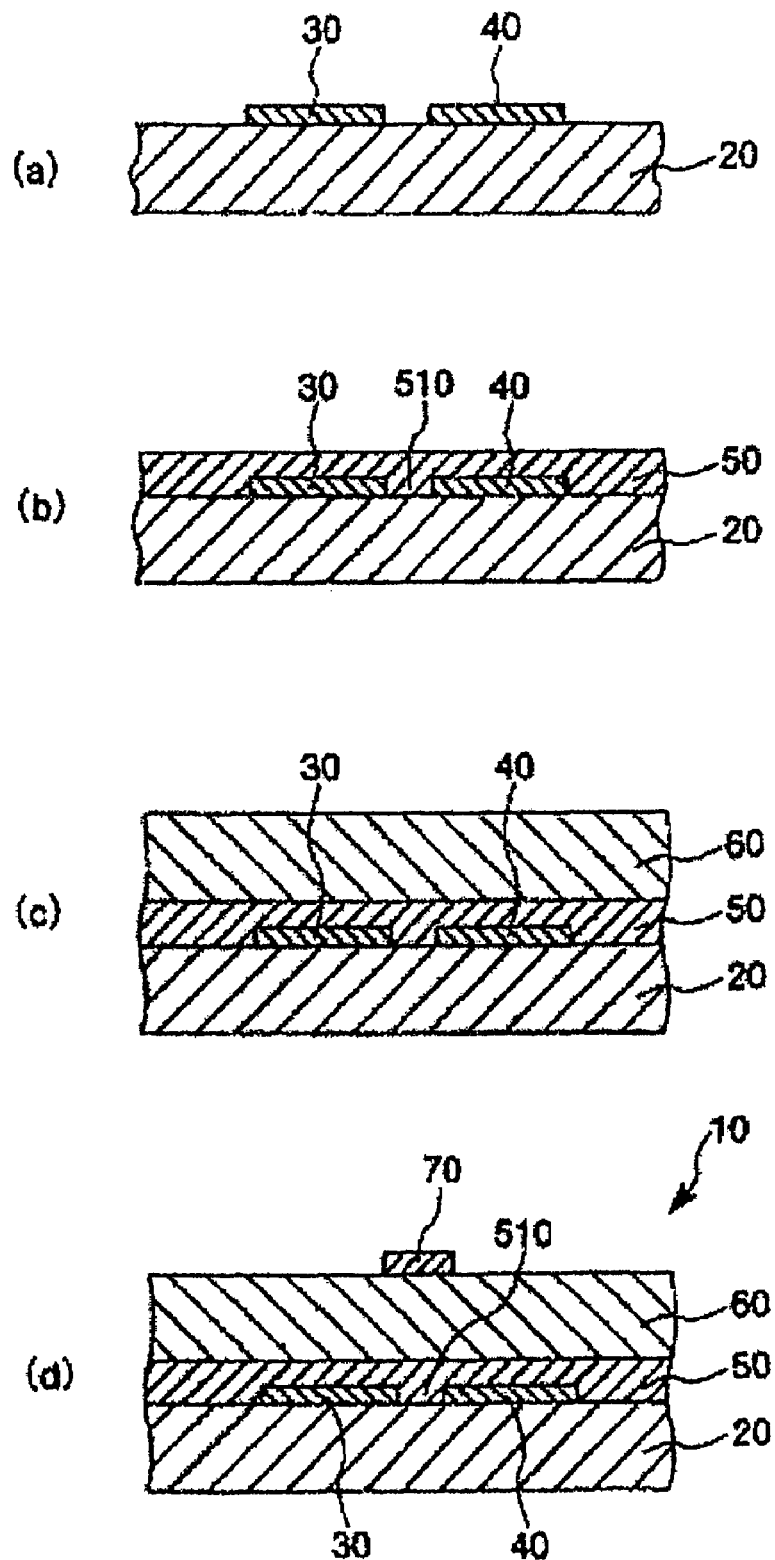
FIG. 4(a) to FIG. 4(d) are illustrations which explain the manufacturing method of the organic TFT shown in FIG. 2.

FIGS. 3 and 4 are drawings (cross-sectional views) to be used for explaining a manufacturing method of the organic TFT 10 shown in FIG. 2. It is to be noted that, in the following description, the upper side and lower side in FIGS. 3 and 4 will be referred to as the "upper side" and the "lower side", respectively.

[B1] Step of Forming Source Electrode and Drain Electrode

[B1-1]

First, a substrate 20 as shown in FIG. 3(*a*) is prepared. The substrate 20 is washed with, for example, water (e.g., pure water) and/or organic solvents. Water and organic solvents may be used singly or in combination of two or more of them.

Next, a photoresist is supplied onto the substrate 20 to form a film 80' (see FIG. 3(*b*)).

As a photoresist to be supplied onto the substrate 20, either a negative-type photoresist or a positive-type photoresist may be used. When the negative-type photoresist is used, an area irradiated with light (that is, an area exposed to light) is cured and then an area other than the area exposed to light is dissolved by development to be removed. When the positive-type photoresist is used, an area exposed to light is dissolved by development to be removed.

Examples of such a negative-type photoresist include water-soluble photoresists such as rosin-dichromate, polyvinyl alcohol (PVA)-dichromate, shellac-dichromate, casein-dichromate, PVA-diazo, and acrylic photoresists and oil-soluble photoresists such as polyvinyl cinnamate, cyclized rubber-azide, polyvinyl cinnamylidene acetate, and polycinnamic acid β-vinyloxyethyl ester.

Examples of a positive-type photoresist include oil-soluble photoresists such as o-naphthoquinonediazide.

Any method can be used for supplying a photoresist onto the substrate 20, but various application methods are preferably employed.

As such application methods, the same methods that have been mentioned with reference to the step of forming the hole transport layer [A2] in the manufacturing method of the organic EL device 1 can be employed.

Next, the film 80' is exposed to light through a photomask and is then developed to form a resist layer 80 having openings 820 where a source electrode 30 and a drain electrode 40 are to be formed (see FIG. 3(C)).

[B1-2]

Next, as shown in FIG. 3(d), a predetermined amount of a liquid material 90 containing a constituent material of a source electrode 30 and a drain electrode 40 to be formed or a precursor thereof is supplied to the openings 820 provided on the substrate 20.

As solvents or dispersion media in which a constituent material of a source electrode 30 and a drain electrode 40 or a precursor thereof is dissolved or dispersed for preparing a liquid material 90, the same solvents or dispersion media that have been mentioned with reference to the step of forming hole transport layer [A2] can be used.

As methods for supplying the liquid material 90 to the openings 820, the same application methods that have been mentioned above can be employed. Among these application methods, an inkjet method (that is, a liquid droplet ejecting method) is preferably employed. By employing the inkjet method, it is possible to eject the liquid material 90 in the form of liquid droplets from a nozzle of a liquid droplet ejecting head, thereby enabling the liquid material 90 to be reliably supplied to the openings 820. As a result, adhesion of the liquid material 90 to the resist layer 80 is reliably prevented.

[B1-3]

Next, the solvent or dispersion medium contained in the liquid material 90 supplied to the openings 820 is removed to form a source electrode 30 and a drain electrode 40.

The temperature at which the solvent or dispersion medium is removed is not particularly limited, and slightly varies depending on the kind of solvent or dispersion medium used. However, the temperature at which the solvent or dispersion medium is removed is preferably in the range of about 20 to 200° C., more preferably in the range of about 50 to 100° C. By removing the solvent or dispersion medium at a temperature within the above range, it is possible to reliably remove the solvent or dispersion medium from the liquid material 90.

In this connection, it is to be noted that the solvent or dispersion medium contained in the liquid material 90 may be removed by heating under reduced pressure. By doing so, it is possible to more reliably remove the solvent or dispersion medium from the liquid material 90.

[B1-4]

Next, the resist layer 80 provided on the substrate 20 is removed to obtain the substrate 20 on which the source electrode 30 and the drain electrode 40 are formed (see FIG. 4(f)).

A method for removing the resist layer 80 is appropriately selected depending on the kind of resist layer 80. For example, ashing such as plasma treatment or ozone treatment, irradiation with ultraviolet rays, or irradiation with a laser such as a Ne—He laser, an Ar laser, a $CO_2$ laser, a ruby laser, a semiconductor laser, a YAG laser, a glass laser, a $YVO_4$ laser, or an excimer laser may be carried out. Alternatively, the resist layer 80 may removed by being brought into contact with a solvent capable of dissolving or decomposing the resist layer 80 by, for example, immersing the resist layer 80 in such a solvent.

[B2] Step of Forming Organic Semiconductor Layer

Next, as shown in FIG. 4(h), an organic semiconductor layer 50 is formed on the substrate 20 so as to cover the source electrode 30 and the drain electrode 40 provided on the substrate 20.

At this time, a channel region 510 is formed between the source electrode 30 and the drain electrode 40 (that is, in an area corresponding to an area where a gate electrode 70 is to be formed).

The organic semiconductor layer 50 can be formed using the composition for conductive materials according to the present invention by the same method that has been described with reference to the step of forming the hole transport layer [A2] in the manufacturing method of the organic EL device 1.

The organic semiconductor layer 50 is formed using the conductive material (that is, the polymer) according to the present invention as its main material. Therefore, when a gate insulating layer material is supplied onto the organic semiconductor layer 50 in the next step [B3], swelling and dissolution of the polymer due to a solvent or dispersion medium contained in the gate insulating layer material is properly inhibited or prevented. As a result, mutual dissolution between the organic semiconductor layer 50 and a gate insulating layer 60 is reliably prevented.

By forming an organic semiconductor layer 50 using a polymer such as the conductive material according to the present invention as its main material, it is possible to prevent reliably the mixing of the constituent materials of the organic semiconductor layer 50 and the gate insulating layer 60 from occurring near the boundary between these layers 50 and 60 with the lapse of time.

[B3] Step of Forming Gate Insulating Layer

Next, as shown in FIG. 4(i), a gate insulating layer 60 is formed on the organic semiconductor layer 50 by an application method.

Specifically, the gate insulating layer 60 can be formed by applying or supplying a solution containing an insulating material or a precursor thereof onto the organic semiconductor layer 50 by the application method described above. When necessary, the thus obtained layer is subjected to aftertreatment such as heating, irradiation with infrared rays, or exposure to ultrasound.

[B4] Step of Forming Gate Electrode

Next, as shown in FIG. 4(j), a gate electrode 70 is formed on the gate insulating layer 60 by an application method.

Specifically, the gate electrode 70 can be formed by applying or supplying a solution containing an electrode material or a precursor thereof onto the gate insulating layer 60 by the application method. When necessary, the thus obtained layer is subjected to aftertreatment such as heating, irradiation with infrared rays, or exposure to ultrasound.

As application methods to be used, the same methods that have been mentioned above can be employed. Particularly, an inkjet method is preferably employed. By employing the inkjet method, it is possible to eject a solution containing an electrode material or a precursor thereof in the form of liquid droplets from a nozzle of a liquid droplet ejecting head to carry out patterning. As a result, a gate electrode 70 having a predetermined shape is easily and reliably formed on the gate insulating layer 60.

The organic TFT 10 is manufactured through the steps described above.

(Electronic Equipment)

The electronic devices according to the present invention such as the organic EL device (which is a light emitting device) 1 and the organic TFT (which is a switching element) 10 as described above can be used for various electronic equipment.

Figure 5:
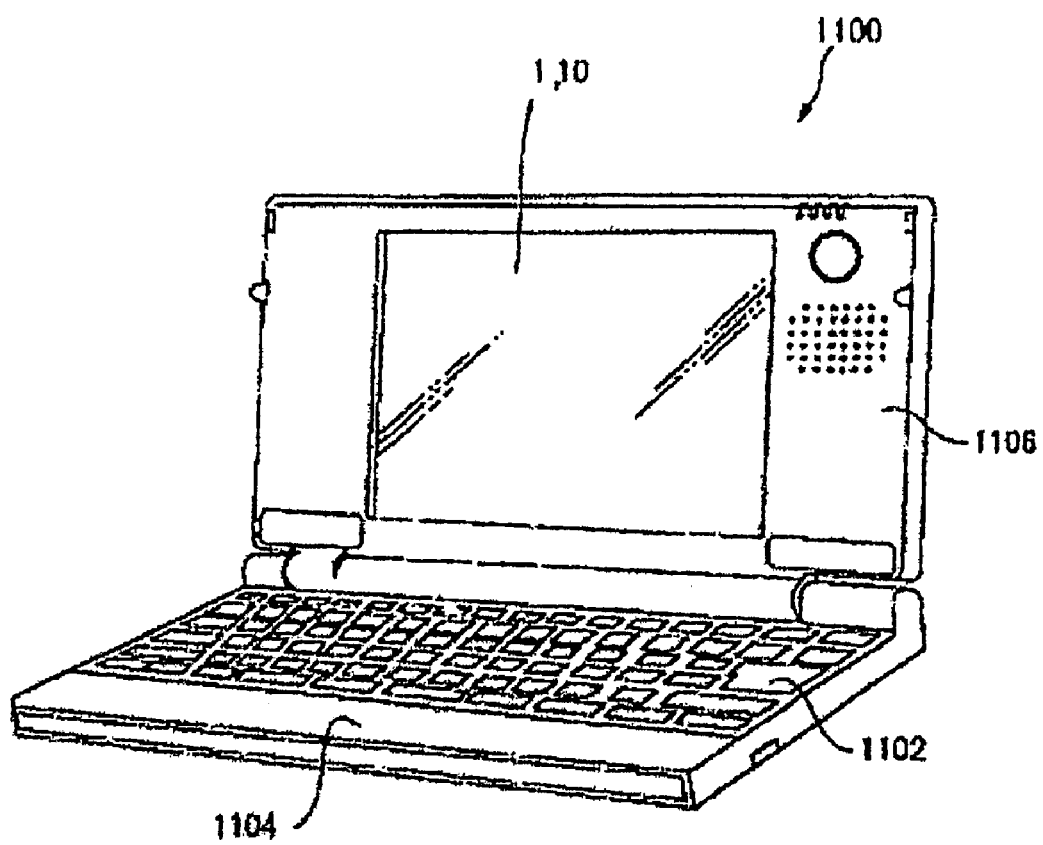
FIG. 5 is a perspective view which shows the structure of a personal mobile computer (or a personal notebook computer) to which the electronic equipment according to the present invention is applied.

FIG. 5 is a perspective view which shows the structure of a personal mobile computer (or a personal notebook computer) to which the electronic equipment according to the present invention is applied.

In FIG. 5, a personal computer 1100 is comprised of a main body 1104 provided with a keyboard 1102 and a display unit 1106 provided with a display. The display unit 1106 is rotatably supported by the main body 1104 via a hinge structure.

In the personal computer 1100, for example, the display unit 1106 includes the organic EL device (which is a light emitting device) 1 and the organic TFT (which is a switching element) 10 described above.

Figure 6:
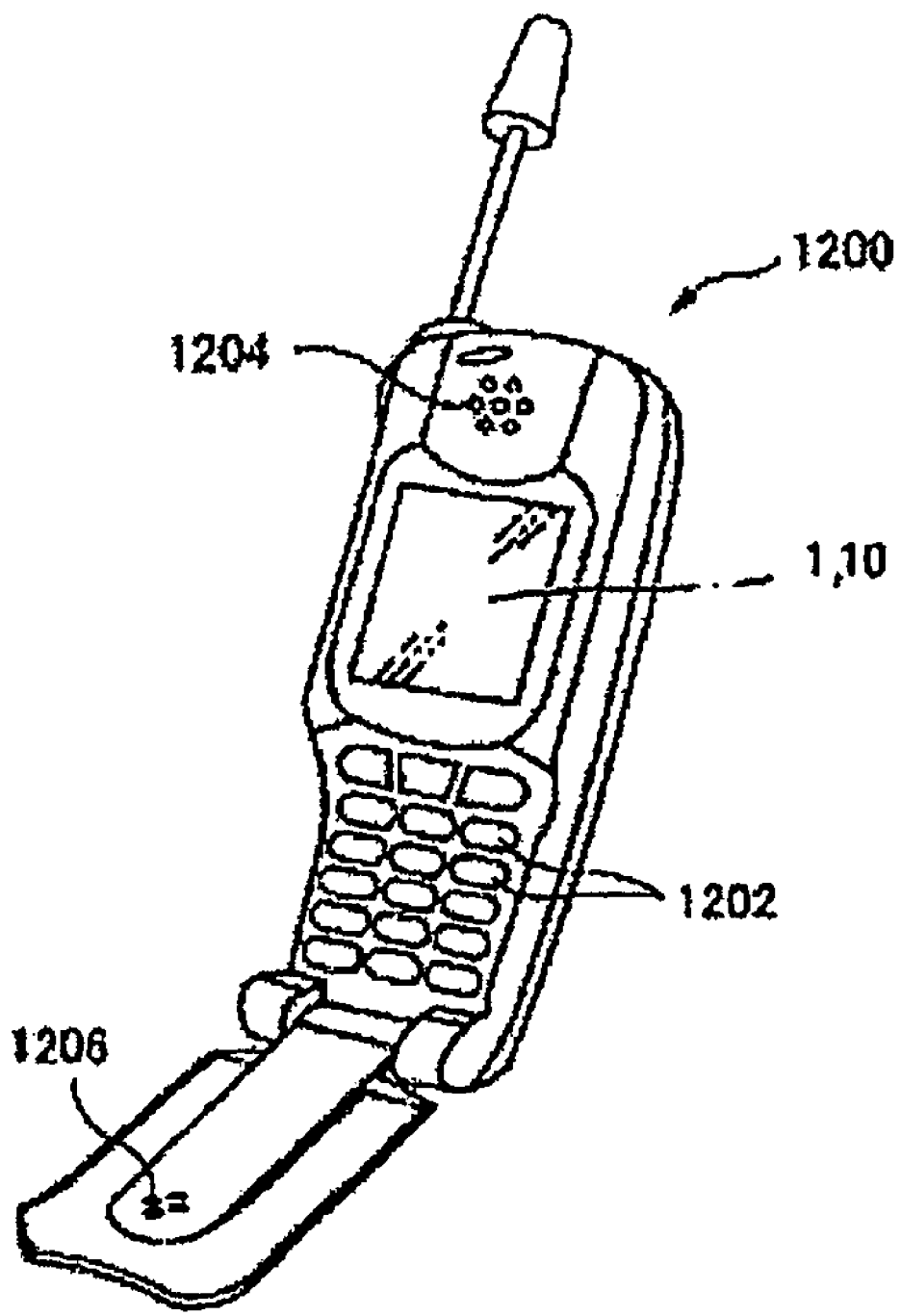
FIG. 6 is a perspective view which shows the structure of a mobile phone (including the personal handyphone system (PHS)) to which the electronic equipment according to the present invention is applied.

FIG. 6 is a perspective view which shows the structure of a mobile phone (including the personal handyphone system (PHS)) to which the electronic equipment according to the present invention is applied.

The mobile phone 1200 shown in FIG. 6 includes a plurality of operation buttons 1202, an earpiece 1204, a mouthpiece 1206, and a display.

In this mobile phone 1200, for example, the display includes the organic EL device (which is a light emitting device) 1 and the organic TFT (which is a switching element) 10 described above.

Figure 7:
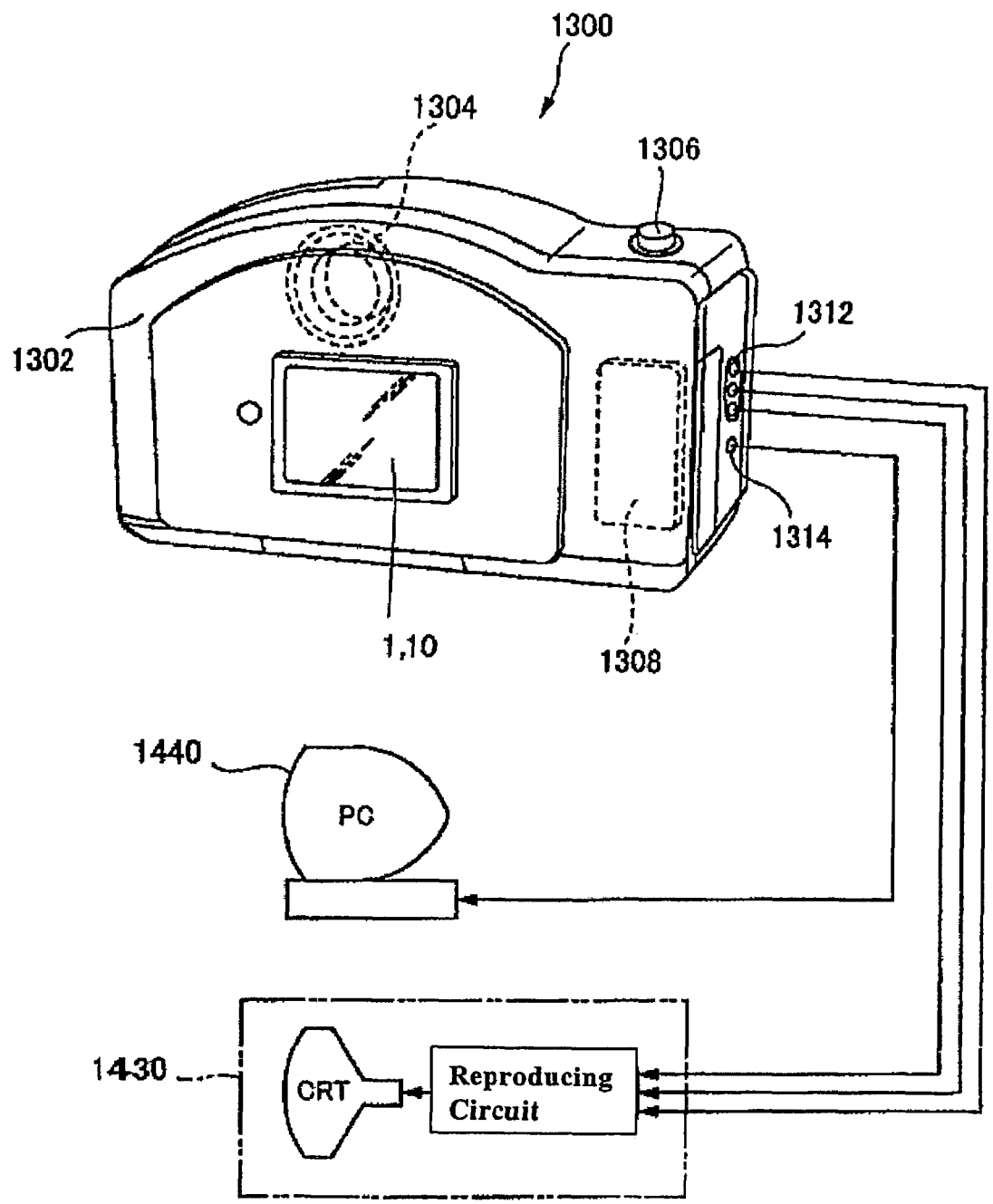
FIG. 7 is a perspective view which shows the structure of a digital still camera to which the electronic equipment according to the present invention is applied.

FIG. 7 is a perspective view which shows the structure of a digital still camera to which the electronic equipment according to the present invention is applied. In this drawing, interfacing to external devices is simply illustrated.

In a conventional camera, a silver salt film is exposed to the optical image of an object. On the other hand, in the digital still camera 1300, an image pickup device such as a CCD (Charge Coupled Device) generates an image pickup signal (or an image signal) by photoelectric conversion of the optical image of an object.

In the rear surface of a case (or a body) 1302 of the digital still camera 1300, there is provided a display which provides an image based on the image pickup signal generated by the CCD. That is, the display functions as a finder which displays the object as an electronic image.

In this digital still camera 1300, for example, the display includes the organic EL device (which is a light emitting device) 1 and the organic TFT (which is a switching element) 10 described above.

In the inside of the case, there is provided a circuit board 1308. The circuit board 1308 has a memory capable of storing an image pickup signal.

In the front surface of the case 1302 (in FIG. 7, the front surface of the case 1302 is on the back side), there is provided a light receiving unit 1304 including an optical lens (an image pickup optical system) and a CCD.

When a photographer presses a shutter button 1306 after checking an object image on the display, an image pickup signal generated by the CCD at that time is transferred to the memory in the circuit board 1308 and then stored therein.

Further, in the side surface of the case 1302 of the digital still camera 1300, there are provided a video signal output terminal 1312 and an input-output terminal for data communication 1314. As shown in FIG. 7, when necessary, a television monitor 1430 and a personal computer 1440 are connected to the video signal output terminal 1312 and the input-output terminal for data communication 1314, respectively. In this case, an image pickup signal stored in the memory of the circuit board 1308 is outputted to the television monitor 1430 or the personal computer 1440 by carrying out predetermined operation.

The electronic equipment according to the present invention can be applied not only to the personal computer (which is a personal mobile computer) shown in FIG. 5, the mobile phone shown in FIG. 6, and the digital still camera shown in FIG. 7 but also to a television set, a video camera, a view-finer or monitor type of video tape recorder, a laptop-type personal computer, a car navigation device, a pager, an electronic notepad (which may have communication facility), an electronic dictionary, an electronic calculator, a computerized game machine, a word processor, a workstation, a videophone, a security television monitor, an electronic binocular, a POS terminal, an apparatus provided with a touch panel (e.g., a cash dispenser located on a financial institute, a ticket vending machine), medical equipment (e.g., an electronic thermometer, a sphygmomanometer, a blood glucose meter, an electrocardiograph monitor, ultrasonic diagnostic equipment, an endoscope monitor), a fish detector, various measuring instruments, gages (e.g., gages for vehicles, aircraft, and boats and ships), a flight simulator, various monitors, and a projection display such as a projector.

The composition for conductive materials, the conductive material, the conductive layer, the electronic device, and the electronic equipment according to the present invention have been described based on the embodiments shown in the drawings, but the present invention is not limited thereto.

For example, in the case where the electronic device according to the present invention has a hole transport layer as a conductive layer, such an electronic device can be used for, for example, a solar cell that is an example of light receiving devices (or photoelectric transducers) as well as the organic EL device as described above that is an example of display devices (or light emitting devices).

Further, in the case where the electronic device according to the present invention has an organic semiconductor layer as a conductive layer, such an electronic device can be used for, for example, a semiconductor device as well as the organic TFT as described above that is an example of switching elements.

Furthermore, the conductive layer according to the present invention can be used as, for example, wiring or an electrode as well as the hole transport layer as described above. In this case, a resultant electronic device according to the present invention can be used for a wiring board and the like.

EXAMPLES

Next, the present invention will be described with reference to Examples.

1. Synthesis of Compound

First, compounds (AI) to (WII) described below were prepared.

<Compound (AI)>

6-(p-aminophenyl)hexanol was treated with 4-methoxybenzylbromide and sodium hydride in anhydrous dimethylformamide to transform hydroxyl group into benzyl ether group and then it was protected.

Next, 1 mol of the obtained compound was dissolved in 150 mL of acetic acid, and acetic anhydride was dropped therein at room temperature and then they were stirred. After the completion of the reaction, solid matter precipitated was filtered and then dried after washing with water.

Next, 0.37 mol of the thus obtained substance, 0.66 mol of 1-bromo-4-hexylbenzene, 1.1 mol of potassium carbonate, copper powder, and iodine were mixed and heated at 200° C. After the mixture was allowed to cool, 130 mL of isoamyl alcohol, 50 mL of pare water, and 0.73 mol of potassium hydroxide were added to the mixture, and then they were stirred and dried.

Further, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at 120° C. Thereafter, the mixture was allowed to cool for crystallization.

The thus obtained compound was then reduced by hydrogen gas under Pd—C catalyst so that transformation was made from the benzyl ether group to the hydroxyl group to carry out deprotection.

Next, 100 mmol of the compound and 200 mmol of p-(bromomethyl)styrene were added to a xylene solution, and then they were stirred for 10 hours with heating. Thereafter, the mixture was allowed to cool for crystallization to obtain a compound.

Then, the thus obtained compound was confirmed to be the following compound (AI) by means of a mass spectrum (MS) method, a $^1$H-nuclear magnetic resonance ($^1$H-NMR) spectrum method, a $^{13}$C-nuclear magnetic resonance ($^{13}$C-NMR) spectrum method, and a Fourier transform infrared absorption (FT-IR) spectrum method.

<Compound (BI)>
A compound (BI) was obtained in the same manner as the compound (AI) except that 1-bromo-4-hexylbenzene was changed to 1-bromo-3,5-dimethyl-4-hexylbenzene.

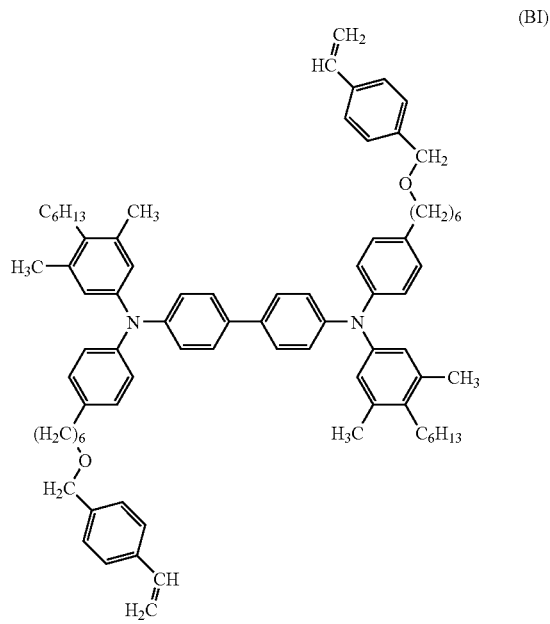

<Compound (CI)>
A compound (CI) was obtained in the same manner as the compound (AI) except that p-(bromomethyl)styrene was changed to 2'-bromo-4-ethylstyrene.

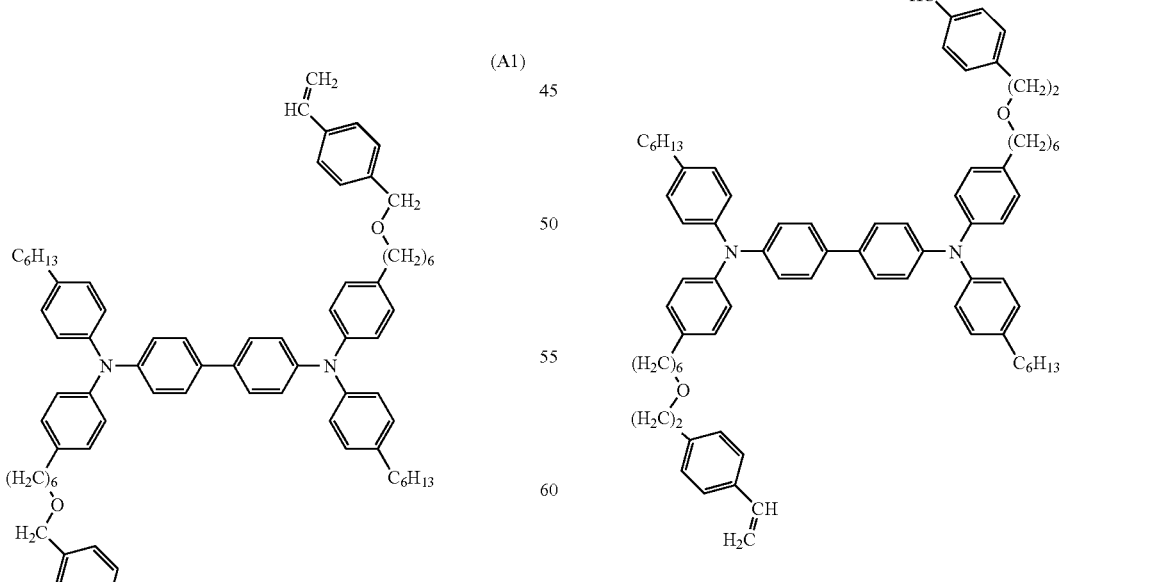

<Compound (DI)>
A compound (DI) was obtained in the same manner as the compound (AI) except that 6-(p-aminophenyl)hexanol was changed to 2-(p-aminophenyl)propanol and 1-bromo-4-hexylbenzene was changed to 1-bromo-4-propylbenzene, respectively.

<Compound (FI)>

A compound (FI) was obtained in the same manner as the compound (DI) except that p-(bromomethyl)styrene was changed to 3'-bromo-4-propylstyrene.

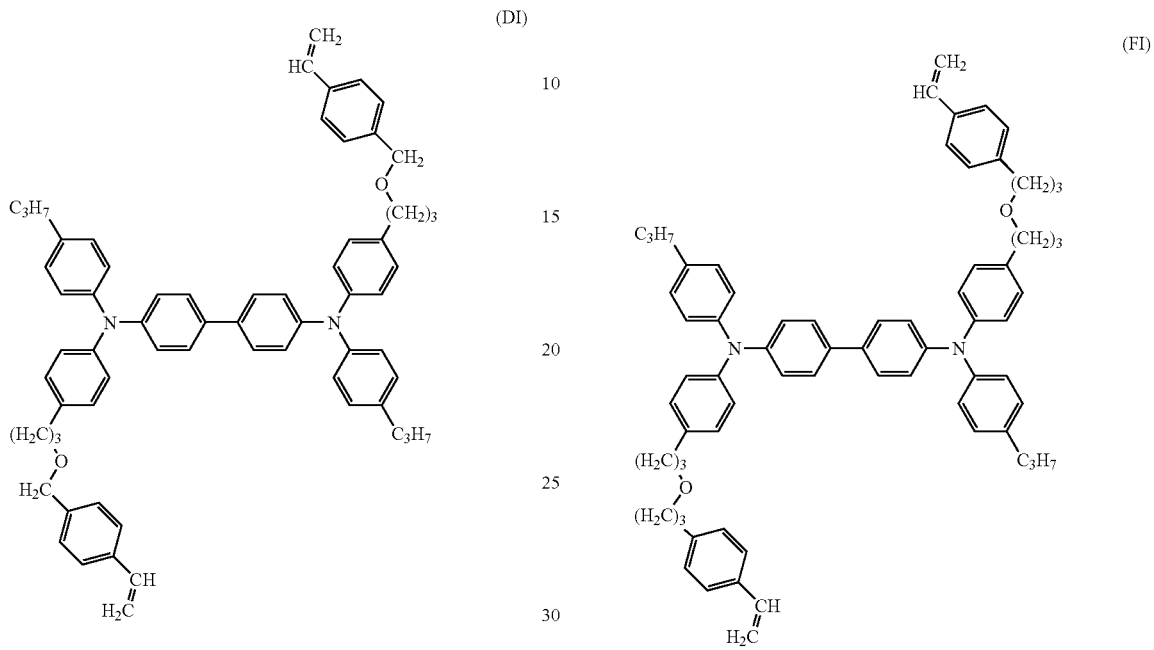

<Compound (EI)>

A compound (EI) was obtained in the same manner as the compound (DI) except that 4,4'-diiodobiphenyl was changed to 4,4'-diiodo-2,2'-dimethylbiphenyl.

<Compound (GI)>

A compound (GI) was obtained in the same manner as the compound (AI) except that 6-(p-aminophenyl)hexanol was changed to 8-(p-aminophenyl)octanol and 1-bromo-4-hexylbenzene was changed to 1-4-octylbenzene, respectively.

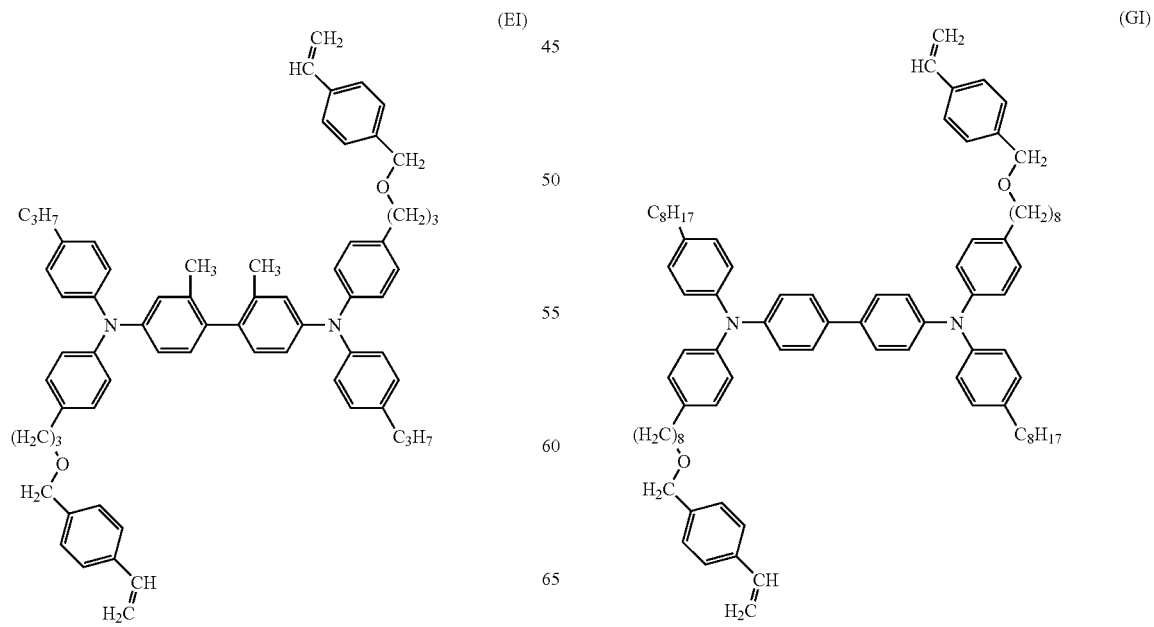

<Compound (HI)>

A compound (HI) was obtained in the same manner as the compound (AI) except that 6-(p-aminophenyl)hexanol was changed to 1-(p-aminophenyl)methanol and 1-bromo-4-hexylbenzene was changed to 4-bromotoluene, respectively.

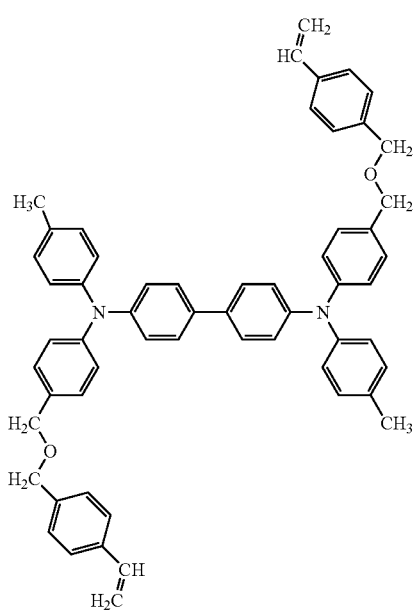

(HI)

<Compound (II)>

As for the following compound (II), N,N,N',N'-tetrakis(4-methylphenyl)-benzidine ("OSA 6140" provided by TOSCO CO., LTD.) was prepared.

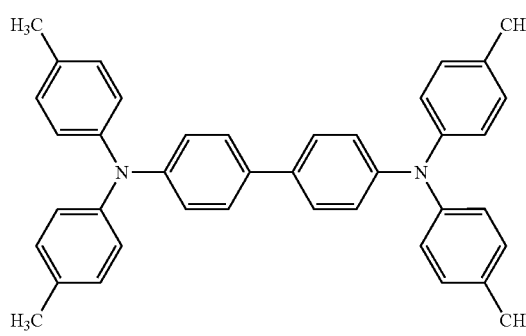

(II)

<Compound (AII)>

A compound (AII) was obtained in the same manner as the compound (AI) except that 4,4'-diiodobiphenyl was changed to 2,5-bis(4-iodophenyl)-thiophene.

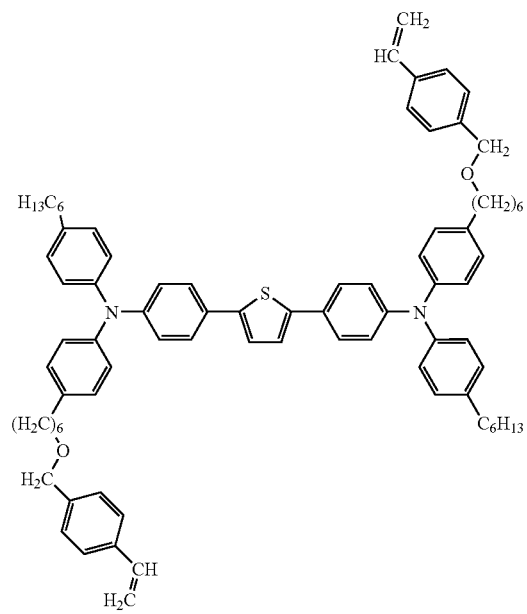

(AII)

<Compound (BII)>

A compound (BII) was obtained in the same manner as the compound (AII) except that 1-bromo-4-hexylbenzene was changed to 1-bromo-3,5-dimethyl-4-hexylbenzene.

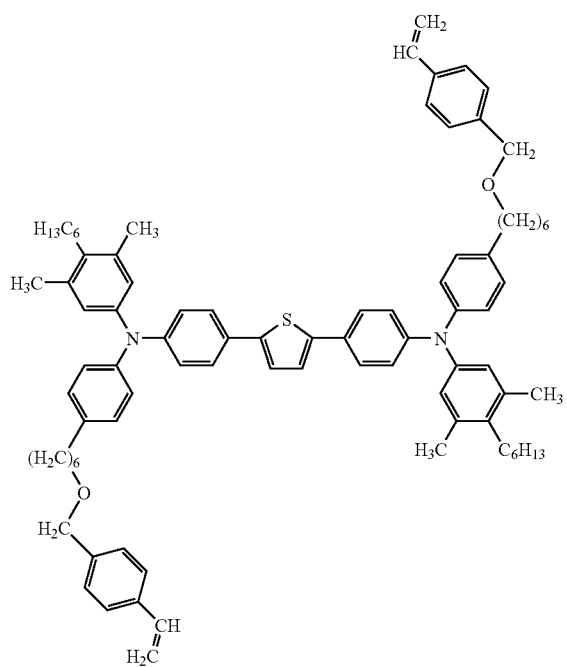

(BII)

<Compound (CII)>
A compound (CII) was obtained in the same manner as the compound (AII) except that 6-(bromomethyl)styrene was changed to 2'-bromo-4-ethylstyrene.

(CII)

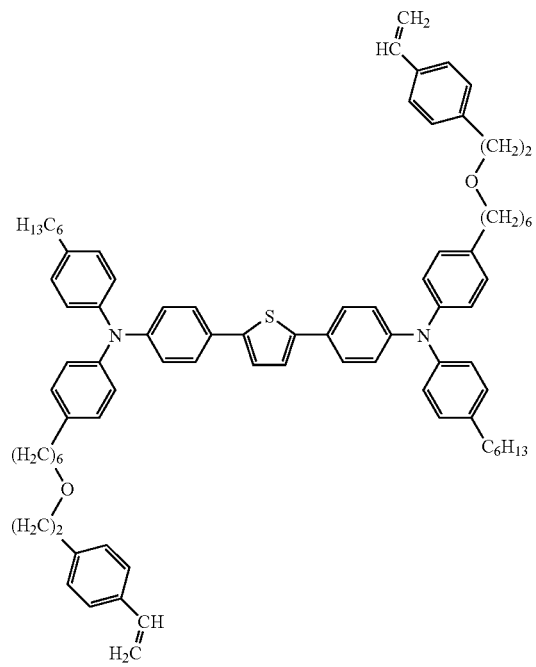

<Compound (DII)>
A compound (DII) was obtained in the same manner as the compound (AII) except that 6-(p-aminophenyl)hexanol was changed to 2-(p-aminophenyl)propanol and 1-bromo-4-hexylbenzene was changed to 1-bromo-4-propylbenzene, respectively.

(DII)

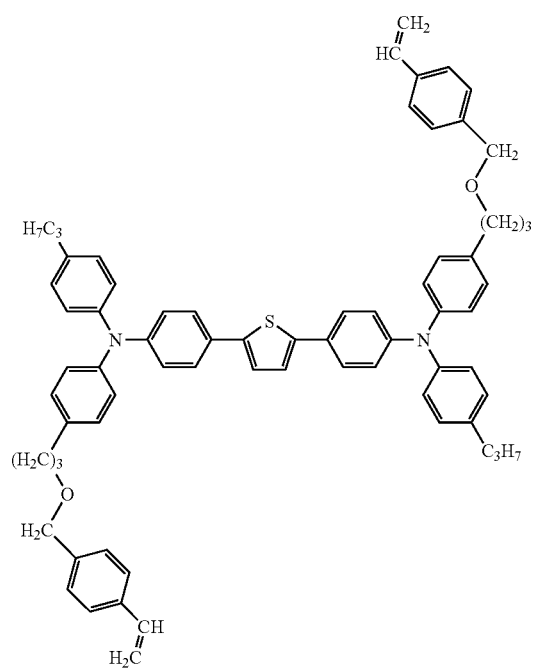

<Compound (EII)>
A compound (EII) was obtained in the same manner as the compound (CII) except that 2,5-bis(4-iodophenyl)-thiophene was changed to 2,5-bis(2-methyl-4-iodophenyl)-thiophene.

(EII)

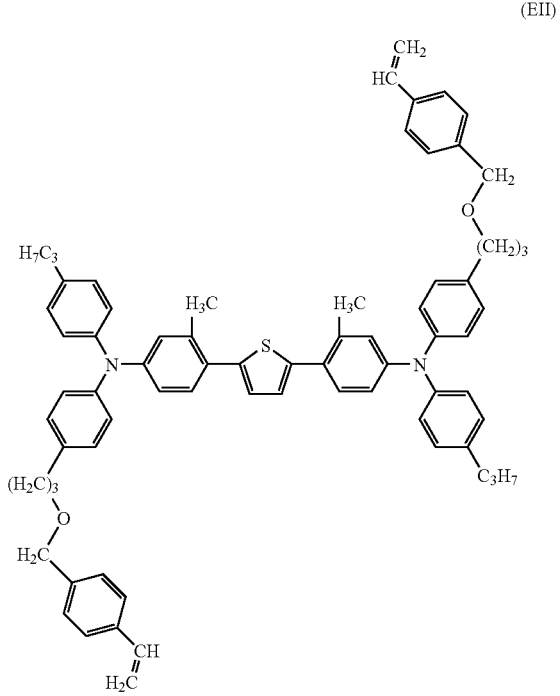

<Compound (FII)>
A compound (FII) was obtained in the same manner as the compound (DII) except that p-(bromomethyl)styrene was changed to 3'-bromo-4-propylstyrene.

(FII)

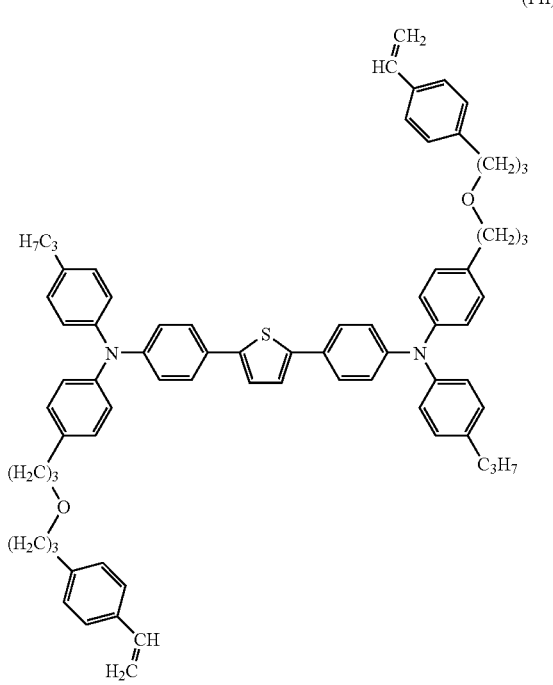

<Compound GII>

A compound (GII) was obtained in the same manner as the compound (AII) except that 6-(p-aminophenyl)hexanol was changed to 8-(p-aminophenyl)octanol and 1-bromo-4-hexylbenzene was changed to 1-bromo-4-octylbenzene, respectively.

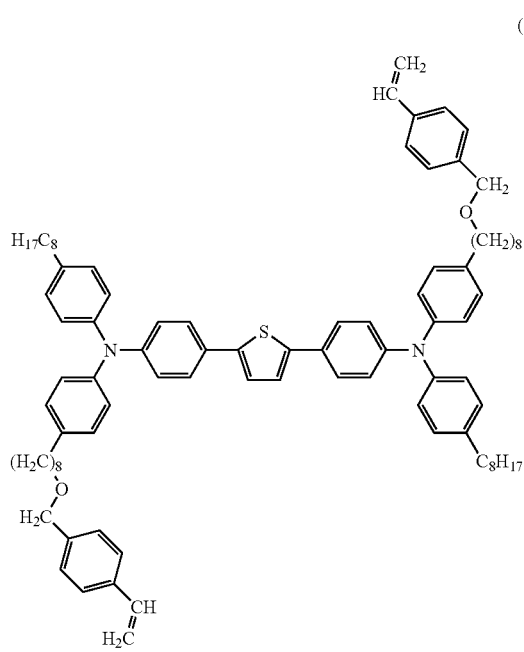

(GII)

<Compound (HII)>

A compound (HII) was obtained in the same manner as the compound (AII) except that 6-(p-aminophenyl)hexanol was changed to 1-(p-aminophenyl)methanol and 1-bromo-4-hexylbenzene was changed to 4-bromotoluene, respectively.

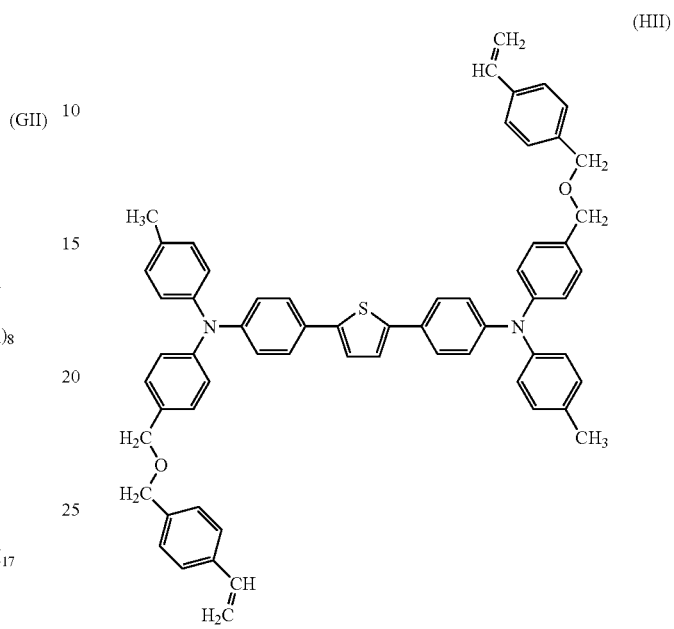

(HII)

<Compound (III)>

A compound (III) was obtained in the same manner as the compound (AII) except that 2,5-bis(4-iodophenyl)-thiophene was chanced to 5,5"-bis(4-iodophenyl)-2,2':5',2"-terthiophene.

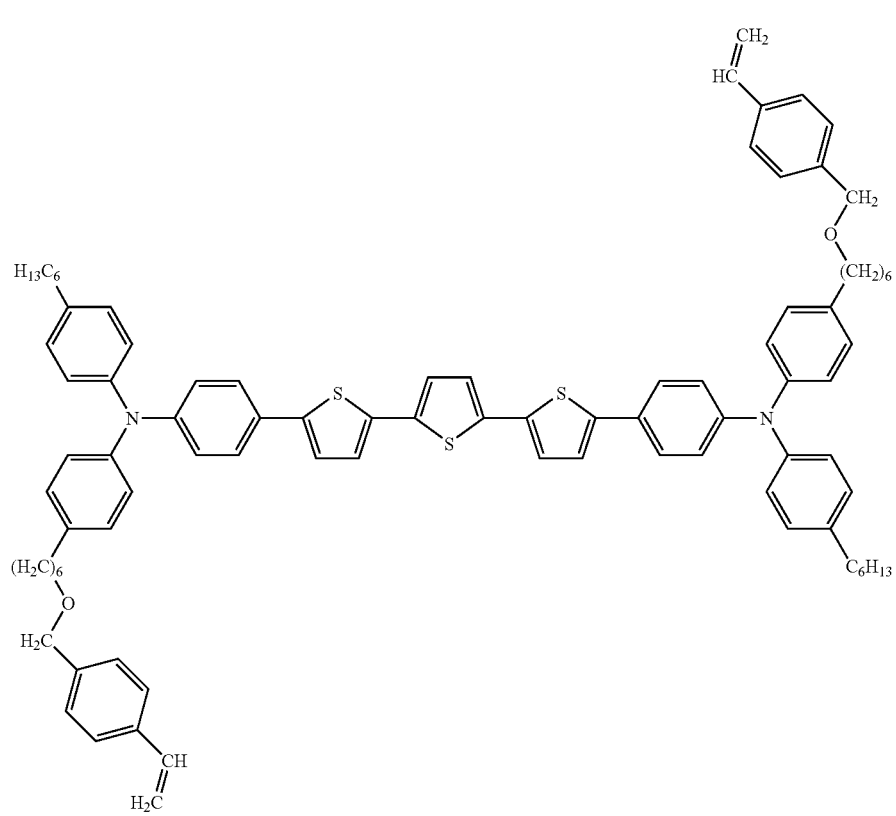

(III)

53

<Compound (JII)>

A compound (JII) was obtained in the same manner as the compound (AII) except that 2,5-bis(4-iodophenyl)-thiophene was changed to 3,5-diiodo-1,2,4-triazole.

54

<Compound (LII)>

A compound (LII) was obtained in the same manner as the compound (AII) except that 2,5-bis(4-iodophenyl)-thiophene was changed to 3,3'-diiodo-1,1'-biisobenzothiophene.

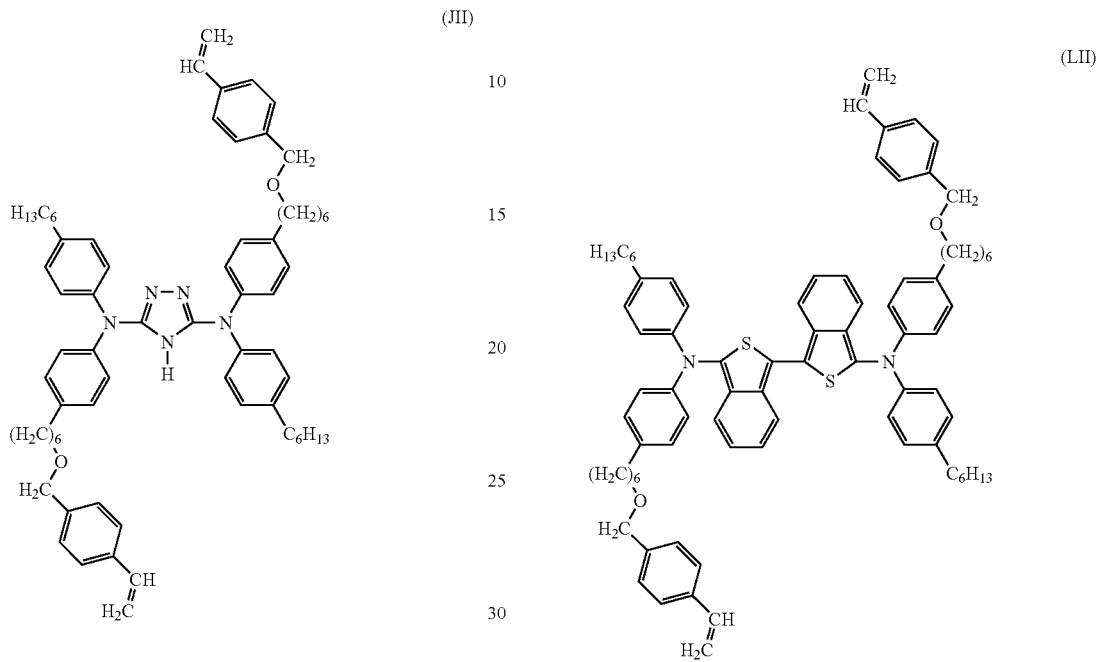

<Compound (KII)>

A compound (KII) was obtained in the same manner as the compound (AII) except that 2,5-bis(4-iodophenyl)-thiophene was changed to 2,5-(4-iodophenyl)-1,3,4-oxadiazole.

<Compound (MII)>

A compound (MII) was obtained in the same manner as the compound (LII) except that 6-(bromomethyl)styrene was changed to 2'-bromo-4-ethylstyrene.

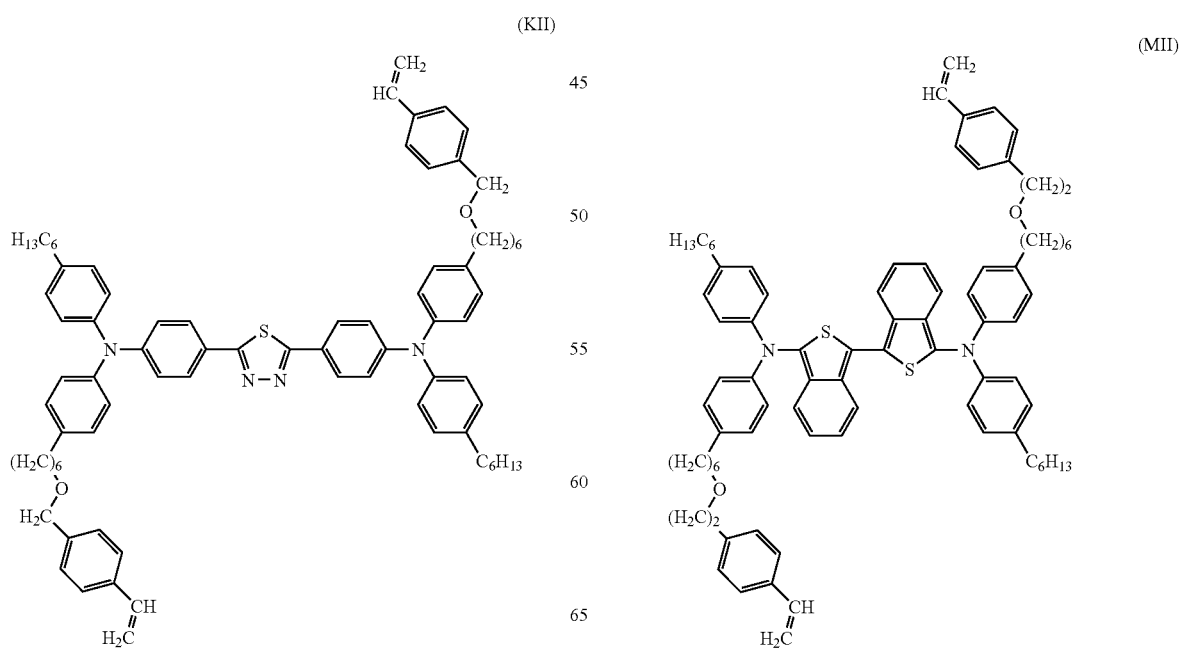

<Compound (NII)>

A compound (NII) was obtained in the same manner as the compound (LII) except that 6-(p-aminophenyl)hexanol was changed to 2-(p-aminophenyl)propanol and 1-bromo-4-hexylbenzene was changed to 1-bromo-4-propylbenzene, respectively.

<Compound (PII)>

A compound (PII) was obtained in the same manner as the compound (LII) except that 6-(p-aminophenyl)hexanol was changed to 8-(p-aminophenyl)octanol and 1-bromo-4-hexylbenzene was changed to 1-bromo-4-octylbenzene, respectively.

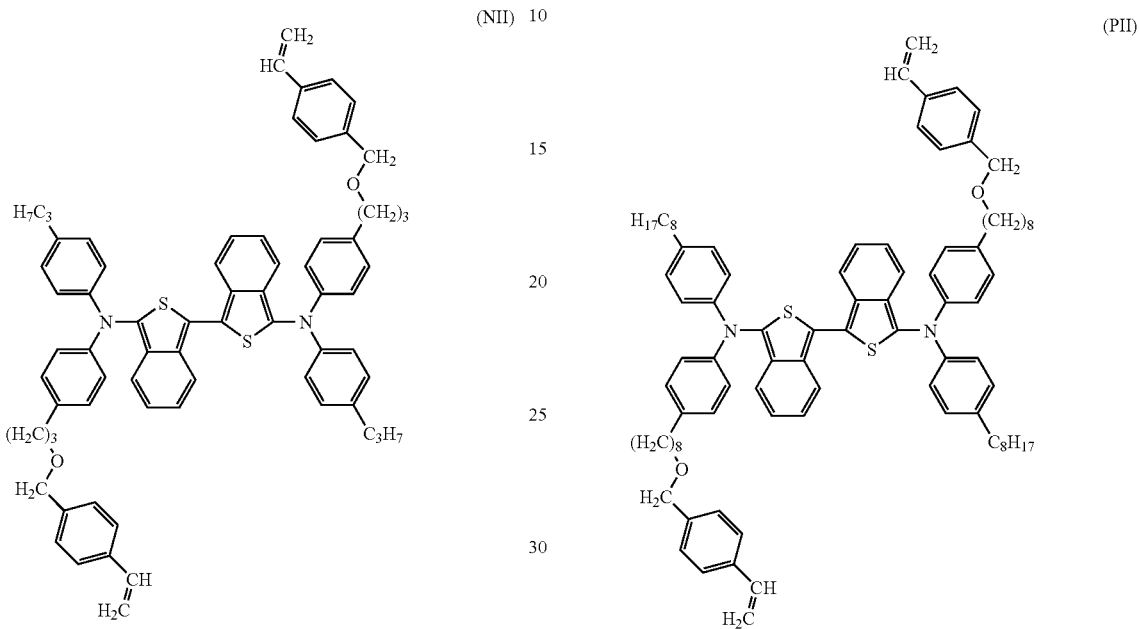

<Compound (OII)>

A compound (OII) was obtained in the same manner as the compound (NII) except that p-(bromomethyl)styrene was changed to 3'-bromo-4-propylstyrene.

<Compound (QII)>

A compound (QII) was obtained in the same manner as the compound (LII) except that 6-(p-aminophenyl)hexanol was changed to 1-(p-aminophenyl)methanol and 1-bromo-4-hexylbenzene was changed to 4-bromotoluene, respectively.

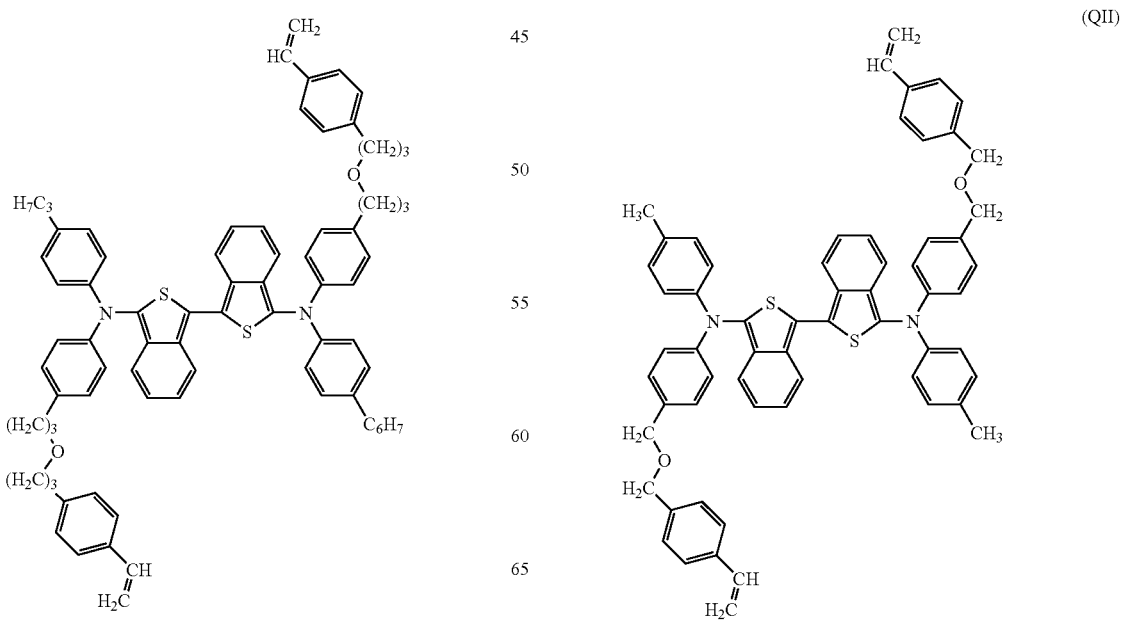

<Compound (RII)>

A compound (RII) was obtained in the same manner as the compound (AII) except that 2,5-bis(4-iodophenyl)-thiophene was changed to 5,5'-diiodo-2,2'-bi(3,4-dioxyethyleneselenophene).

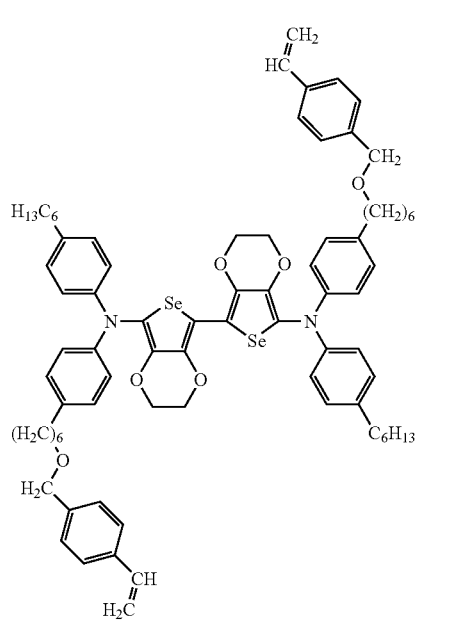

<Compound (SII)>

A compound (SII) was obtained in the same manner as the compound (AII) except that 2,5-bis(4-iodophenyl)-thiophene was changed to 5,5"-diiodo-2,2':5',2"-ter-selenophene.

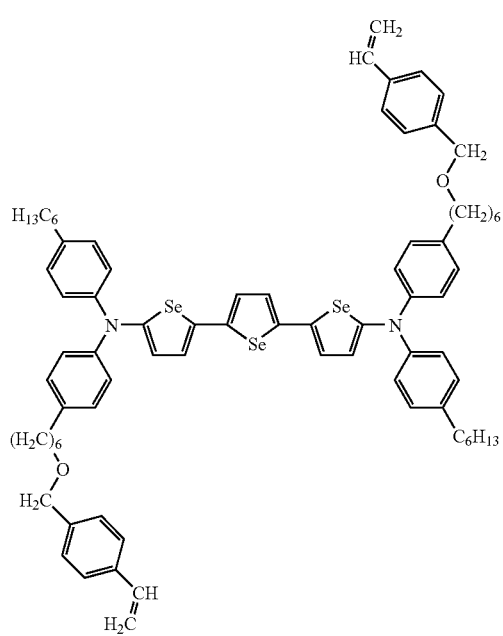

<Compound (TII)>

A compound (TII) was obtained in the same manner as the compound (AII) except that 2,5-bis(4-iodophenyl)-thiophene was changed to 5,5"-diiodo-3,3':5',3"-ter-(4-phenyl-1,2,4-triazole).

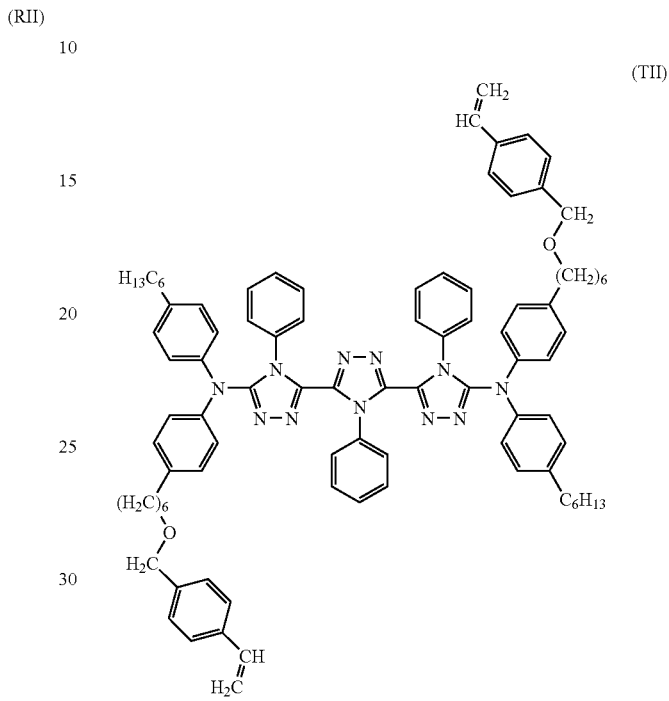

<Compound (UII)>

1 mol of 1-amino-4-methylbenzene was dissolved in 150 mL of acetic acid, and acetic anhydride was dropped therein at room temperature, and then they were stirred. After the completion of the reaction, solid matter precipitated was filtered, and was then dried after washing with water.

Next, 0.37 mol of the thus obtained substance, 0.66 mol of 1-bromo-4-methylbenzene, 1.1 mol of potassium carbonate, copper powder, and iodine were mixed and heated at 200° C. After the mixture was allowed to cool, 130 mL of isoamyl alcohol, 50 mL of pure water, and 0.73 mol of potassium hydroxide were added to the mixture, and then they were stirred and dried.

Further, 130 mmol of the thus obtained compound, 62 mmol of 2,5-bis(4-iodophenyl)-thiophene, 1.3 mmol of palladium acetate, 5.2 mmol of t-butylphosphine, 260 mmol of sodium t-butoxide, and 700 mL of xylene were mixed, and then they were stirred at 120° C.

Thereafter, the mixture was allowed to cool for crystallization to obtain a compound.

Then, the thus obtained compound was found to be the following compound (UII) by means of a mass spectrum (MS) method, a $^1$H-nuclear magnetic resonance ($^1$H-NMR) spectrum method, a $^{13}$C-nuclear magnetic resonance ($^{13}$C-NMR) spectrum method, and a Fourier transform infrared absorption (FT-IR) spectrum method.

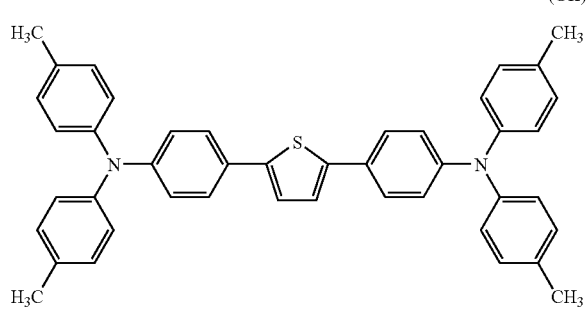

<Compound (VII)>

Poly(3,4-ethylenedioxythiophene/styrenesulfonic acid) ("BAYTRON P CH800", Bayer) was prepared as the following compound (VII).

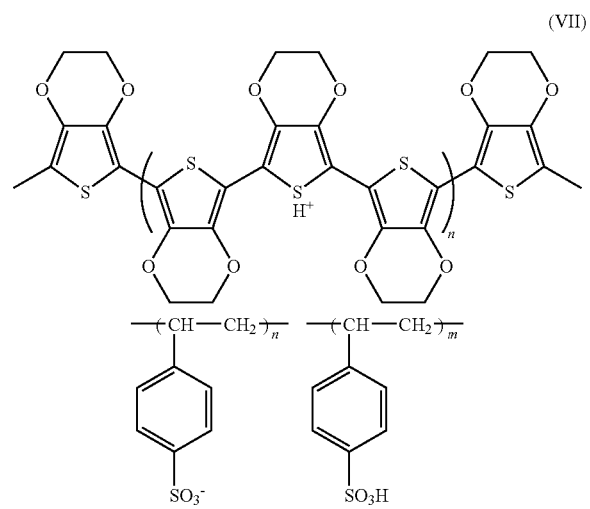

<Compound (WII)>

A compound (WSII) was obtained in the same manner as the compound (UII) except that 2,5-bis(4-iodophenyl)-thiophene was changed to 3,5-diiodo-1,2,4-triazole.

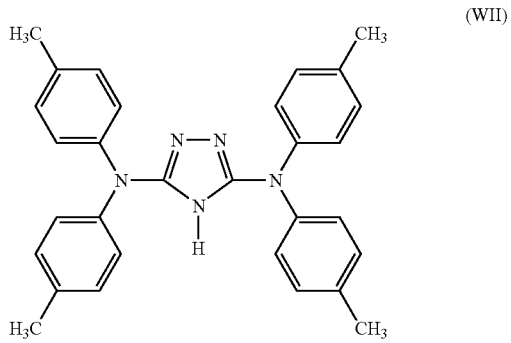

2. Manufacture of Organic EL Device

Five organic EL devices were manufactured in each of the following Examples and Comparative Examples.

Example 1A

<Preparation of Hole Transport Material>

The compound (AI) was used as an arylamine derivative, and the compound (AI) and a photo-radical polymerization initiator ("IRGACURE 651" produced by Nagase & Co., Ltd.) in a weight ratio of 95:5 were mixed with dichloroethane to obtain a hole transport material (that is, a composition for conductive materials).

<Manufacture of Organic EL Device>

1A First, an ITO electrode (that is, an anode) was formed on a transparent glass substrate having an average thickness of 0.5 mm by vacuum evaporation so as to have an average thickness of 100 nm.

2A Next, the hole transport material was applied onto the ITO electrode by a spin coating method, and was then dried.

Then, the hole transport material was irradiated with ultraviolet rays having a wavelength of 185 nm from a mercury lamp ("UM-452", USHIO Inc.) through a filter at an intensity of irradiation of 3 mW/cm$^2$ for 400 seconds in the dry atmosphere to polymerize the compound (AI), so that a hole transport layer having an average thickness of 50 nm was formed.

3A Next, a 1.7 wt % xylene solution of poly(9,9-dioctyl-2,7-divinylenefluorenyl-alt-co(anthracene-9,10-diyl)
(Weight average molecular weight: 200,000) was applied onto the hole transport layer by a spin coating method, and was then dried to form a light emitting layer having an average thickness of 50 nm.

4A Next, an electron transport layer having an average thickness of 20 nm was formed on the light emitting layer by a vacuum evaporation of 3,4,5-triphenyl-1,2,4-triazole.

5A Next, an AlLi electrode (that is, a cathode) was formed on the electron transport layer by vacuum evaporation so as to have an average thickness of 300 nm.

6A Next, a protection cover made of polycarbonate was provided so as to cover these layers described above, and was then secured and sealed with an ultraviolet curable resin to obtain an organic EL device.

Examples 2A to 7A

In each of Examples 2A to 7A, organic EL devices were manufactured after a hole transport material was prepared in the same manner as in Example 1A except that as for the arylamine derivatives for use in the hole transport material were changed to those shown in Table 1.

Comparative Example 1A

<Preparation of Hole Transport Material>

A hole transport material was obtained by dissolving the compound (II).

<Manufacture of Organic EL Device>

Organic EL devices were manufactured in the same manner as in Example 1A except that the hole transport material prepared in the step 2A was used and the irradiation of ultraviolet rays from the mercury lamp was omitted.

Comparative Example 2A

<Preparation of Hole Transport Material>

The compound (VII) was dispersed in water to prepare a 2.0 wt % water dispersion of the compound (VII) as a hole transport material.

In this regard, it is to be noted that in the compound (VII) the weight ratio of 3,4-ethylenedioxythiophene to styrenesulfonic acid was 1:20.

<Manufacture of Organic EL Device>

Organic EL devices were manufactured in the same manner as in Comparative Example 1A except that the hole transport material was changed to the hole transport material prepared in this Comparative Example 2A.

Comparative Example 3A

<Preparation of Hole Transport Material>

The compound (II) was used as an arylamine derivative, and a polyester acrylate compound ("ARONIX M-8030" produced by TOAGOSEI Co., Ltd.) was used as a photo-crosslinking agent, and the compound (II), the polyester acrylate compound and a photo-radical polymerization initiator ("IRGACURE 651" produced by Nagase & Co., Ltd.) in a weight ratio of 30:65:5 were mixed with dichloroethane to obtain a hole transport material.

<Manufacture of Organic EL Device>

Organic EL devices were manufactured in the same manner as in Comparative Example 1A except that the hole transport material was changed to the hole transport material prepared in this Comparative Example 3A.

Comparative Example 4A

Organic EL devices were manufactured after a hole transport material was prepared in the same manner as in Example 1A except that the compound (HI) was used as an arylamine derivative.

Example 1B

<Preparation of Hole Transport Material>

The compound (AI) was used as an arylamine derivative, polyethyleneglycol di(meth)acrylate represented by the above-mentioned general formula (E1) (where $n^{12}$ is 9 and each of two $A^1$s is a hydrogen bond) (hereinafter, this compound will be referred to as "cross-linking agent E1") was used as a vinyl compound, and a photo-radical polymerization initiator ("IRGACURE 651" produced by Nagase & Co., Ltd.) was used as a photopolymerization initiator, and then they were dissolved with dichloroethane to obtain a hole transport material (that is, a composition for conductive materials).

In this regard, it is to be noted that the mixing ratio of the compound (AI) and the cross-linking agent E1 was 3:1 in a mole ratio, and the weight ratio of the total weight of the compound (AI) and the cross-linking agent E1 with respect to the photo-radical polymerization initiator was 19:1.

<Manufacture of Organic EL Device>

1B First, an ITO electrode (that is, an anode) was formed on a transparent glass substrate having an average thickness of 100 nm in the same manner as the step 1A described above.

2B Next, the prepared hole transport material was applied onto the ITO electrode by a spin coating method, and was then dried.

Then, the hole transport material was irradiated with ultraviolet rays having a wavelength of 185 nm from a mercury lamp ("UM-452", USHIO Inc.) through a filter at an intensity of irradiation of 2 mW/cm² for 300 seconds in the dry atmosphere to polymerize the compound (AI) and the cross-linking agent E1, so that a hole transport layer having an average thickness of 50 nm was formed.

3B Next, a light emitting layer having an average thickness of 50 nm was formed on the hole transport layer in the same manner as the step 3A described above.

4B Next, an electron transport layer having an average thickness of 20 nm was formed on the light emitting layer in the same manner as the step 4A described above.

5B Next, an AlLi electrode (that is, a cathode) having an average thickness of 300 nm was formed on the electron transport layer in the same manner as the step 5A described above.

6B Next, a protection cover made of polycarbonate was provided so as to cover these layers described above, and was then secured and sealed in the same manner as the step 6A described above to obtain an organic EL device.

Examples 2B to 5B

In each of Examples 2B to 5B, organic EL devices were manufactured after a hole transport material was prepared in the same manner as in Example 1B except the mixing ratio (mole ratio) of the compound (AI) and the cross-linking agent E1 was changed to those shown in Table 2.

Example 6B

Organic EL devices were manufactured after a hole transport material was prepared in the same manner as in Example 1B except that a divinylbenzene (hereinafter, referred to as "cross-linking agent E2") was used as the vinyl compound.

Examples 7B to 10B)

In each of Examples 7B to 10B, organic EL devices were manufactured after a hole transport material was prepared in the same manner as in Example 6B except that the mixing ratio (mole ratio) of the compound (AI) and the cross-linking agent E1 was changed to those shown in Table 2.

Examples 11B to 16B

In each of Examples 11B to 16B, organic EL devices were manufactured after a hole transport material was prepared in the same manner as in Example 1B except that as arylamine derivatives those shown in Table 2 were used, respectively.

Examples 1B' to 5B'

In each of Examples 1B' to 5B', organic EL devices were manufactured after a hole transport material was prepared in the same manner as in Example 1B except that the addition of the cross-liking agent E1 to the hole transport material was omitted and that the arylamine derivatives for use in the hole transport material were changed to those shown in Table 2.

Comparative Example 1B

Organic EL devices were manufactured in the same manner as in Comparative Example 1A.

Comparative Example 2B

Organic EL devices were manufactured in the same manner as in Comparative Example 2A.

Comparative Example 3B

Organic EL devices were manufactured in the same manner as in Comparative Example 3A.

Comparative Example 4B

Organic EL devices were manufactured in the same manner as in Comparative Example 4A.

Comparative Example 5B

Organic EL devices and conductive layers were manufactured after a hole transport material was prepared in the same manner as in Example 1B except that the compound (A1) was used as an arylamine derivative.

Example 1C

<Preparation of Hole Transport Material>

The compound (AII) was used as an arylamine derivative, and the compound (AII) and a photo-radical polymerization initiator ("IRGACURE 651" produced by Nagase & Co., Ltd.) in a weight ratio of 95:5 were mixed with dichloroethane to obtain a hole transport material (that is, a composition for conductive materials).

<Preparation of Electron Transport Material>

An electron transport material (that is, a composition for conductive materials) was obtained in the same manner as the hole transport material prepared in this example except that the compound (JII) was used as an arylamine derivative.

<Manufacture of Organic EL Device>

1C First, an ITO electrode (that is, an anode) was formed on a transparent glass substrate having an average thickness of 100 nm in the same manner as the step 1A described above.

2C Next, the prepared hole transport material was applied onto the ITO electrode by a spin coating method, and was then dried.

Then, the hole transport material was irradiated with ultraviolet rays having a wavelength of 185 nm from a mercury lamp ("UM-452", USHIO Inc.) through a filter at an intensity of irradiation of 3 mW/cm$^2$ for 400 seconds in the dry atmosphere to polymerize the compound (AII), so that a hole transport layer having an average thickness of 50 nm was formed.

3C Next, a light emitting layer having an average thickness of 50 nm was formed on the hole transport layer in the same manner as the step 3A described above.

4C Next, an electron transport layer having an average thickness of 20 nm was formed on the light emitting layer by the polymerization of the compound (JII) in the same manner as the step 2C described above except that the prepared electron transport material was used instead of the hole transport material.

5C Next, an AlLi electrode (that is, a cathode) having an average thickness of 300 nm was formed on the electron transport layer in the same manner as the step 5A described above.

6C Next, a protection cover made of polycarbonate was provided so as to cover these layers described above, and was then secured and sealed in the same manner as the step 6A described above to obtain an organic EL device.

Examples 2C to 15C

In each of Examples 2C to 15C, organic EL devices were manufactured after a hole transport material was prepared in the same manner as in Example 1C except that as for the arylamine derivatives for use in the hole transport material and the electron transport material, those shown in Table 3 were used, respectively.

Comparative Example 1C

<Preparation of Hole Transport Material>

A hole transport material was obtained by dissolving the compound (UII) in dichloroethane.

<Manufacture of Organic EL Device

Organic EL devices were manufactured in the same manner as in Example 1C except that a hole transport layer was formed using the prepared hole transport material but omitting the irradiation of ultraviolet rays at the step 2C and that an electron transport layer was formed using the compound (WII) by vacuum evaporation at the step 4C.

Comparative Example 2C

<Preparation of Hole Transport Material>

The compound (VII) was dispersed in water to prepare a 2.0 wt % water dispersion of the compound (VII) as a hole transport material.

In this regard, it is to be noted that in the compound (VII) the weight ratio of 3,4-ethylenedioxythiophene to styrenesulfonic acid was 1:20.

<Manufacture of Organic EL Device>

Organic EL devices were manufactured in the same manner as in Comparative Example 1C except that the hole transport material was changed to the hole transport material prepared in this Comparative Example.

Comparative Example 3C

<Preparation of Hole Transport Material>

The compound (UII) was used as an arylamine derivative, and a polyester acrylate compound ("ARONIX M-8030" produced by TOAGOSEI Co., Ltd.) was used as a photocrosslinking agent, and the compound (UII), the polyester acrylate compound and a photo-radical polymerization initiator ("IRGACURE 651" produced by Nagase & Co., Ltd.) in a weight ratio of 30:65:5 were mixed with dichloroethane to obtain a hole transport material.

<Manufacture of Organic EL Device>

Organic EL devices were manufactured in the same manner as in Comparative Example 1C except that the hole transport material was changed to the hole transport material prepared in the above-mentioned step 2C and that an electron transport layer was formed using the compound (WII) by vacuum evaporation in the step 4C.

Comparative Example 4C

<Preparation of Hole Transport Material>

The compound (HII) was used as an arylamine derivative, and the compound (HII) and a photo-radical polymerization initiator ("IRGACURE 651" produced by Nagase & Co., Ltd.) in a weight ratio of 95:5 were mixed with dichloroethane to obtain a hole transport material.

<Manufacture of Organic EL Device>

Organic EL devices were manufactured in the same manner as in Comparative Example 1C except that the hole transport material was changed to the hole transport material prepared in the above-mentioned step 2C and that an electron transport layer was formed using the compound (WII) by vacuum evaporation in the step 4C.

Example 1D

<Preparation of Hole Transport Material>

The compound (AII) was used as an arylamine derivative, the cross-linking agent E1 was used as a vinyl compound and a photo-radical polymerization initiator ("IRGACURE 651" produced by Nagase & Co., Ltd.) was used as a photopolimerization initiator, respectively, and then they were mixed with dichloroethane to obtain a hole transport material (that is, a composition for conductive materials).

In this regard, it is to be noted that the mixing ratio of the compound (AII) and the cross-linking agent E1 was 3:1 in a mole ratio, and the weight ratio of the total weight of the compound (AII) and the cross-linking agent E1 with respect to the photo-radical polymerization initiator was 19:1.

<Preparation of Electron Transport Material>

An electron transport material (that is, a composition for conductive materials) was obtained in the same manner as the hole transport material prepared in this Example except that the compound (JII) was used as an arylamine derivative.

<Manufacture of Organic EL Device>

1D First, an ITO electrode (that is, an anode) having an average thickness of 100 nm was formed on a transparent glass substrate in the same manner as the step 1A described above.

2D Next, the hole transport material was applied onto the ITO electrode by a spin coating method, and was then dried.

Then, the hole transport material was irradiated with ultraviolet rays having a wavelength of 185 nm from a mercury lamp ("UM-452", USHIO Inc.) through a filter at an intensity of irradiation of 2 mW/cm$^2$ for 300 seconds in the dry atmosphere to polymerize the compound (AII) and the cross-linking agent E1, so that a hole transport layer having an average thickness of 50 nm was formed.

3D Next, a light emitting layer having an average thickness of 50 mm was formed on the hole transport layer in the same manner as the step 3A described above.

4D Next, an electron transport layer having an average thickness of 20 nm was formed on the light emitting layer by polymerizing the compound (JII) and the cross-linking agent E1 in the same manner as the step 2D described above except that the prepared electron transport material was used instead of the hole transport material.

5D Next, an AlLi electrode (that is, a cathode) was formed on the electron transport layer so as to have an average thickness of 300 nm in the same manner as the step 5A described above.

6D Next, a protection cover made of polycarbonate was provided so as to cover these layers described above, and was then secured and sealed with an ultraviolet curable resin to obtain an organic EL device.

Examples 2D to 5D

In each of Examples 2D to 5D, organic EL devices were manufactured after a hole transport material and an electron transport material were prepared in the same manner as in Example 1D except that the mixing ratio (mole ratio) of the compound (AII) and the cross-linking agent E1 was changed to those shown in Table 4 (Table 4A).

Example 6D

Organic EL devices were manufactured after a hole transport material and an electron transport material were prepared in the same manner as in Example 1D except that the cross-linking agent E2 was uses as a vinyl compound.

Examples 7D to 10D

In each of the Examples 7D to 10D, organic EL devices were manufactured after a hole transport material and an electron transport material were prepared in the same manner as in Example 6D except that the mixing ratio (mole ratio) of the compound (AII) and the cross-linking agent E2 was changed to those shown in Table 2.

Examples 11D to 24D

In each of Examples 11D to 24D, organic EL devices were manufactured after a hole transport material was prepared in the same manner as in Example 1D except that as for the arylamine derivatives for use in the hole transport material and the electron transport material, those shown in Table 4 (Table 4A) were used, respectively.

Examples 1d' to 15D'

In each of Examples 1D' to 15D', organic EL devices were manufactured after a hole transport material was prepared in the same manner as in Example 1D except that the addition of the cross-liking agent E1 to the electron transport material was omitted and that the arylamine derivatives for use in the hole transport material and the electron transport material were changed to those shown in Table 4 (Table 4B).

Comparative Example 1D

Organic EL devices were manufactured in the same manner as in Comparative Example 1C.

Comparative Example 2D

Organic EL devices were manufactured in the same manner as Comparative Example 2C.

Comparative Examples 3D and 4D

In each of Comparative Examples 3D and 4D, organic EL devices were manufactured after a hole transport material and an electron transport material were prepared in the same manner as in Example 1D except that as for the arylamine derivatives for use in the hole transport material and the electron transport material, those shown in Table 4 (Table 4B) are used, respectively.

3. Evaluation of Organic EL Device

The luminous brightness (cd/m$^2$), the maximum luminous efficiency (lm/W), and the time that elapsed before the luminous brightness became half of the initial value (that is, a half-life) of each of the organic EL devices obtained in the Examples and Comparative Examples mentioned above were measured. Based on the measurement values for the five organic EL devices, an average was calculated.

In this regard, it is to be noted that the luminous brightness was measured by applying a voltage of 6V across the ITO electrode and the AlLi electrode.

The measurement values (that is, the luminous brightness, the maximum luminous efficiency, and the half-life) of each of the Examples 1A to 7A and the Comparative Examples 2A to 4A were evaluated based on the measurement values of the Comparative Example 1A according to the following four criteria, respectively.

A: The measurement value was 1.5 times or more that of Comparative Example 1A.

B: The measurement value was 1.25 times or more but less than 1.5 times that of Comparative Example 1A.

C: The measurement value was 1.00 times or more but less than 1.25 times that of Comparative Example 1A.

D: The measurement value was 0.75 times or more but less than 1.00 times that of Comparative Example 1A.

The evaluation results are shown in the attached Table 1.

As shown in Table 1, all the organic EL devices of the Examples (that is, organic EL devices including a hole transport layer which was formed using the conductive material according to the present invention as its main material) were superior to the organic EL devices of the Comparative Examples in their luminous brightness, maximum luminous efficiency, and half-life.

From the result, it has been found that in the organic EL device according to the present invention interaction between the adjacent main skeletons was properly decreased. In addition, it has also been found that in the organic EL device according to the present invention mutual dissolution between the hole transport layer and the light emitting layer was properly prevented.

Further, it has been also found that the organic EL devices of the Examples which were formed of the compositions each having the adjacent main skeletons which are allowed to exist at a more suitable interval, the luminous brightness and the maximum luminous efficiency were further improved and the half-life was also further prolonged.

The measurement values (that is, the luminous brightness, the maximum luminous efficiency, and the half-life) of each of the Examples 1B to 16B, the Examples 1B' to 7B' and the Comparative Examples 2B to 5B were evaluated based on the measurement values of the Comparative Example 1B according to the following four criteria, respectively.

A: The measurement value was 1.5 times or more that of Comparative Example 1B.

B: The measurement value was 1.25 times or more but less than 1.5 times that of Comparative Example 1B.

C: The measurement value was 1.00 times or more but less than 1.25 times that of Comparative Example 1B.

D: The measurement value was 0.75 times or more but less than 1.00 times that of Comparative Example 1B.

The evaluation results are shown in the attached Table 2.

As shown in Table 2, all the organic EL devices of the Examples (that is, organic EL devices including a hole transport layer which was formed using the conductive material according to the present invention as a main material) were superior to the organic EL devices of the Comparative Examples in their luminous brightness, maximum luminous efficiency, and half-life.

From the result, it has been found that in the organic EL device according to the present invention interaction between the adjacent main skeletons was properly decreased. In addition, it has also been found that in the organic EL device according to the present invention mutual dissolution between the hole transport layer and the light emitting layer was properly prevented.

Further, each of the organic EL devices of the Examples 1B to 16B shows a tendency that the maximum luminous efficiency was improved as compared to the organic EL devices of the Examples 1B' to 7B'. Such a result suggests that in the organic EL devices of the Examples 1B to 16B the interval between the adjacent main skeletons could be maintained at a more suitable distance due to the addition of the vinyl compound.

Furthermore, the organic EL devices of the Examples 1B, 2B, 3B, 6B, 7B and 8B which were formed from the hole transport material in which the compound represented by the above-mentioned general formula (A1) and the vinyl compound were mixed with a particularly preferable mixing ratio show a tendency that the luminous brightness and the maximum luminous efficiency were further improved and the half-life was also further prolonged as compared to the organic EL devices of the Examples 4B, 5B, 9B and 10B.

Moreover, in the case where the evaluation results are reviewed from the view point of the substituent $X^1$, there is a tendency that the compositions of the Examples which were formed of the compounds having the substituents $X^1$ each having an appropriate $n^1$ value in the general formula (A2), that is the compositions formed of the compounds having the substituents $X^1$ by which the adjacent main skeletons are allowed to exist at a suitable interval, could have more superior luminous brightness, maximum luminous efficiency, and half-life as compared to the compositions which do not have such a substituent $X^1$.

The measurement values (that is, the luminous brightness, the maximum luminous efficiency, and the half-life) of each of the Examples 1C to 15C and the Comparative Examples 2C to 4C were evaluated based on the measurement values of the Comparative Example 1C according to the following four criteria, respectively.

A: The measurement value was 1.5 times or more that of Comparative Example 1C.

B: The measurement value was 1.25 times or more but less than 1.5 times that of Comparative Example 1C.

C: The measurement value was 1.00 times or more but less than 1.25 times that of Comparative Example 1C.

D: The measurement value was 0.75 times or more but less than 1.00 times that of Comparative Example 1C.

The evaluation results are shown in the attached Table 3.

As shown in Table 3, all the organic EL devices of the Examples (that is, organic EL devices including a hole transport layer and a electron transport layer which were formed using the conductive material according to the present invention as a main material thereof) were superior to the organic EL devices of the Comparative Examples in their luminous brightness, maximum luminous efficiency, and half-life.

From the results, it has been found that in the organic EL device according to the present invention interaction between the adjacent main skeletons was properly decreased. In addition, it has also been found that in the organic EL device according to the present invention mutual dissolution between the hole transport layer and the light emitting layer was properly prevented.

Further, in the case where the evaluation results are reviewed from the view point of the substituent $X^1$, there is a tendency that the compositions of the Examples which were formed of the compounds having the substituents $X^1$ each having an appropriate $n^1$ value in the general formula (A2), that is the compositions which were formed of the compounds having the substituents $X^1$ by which the adjacent main skeletons are allowed to exist at a suitable interval, could have more superior luminous brightness, maximum luminous efficiency, and half-life as compared with the compositions which do not have such a substituent $X^1$.

Furthermore, the organic EL devices in the Examples each obtained by appropriately selecting conductive materials for respectively constituting the hole transport material and the electron transport material, namely, the organic EL devices in the Examples each having a preferred combination of the hole transport layer and the electron transport layer by appropriately selecting the group Y of the compound represented by the above-mentioned general formula (A1) could have superior luminous brightness, maximum luminous efficiency, and half-life.

The measurement values (that is, the luminous brightness the maximum luminous efficiency, and the half-life) of each of the Examples 1D to 24D, the Examples 1D' to 15D' and the Comparative Examples 2D to 4D were evaluated based on the measurement values of the Comparative Example 1D according to the following four criteria, respectively.

A: The measurement value was 1.5 times or more that of Comparative Example 1D.

B: The measurement value was 1.25 times or more but less than 1.5 times that of Comparative Example 1D.

C: The measurement value was 1.00 times or more but less than 1.25 times that of Comparative Example 1D.

D: The measurement value was 0.75 times or more but less than 1.00 times that of Comparative Example 1D.

The evaluation results are respectively shown in the attached Tables 4(A) and 4(B).

As shown in Tables 4(A) and 4(B), all the organic EL devices of the Examples (that is, the organic EL devices including a hole transport layer which was formed using the conductive material according to the present invention as its main material) were superior to the organic EL devices of the Comparative Examples in their luminous brightness, maximum luminous efficiency, and half-life.

From the result, it has been found that in the organic EL device according to the present invention interaction between the adjacent main skeletons was properly decreased. In addition, it has also been found that in the organic EL device according to the present invention mutual dissolution between the hole transport layer and the light emitting layer was properly prevented.

Further, each of the organic EL devices of the Examples 1D to 24D shows a tendency that the maximum luminous efficiency was improved as compared to the organic EL devices of the Examples 1D' to 15D'. Such a tendency was recognized more conspicuously as the organic EL devices which were formed of the hole transport materials each having a particularly preferable mixing ratio of the compound represented by the general formula (A1) and the vinyl compound. This result suggests that the interval between the adjacent main skeletons could be maintained at a more suitable interval due to the addition of the vinyl compound.

Moreover, in the case where the evaluation results are reviewed from the view point of the substituent $X^1$, there is a tendency that the compositions of the Examples which have substituents $X^1$ each having an appropriate $n^1$ value in the general formula (A2), that is the compositions having the substituents $X^1$ by which the adjacent main skeletons are allowed to exist at a suitable interval, could have more superior luminous brightness, maximum luminous efficiency, and half-life as compared to the compositions which do not have such a substituent $X^1$.

Moreover, the organic EL devices in the Examples each obtained by appropriately selecting conductive materials for respectively constituting the hole transport material and the electron transport material, namely, the organic EL devices in the Examples each having a preferred combination of the hole transport layer and the electron transport layer by appropriately selecting the group Y of the compound represented by the above-mentioned general formula (A1) could have superior luminous brightness, maximum luminous efficiency, and half-life.

4. Manufacture of Organic TFT

Five organic TFTs were manufactured in each of the following Examples and Comparative Examples.

Example 1E

<Preparation of Organic Semiconductor Material>

The compound (LII) was used as an arylamine derivative, and the compound (LII) and a photo-radical polymerization initiator ("IRGACURE 651" produced by Nagase & Co., Ltd.) in a weight ratio of 95:5 were mixed with dichloroethane to obtain an organic semiconductor material (that is, a composition for conductive materials).

<Manufacture of Organic TFT>

1E First, a glass substrate having an average thickness of 1 mm was prepared, and it was then washed with water (that is, with a cleaning fluid).

Next, a photoresist was applied onto the glass substrate by a spin coating method, and then the photoresist was prebaked to form a film.

Next, the film was irradiated with (or exposed to) ultraviolet rays through a photomask to develop it. In this way, a resist layer having openings where a source electrode and a drain electrode were to be provided was formed.

2E Next, an aqueous gold colloidal solution was supplied to the openings by an inkjet method. Then, the glass substrate to which the aqueous gold colloidal solution had been supplied was dried by heating to obtain a source electrode and a drain electrode.

3E Next, the resist layer was removed by oxygen plasma treatment. Then, the glass substrate on which the source electrode and the drain electrode had been formed was washed with water, and was then washed with methanol.

4E Next, the prepared organic semiconductor material was applied onto the substrate by a spin coating method and then it was dried.

Then, the organic semiconductor material was irradiated with ultraviolet rays having a wavelength of 185 nm from a mercury lamp ("UM-452", USHIO Inc.) through a filter at an intensity of irradiation of 3 mW/cm$^2$ for 400 seconds in the dry atmosphere to polymerize the compound (LII), so that an organic semiconductor layer having an average thickness of 50 nm was formed.

5E Next, a xylene solution of polymethylmethacrylate (PMMA) was applied onto the organic semiconductor layer by a spin coating method, and was then dried to form a gate insulating layer having an average thickness of 500 nm.

6E Next, a water dispersion of polyethylenedioxythiophene was applied to an area on the gate insulating layer corresponding to the area between the source electrode and the drain electrode by an inkjet method, and was then dried to form a gate electrode having an average thickness of 100 nm.

By way of these steps, an organic TFT was manufactured.

Examples 2E to 9E

In each of Examples 2E to 9E, organic TFTs were manufactured after the organic semiconductor material was prepared in the same manner as in Example 1E except that as for an arylamine derivative for use in preparing the organic semiconductor material, those shown in Table 5 were used.

Comparative Example 1E

<Preparation of Organic Semiconductor Material>

The compound (UII) was dissolved in dichloroethane to prepare an organic semiconductor material.

<Manufacture of Organic TFT>

Organic TFTs were manufactured in the same manner as in Example 1E except that the organic semiconductor material was changed to the organic semiconductor material prepared in the step 4E and the organic semiconductor material was not irradiated with ultraviolet rays from a mercury lamp in the step 4E.

Comparative Example 2E

<Preparation of Organic Semiconductor Material>

The compound (UII) was used as an arylamine derivative, and a polyester acrylate compound ("ARONIX M-8030" produced by TOAGOSEI Co., Ltd.) was used as a photo-crosslinking agent, and the compound (UII), the polyester acrylate compound and a photo-radical polymerization initiator ("IRGACURE 651" produced by Nagase & Co., Ltd.) in a weight ratio of 30:65:5 were mixed with dichloroethane to obtain an organic semiconductor material.

<Manufacture of Organic TFT>

Organic TFTs were manufactured in the same manner as in Example 1E except that the organic semiconductor material prepared in this Comparative Example was used as the organic semiconductor material.

Comparative Example 3E

Organic TFTs were manufactured after the organic semiconductor material was prepared in the same manner as in Example 1E except that the compound (QII) was used as an arylamine derivative for use in preparing the organic semiconductor material.

Example 1F

<Preparation of Organic Semiconductor Material>

The compound (LII) was used as an arylamine derivative, the cross-linking agent E1 was used as the vinyl compound, and a photo-radical polymerization initiator ("IRGACURE 651" produced by Nagase & Co., Ltd.) was used as a photo-polymerization initiator, and then they were dissolved with dichloroethane to obtain an organic semiconductor material (that is, a composition for conductive materials).

In this regard, it is to be noted that the mixing ratio of the compound (LII) and the cross-linking agent E1 was 3:1 in a molar ratio, and the weight ratio of the total weight of the compound (LII) and the cross-linking agent E1 with respect to the photo-radical polymerization initiator was 19:1.

<Manufacture of Organic TFT>

1F First, in the same manner as the step 1E described above, a resist layer having openings where a source electrode and a drain electrode were to be provided was formed on a glass substrate.

2F Next, in the same manner as the step 2E described above, a source electrode and a drain electrode were formed on the substrate.

3F Next, in the same manner as the step 3E described above, the resist layer was removed, and then the glass substrate on which the source electrode and the drain electrode had been formed was washed with water.

4F Next, in the same manner as the step 4E described above, the prepared organic semiconductor material was applied onto the substrate by a spin coating method and then it was dried.

Then, the organic semiconductor material was irradiated with ultraviolet rays having a wavelength of 185 nm from a mercury lamp ("UM-452", USHIO Inc.) through a filter at an intensity of irradiation of 2 mW/cm² for 300 seconds in the dry atmosphere to polymerize the compound (LII) and the cross-linking agent E1, so that an organic semiconductor layer having an average thickness of 50 nm was formed.

5F Next, in the same manner as the step 5E described above, a gate insulating layer having an average thickness of 500 nm was formed on the organic semiconductor layer.

6F Next, in the same manner as the step 6E described above, a gate electrode having an average thickness of 100 nm was formed on an area on the gate insulating layer corresponding to the area between the source electrode and the drain electrode.

Examples 2F to 5F

In each of Examples 2F to 5F, organic TFTs were manufactured after the organic semiconductor material was prepared in the same manner as in Example 1F except that the mixing ratio (mole ratio) of the compound (LII) and the cross-linking agent E1 were changed to those shown in Table 6 were used.

Example 6F

Organic TFTs were manufactured after the organic semiconductor material was prepared in the same manner as in Example 1F except that the cross-linking agent E2 was used as a vinyl compound.

Examples 7F to 10F

In each of the Examples 7F to 10F, organic TFTs were manufactured after the organic semi conductor material was prepared in the same manner as in Example 6F except that the mixing ratio (mole ratio) of the compound (LII) and the cross-linking agent E2 were changed to those shown in Table 6.

Examples 11F to 18F

In each of the Examples 11F to 18F, organic TFTs were manufactured after the organic semiconductor material was prepared in the same manner as in Example 1F except that as for an arylamine derivative for use in preparing the organic semiconductor material, those shown in Table 6 were used.

Examples 1F' to 9F'

In each of Examples 1F' to 9F', organic TFTs were manufactured after the organic semiconductor material was prepared in the same manner as in Example 1F except that the addition of the cross-linking agent E1 to the organic semiconductor material was omitted and the arylamine derivative for use in preparing the organic semiconductor material was changed to those shown in Table 6.

Comparative Example 1F

Organic TFTs were manufactured in the same manner as Comparative Example 1E.

Comparative Examples 2F and 3F

In each of Examples 2F and 3F, organic TFTs were manufactured after the organic semiconductor material was prepared in the same manner as in Example 1F except that the arylamine derivative for use in preparing the organic semiconductor material was changed to those shown in Table 6.

5. Evaluation of Organic TFT

The OFF-state current and the ON-state current of each of the organic TFTs manufactured in Examples and Comparative Examples were measured.

Here, the word "OFF-state current" means the value of current flowing between the source electrode and the drain electrode when a gate voltage is not applied, and the word "ON-state current" means the value of current flowing between the source electrode and the drain electrode when a gate voltage is applied.

Therefore, a larger value of ratio of the absolute value of the ON-state current to the absolute value of the OFF-state current (hereinafter, simply referred to as a "value of ON/OFF ratio") means that an organic TFT has better characteristics.

The OFF-state current was measured at a potential difference between the source electrode and the drain electrode of 30 V, and the ON-state current was measured at a potential difference between the source electrode and the drain electrode of 30 V and an absolute value of gate voltage of 40 V.

The value of ON/OFF ratio of each of the Examples and the Comparative Examples was evaluated according to the following four criteria.

A: The value of ON/OFF ratio was $10^4$ or more.
B: The value of ON/OFF ratio was $10^3$ or more but less than $10^4$.
C: The value of ON/OFF ratio was $10^2$ or more but less than $10^3$.
D: The value of ON/OFF ratio was less than $10^2$.

The evaluation results are shown in the following Table 5 and Table 6.

As shown in Table 5, the values of ON/OFF ratio of all the organic TFTs obtained in the Examples were larger than those of the organic TFTs obtained in the Comparative Examples. This means that all the organic TFTs of the Examples had better characteristics.

From the result, it has been found that interaction between the adjacent main skeletons was properly decreased. In addition, it has been also found that in the organic EL device according to the present invention mutual dissolution between the organic semiconductor layer and the gate insulating layer was properly prevented.

Further, in the case where the evaluation results are reviewed from the view point of the substituent $X^1$, there is a tendency that in the compositions of the Examples which were formed of the compounds having the substituents $X^1$ each having an appropriate $n^1$ value in the general formula (A2), that is the compositions formed of the compounds having the substituents $X^1$ by which the adjacent main skeletons are allowed to exist at a suitable interval, the value of ON/OFF ratio was more increased, that is, the characteristics of the organic TFT were further improved.

Further, as shown in Table 6, the values of ON/OFF ratio of all the organic TFTs obtained in the Examples were larger than those of the organic TFTs obtained in the Comparative Examples. This means that all the organic TFTs of the Examples had better characteristics.

From the result, it has been found that interaction between the adjacent main skeletons was properly decreased. In addition, it has been also found that in the organic TFTs according to the present invention mutual dissolution between the organic semiconductor layer and the gate insulating layer was properly prevented.

Further, there is a tendency that the organic TFTs of the Examples 1F to 18F were improved in the value of ON/OFF ratio as compared to the organic TFTs of the Examples 1F' to 9F'. This suggests that the addition of the vinyl compound allowed the adjacent main skeletons to exist at a more suitable interval.

Further, in the case where the evaluation results are reviewed from the view point of the substituent $X^1$, there is a tendency that the compositions of Examples which were formed of the compounds having the substituents $X^1$ each having an appropriate $n^1$ value in the general formula (A2), that is the compositions formed of the compounds having the substituents $X^1$ by which the adjacent main skeletons are allowed to exist at a suitable interval, could have more increased value of ON/OFF ratio, that is, the characteristics of the organic TFT were further improved.

INDUSTRIAL APPLICABILITY

According to the present invention, the polymer contained in the conductive material has a structure in which adjacent main skeletons of compounds are repeatedly bonded or linked through a chemical structure which is produced by the direct reaction between the substituents $X^1$ of the compounds or a chemical structure which is produced by the reaction between the substituents $X^1$ of the compounds via a vinyl compound, that is, a structure in which main skeletons are allowed to exist at a suitable interval repeatedly. Therefore, it is possible to decrease the interaction between the adjacent main skeletons in the polymer. Further, by forming the constituent material of the conductive layer from such a polymer, when an upper layer is formed on the conductive layer using a liquid material, it is possible to properly suppress or prevent the polymer from being swelled or dissolved by the solvent or dispersion medium contained in the liquid material. As a result, it is possible to prevent mutual dissolution from occurring between the conductive layer and the upper layer to be formed. For these reasons, the polymer can exhibit a high carrier transport ability, and thus a conductive material constituted from the polymer as its main material can also have a high carrier transport ability. Consequently, both an electronic device provided with such a conductive layer and electronic equipment provided such an electronic device can have high reliability. Therefore, the present invention has industrial adaptability required by PCT.

TABLE 1

|  | Hole transport material | Luminous brightness [Relative evaluation] | Maximum luminous efficiency [Relative evaluation] | Half-life [Relative evaluation] |
|---|---|---|---|---|
| Example 1A | Compound AI | A | A | A |
| Example 2A | Compound BI | A | A | A |
| Example 3A | Compound CI | A | A | A |
| Example 4A | Compound DI | B | B | B |
| Example 5A | Compound EI | B | B | B |
| Example 6A | Compound FI | A | A | A |
| Example 7A | Compound GI | B | B | B |
| Comp. Ex. 1A | Compound II | 1.00 | 1.00 | 1.00 |
| Comp. Ex. 2A | Compound VII | D | C | D |
| Comp. Ex. 3A | Compound II | C | C | C |
| Comp. Ex. 4A | Compound HI | C | C | C |

TABLE 2

|  | Hole transport material | | Luminous brightness [Relative evaluation] | Maximum luminous efficiency [Relative evaluation] | Half-life [Relative evaluation] |
|---|---|---|---|---|---|
|  | Arylamine derivative/ Vinyl compound | Mixing ratio of Arylamine derivative and Vinyl compound (molar ratio) | | | |
| Example 1B | AI/(E1) | 3:1 | A | A | A |
| Example 2B | AI/(E1) | 4:1 | A | A | A |
| Example 3B | AI/(E1) | 7:3 | A | A | A |
| Example 4B | AI/(E1) | 17:3 | A | A | B |
| Example 5B | AI/(E1) | 13:7 | A | A | B |
| Example 6B | AI/(E2) | 3:1 | A | A | A |
| Example 7B | AI/(E2) | 4:1 | A | A | A |

TABLE 2-continued

|  | Hole transport material | | Maximum | | |
|---|---|---|---|---|---|
|  | Arylamine derivative/ Vinyl compound | Mixing ratio of Arylamine derivative and Vinyl compound (molar ratio) | Luminous brightness [Relative evaluation] | luminous efficiency [Relative evaluation] | Half-life [Relative evaluation] |
| Example 8B | AI/(E2) | 7:3 | A | A | A |
| Example 9B | AI/(E2) | 17:3 | A | A | B |
| Example 10B | AI/(E2) | 13:7 | A | A | B |
| Example 11B | BI/(E1) | 3:1 | A | A | A |
| Example 12B | CI/(E1) | 3:1 | A | A | A |
| Example 13B | DI/(E1) | 3:1 | A | B | B |
| Example 14B | EI/(E1) | 3:1 | A | B | B |
| Example 15B | FI/(E1) | 3:1 | A | B | A |
| Example 16B | GI/(E1) | 3:1 | A | B | B |
| Example 1B' | AI/— | — | A | B | B |
| Example 2B' | BI/— | — | A | B | B |
| Example 3B' | CI/— | — | A | B | B |
| Example 4B' | DI/— | — | B | C | C |
| Example 5B' | EI/— | — | B | C | C |
| Example 6B' | FI/— | — | B | C | B |
| Example 7B' | GI/— | — | B | C | C |
| Comp. Ex. 1B | II/— | — | 1.00 | 1.00 | 1.00 |
| Comp. Ex. 2B | VII/— | — | D | C | D |
| Comp. Ex. 3B | II/— | — | C | C | C |
| Comp. Ex. 4B | HI/— | 3:1 | C | C | C |
| Comp. Ex. 5B | AI/— | — | C | C | C |

—: No Vinyl compound was added.

TABLE 3

|  | Hole transport material | Electron transport material | Luminous brightness [Relative evaluation] | Maximum luminous efficiency [Relative evaluation] | Half-life [Relative evaluation] |
|---|---|---|---|---|---|
| Example 1C | Compound AII | Compound JII | A | A | A |
| Example 2C | Compound BII | Compound JII | A | A | A |
| Example 3C | Compound CII | Compound JII | A | A | A |
| Example 4C | Compound DII | Compound JII | A | B | B |
| Example 5C | Compound EII | Compound JII | A | B | B |
| Example 6C | Compound FII | Compound JII | A | B | A |
| Example 7C | Compound GII | Compound JII | A | B | B |
| Example 8C | Compound III | Compound KII | A | A | A |
| Example 9C | Compound AII | Compound KII | A | A | A |
| Example 10C | Compound III | Compound JII | A | A | A |
| Example 11C | Compound LII | Compound JII | A | B | A |
| Example 12C | Compound LII | Compound KII | A | B | A |
| Example 13C | Compound AII | Compound TII | A | B | A |
| Example 14C | Compound III | Compound TII | A | B | A |
| Example 15C | Compound LII | Compound TII | B | B | B |
| Comp. Ex. 1C | Compound UII | Compound WII | 1.00 | 1.00 | 1.00 |
| Comp. Ex. 2C | Compound VII | Compound WII | D | C | D |
| Comp. Ex. 3C | Compound UII | Compound WII | C | C | C |
| Comp. Ex. 4C | Compound HII | Compound WII | C | C | C |

TABLE 4

|  | Hole transport material | | Electron transport material | | | | |
|---|---|---|---|---|---|---|---|
|  | Arylamine derivative/ Vinyl Compound | Mixing ratio of Arylamine derivative and Vinyl compound (molar ratio) | Arylamine derivative/ Vinyl Compound | Mixing ratio of Arylamine derivative and Vinyl compound (molar ratio) | Hole transport material | Electron transport material | Half-life [Relative evaluation] |
| Example 1D | AII/(E1) | 3:1 | JII/(E1) | 3:1 | A | A | A |
| Example 2D | AII/(E1) | 4:1 | JII/(E1) | 4:1 | A | A | A |
| Example 3D | AII/(E1) | 7:3 | JII/(E1) | 7:3 | A | A | A |
| Example 4D | AII/(E1) | 17:3 | JII/(E1) | 17:3 | A | A | B |
| Example 5D | AII/(E1) | 13:7 | JII/(E1) | 13:7 | A | A | B |

TABLE 4-continued

| | Hole transport material | | Electron transport material | | | | |
|---|---|---|---|---|---|---|---|
| | Arylamine derivative/ Vinyl Compound | Mixing ratio of Arylamine derivative and Vinyl compound (molar ratio) | Arylamine derivative/ Vinyl Compound | Mixing ratio of Arylamine derivative and Vinyl compound (molar ratio) | Hole transport material | Electron transport material | Half-life [Relative evaluation] |
| Example 6D | AII/(E2) | 3:1 | JII/(E2) | 3:1 | A | A | A |
| Example 7D | AII/(E2) | 4:1 | JII/(E2) | 4:1 | A | A | A |
| Example 8D | AII/(E2) | 7:3 | JII/(E2) | 7:3 | A | A | A |
| Example 9D | AII/(E2) | 17:3 | JII/(E2) | 17:3 | A | A | B |
| Example 10D | AII/(E2) | 13:7 | JII/(E2) | 13:7 | A | A | B |
| Example 11D | BII/(E1) | 3:1 | JII/(E1) | 3:1 | A | A | A |
| Example 12D | CII/(E1) | 3:1 | JII/(E1) | 3:1 | A | A | B |
| Example 13D | DII/(E1) | 3:1 | JII/(E1) | 3:1 | A | A | A |
| Example 14D | EII/(E1) | 3:1 | JII/(E1) | 3:1 | A | B | B |
| Example 15D | FII/(E1) | 3:1 | JII/(E1) | 3:1 | A | B | A |
| Example 16D | GII/(E1) | 3:1 | JII/(E1) | 3:1 | A | B | B |
| Example 17D | III/(E1) | 3:1 | KII/(E1) | 3:1 | A | A | A |
| Example 18D | AII/(E1) | 3:1 | KII/(E1) | 3:1 | A | A | A |
| Example 19D | III/(E1) | 3:1 | JII/(E1) | 3:1 | A | A | A |
| Example 20D | LII/(E1) | 3:1 | JII/(E1) | 3:1 | A | B | A |
| Example 21D | LII/(E1) | 3:1 | KII/(E1) | 3:1 | A | B | A |
| Example 22D | AII/(E1) | 3:1 | TII/(E1) | 3:1 | A | B | A |
| Example 23D | III/(E1) | 3:1 | TII/(E1) | 3:1 | A | B | A |
| Example 24D | LII/(E1) | 3:1 | TII/(E1) | 3:1 | B | B | B |
| Example 1D' | AII/— | — | JII/— | — | A | B | B |
| Example 2D' | BII/— | — | JII/— | — | A | B | B |
| Example 3D' | CII/— | — | JII/— | — | A | B | B |
| Example 4D' | DII/— | — | JII/— | — | B | C | B |
| Example 5D' | EII/— | — | JII/— | — | B | C | B |
| Example 6D' | FII/— | — | JII/— | — | A | C | B |
| Example 7D' | GII/— | — | JII/— | — | B | C | B |
| Example 8D' | III/— | — | KII/— | — | A | B | B |
| Example 9D' | AII/— | — | KII/— | — | A | B | B |
| Example 10D' | III/— | — | JII/— | — | A | B | B |
| Example 11D' | LII/— | — | JII/— | — | A | C | B |
| Example 12D' | LII/— | — | KII/— | — | A | C | B |
| Example 13D' | AII/— | — | TII/— | — | A | C | B |
| Example 14D' | III/— | — | TII/— | — | A | C | B |
| Example 15D' | LII/— | — | TII/— | — | B | C | C |
| Comp. Ex. 1D | UII/— | — | WII/— | — | 1.00 | 1.00 | 1.00 |
| Comp. Ex. 2D | VII/— | — | WII/— | — | D | C | D |
| Comp. Ex. 3D | UII/(E1) | 3:1 | WII/(E1) | 3:1 | C | C | C |
| Comp. Ex. 4D | HII/(E1) | 3:1 | WII/(E1) | 3:1 | C | C | C |

—: No Vinyl compound was added.

TABLE 5

| | Organic semiconductor material | ON/OFF ratio |
|---|---|---|
| Example 1E | Compound LII | A |
| Example 2E | Compound MII | A |
| Example 3E | Compound NII | B |
| Example 4E | Compound OII | B |
| Example 5E | Compound PII | B |
| Example 6E | Compound RII | A |
| Example 7E | Compound SII | A |
| Example 8E | Compound TII | A |
| Example 9E | Compound III | A |
| Comp. Ex. 1E | Compound UII | D |
| Comp. Ex. 2E | Compound UII | C |
| Comp. Ex. 3E | Compound QII | C |

TABLE 6

| | Organic semiconductor material | | |
|---|---|---|---|
| | Arylamine derivative/ Vinyl Compound | Mixing ratio of Arylamine derivative and Vinyl compound (molar ratio) | ON/OFF ratio |
| Example 1F | LII/(E1) | 3:1 | A |
| Example 2F | LII/(E1) | 4:1 | A |
| Example 3F | LII/(E1) | 7:3 | A |
| Example 4F | LII/(E1) | 17:3 | A~B |
| Example 5F | LII/(E1) | 13:7 | A~B |
| Example 6F | LII/(E2) | 3:1 | A |
| Example 7F | LII/(E2) | 4:1 | A |
| Example 8F | LII/(E2) | 7:3 | A |
| Example 9F | LII/(E2) | 17:3 | A~B |
| Example 10F | LII/(E2) | 13:7 | A~B |
| Example 11F | MII/(E1) | 3:1 | A |
| Example 12F | NII/(E1) | 3:1 | A~B |
| Example 13F | OII/(E1) | 3:1 | A~B |
| Example 14F | PII/(E1) | 3:1 | A~B |
| Example 15F | RII/(E1) | 3:1 | A |
| Example 16F | SII/(E1) | 3:1 | A |

TABLE 6-continued

| | Organic semiconductor material | | |
|---|---|---|---|
| | Arylamine derivative/ Vinyl Compound | Mixing ratio of Arylamine derivative and Vinyl compound (molar ratio) | ON/OFF ratio |
| Example 17F | TII/(E1) | 3:1 | A |
| Example 18F | III/(E1) | 3:1 | A |
| Example 1F' | LII/— | — | B |
| Example 2F' | MII/— | — | B |
| Example 3F' | NII/— | — | B~C |
| Example 4F' | OII/— | — | B~C |
| Example 5F' | PII/— | — | B~C |
| Example 6F' | RII/— | — | B |
| Example 7F' | SII/— | — | B |
| Example 8F' | TII/— | — | B |
| Example 9F' | III/— | — | B |
| Comp. Ex. 1F | UII/— | — | D |
| Comp. Ex. 2F | UII/(E1) | 3:1 | C |
| Comp. Ex. 3F | QII/(E1) | 3:1 | C |

—: No Vinyl compound was added.

The invention claimed is:

1. A composition for conductive materials, comprising a compound represented by the following general formula (A1):

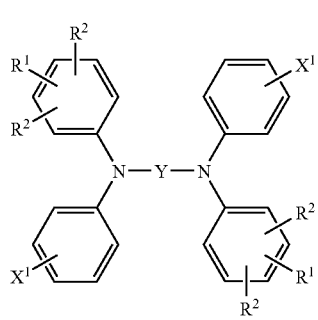

wherein two $R^1$s may be the same or different and each independently represents a straight-chain alkyl group having 2 to 8 carbon atoms, four $R^2$s may be the same or different and each independently represents a hydrogen atom, a methyl group or an ethyl group, Y represents a group containing at least one substituted or unsubstituted aromatic hydrocarbon ring or substituted or unsubstituted heterocycle, and two $X^1$s may be the same or different and each independently represents a substituent represented by the following general formula (A2):

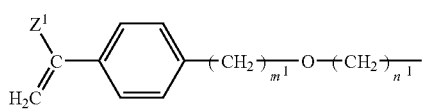

wherein $n^1$ is an integer of 3 to 8, $m^1$ is an integer of 0 to 3, and $Z^1$ represents a hydrogen atom, a methyl group or an ethyl group.

2. The composition for conductive materials as claimed in claim 1, wherein the group Y contains at least one substituted or unsubstituted aromatic hydrocarbon ring.

3. The composition for conductive materials as claimed in claim 2, wherein the two substituents $X^1$ are identical with each other.

4. The composition for conductive materials as claimed in claim 2, wherein each substituent $X^1$ is bonded to the 3-, 4- or 5-position of the benzene ring.

5. The composition for conductive materials as claimed in claim 2, wherein the two substituents $R^1$ are identical with each other.

6. The composition for conductive materials as claimed in claim 2, wherein each substituent $R^1$ is bonded to the 4-position of the benzene ring.

7. The composition for conductive materials as claimed in claim 2, wherein the group Y consists of carbon atoms and hydrogen atoms.

8. The composition for conductive materials as claimed in claim 2, wherein the group Y contains 6 to 30 carbon atoms in total.

9. The composition for conductive materials as claimed in claim 2, wherein the group Y contains 1 to 5 aromatic hydrocarbon rings.

10. The composition for conductive materials as claimed in claim 2, wherein the group Y is a biphenylene group or a derivative thereof.

11. The composition for conductive materials as claimed in claim 2, further comprising a vinyl compound served as a cross-linking agent for cross-linking the compounds each represented by the above-mentioned general formula (A1) with each other at their respective substituents $X^1$.

12. The composition for conductive materials as claimed in claim 11, wherein the vinyl compound has at least two reactive groups which are capable of reacting with the substituents $X^1$ of the compounds, respectively.

13. The composition for conductive materials as claimed in claim 11, wherein the vinyl compound has an adjusting portion positioned between the two reactive groups for adjusting the interval between the reactive groups.

14. The composition for conductive materials as claimed in claim 13, wherein the adjusting portion has a straight-chain structure.

15. The composition for conductive materials as claimed in claim 14, wherein the adjusting portion is comprised of a number of atoms, and in the atoms 15 to 50 atoms form the straight-chain structure.

16. The composition for conductive materials as claimed in claim 15, wherein the vinyl compound contains as its main ingredient polyethyleneglycol di(meth)acrylate represented by the following general formula (E1):

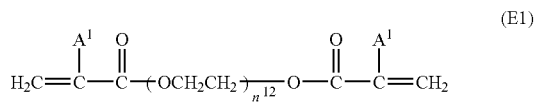

where $n^{12}$ is an integer of 5 to 15, and two $A^1$s may be the same or different and each independently represents a hydrogen atom or a methyl group.

17. The composition for conductive materials as claimed in claim 13, wherein the adjusting portion contains a ring structure.

18. The composition for conductive materials as claimed in claim 17, wherein the ring structure is an aromatic ring.

19. The composition for conductive materials as claimed in claim 18, wherein at least one of the reactive groups is directly bonded to the ring structure.

20. The composition for conductive materials as claimed in claim 19, wherein the vinyl compound contains divinylbenzene as its main ingredient.

21. The composition for conductive materials as claimed in claim 11, wherein the two substituents $X^1$ are identical with each other.

22. The composition for conductive materials as claimed in claim 11, wherein each substituent $X^1$ is bonded to the 3-, 4- or 5-position of the benzene ring.

23. The composition for conductive materials as claimed in claim 11, wherein the two substituents $R^1$ are identical with each other.

24. The composition for conductive materials as claimed in claim 11, wherein each substituent $R^1$ is bonded to the 4-position of the benzene ring.

25. The composition for conductive materials as claimed in claim 11, wherein the group Y consists of carbon atoms and hydrogen atoms.

26. The composition for conductive materials as claimed in claim 11, wherein the group Y contains 6 to 30 carbon atoms in total.

27. The composition for conductive materials as claimed in claim 11, wherein the group Y contains 1 to 5 aromatic hydrocarbon rings.

28. The composition for conductive materials as claimed in claim 11, wherein the group Y is a biphenylene group or a derivative thereof.

29. The composition for conductive materials as claimed in claim 1, wherein the group Y contains at least one substituted or unsubstituted heterocycle.

30. The composition for conductive materials as claimed in claim 29, wherein the two substituents $X^1$ are identical with each other.

31. The composition for conductive materials as claimed in claim 29, wherein each substituent $X^1$ is bonded to the 3-, 4- or 5-position of the benzene ring.

32. The composition for conductive materials as claimed in claim 29, wherein the two substituents $R^1$ are identical with each other.

33. The composition for conductive materials as claimed in claim 29, wherein each substituent $R^1$ is bonded to the 4-position of the benzene ring.

34. The composition for conductive materials as claimed in claim 29, wherein the heterocycle contains at least one heteroatom selected from the group comprising nitrogen, oxygen, sulfur, selenium and tellurium.

35. The composition for conductive materials as claimed in claim 29, wherein the heterocycle is an aromatic heterocycle.

36. The composition for conductive materials as claimed in claim 29, wherein the group Y contains 1 to 5 heterocycles.

37. The composition for conductive materials as claimed in claim 29, wherein the group Y contains at least one substituted or unsubstituted aromatic hydrocarbon ring in addition to the heterocycle.

38. The composition for conductive materials as claimed in claim 37, wherein the group Y contains two aromatic hydrocarbon rings respectively bonded to each N in the general formula (A1) directly and at least one heterocycle existing between these aromatic hydrocarbon rings.

39. The composition for conductive materials as claimed in claim 29, wherein the group Y contains 2 to 75 carbon atoms in total.

40. The composition for conductive materials as claimed in claim 29, further comprising a vinyl compound served as a cross-linking agent for cross-linking the compounds each represented by the above-mentioned general formula (A1) with each other at their respective substituents $X^1$.

41. The composition for conductive materials as claimed in claim 40, wherein the vinyl compound has at least two reactive groups which are capable of reacting with the substituents $X^1$ of the compounds, respectively.

42. The composition for conductive materials as claimed in claim 41, wherein the vinyl compound has an adjusting portion positioned between the two reactive groups for adjusting the interval between the reactive groups.

43. The composition for conductive materials as claimed in claim 42, wherein the adjusting portion has a straight-chain structure.

44. The composition for conductive materials as claimed in claim 43, wherein the adjusting portion is comprised of a number of atoms, and in the atoms 15 to 50 atoms form the straight-chain structure.

45. The composition for conductive materials as claimed in claim 44, wherein the vinyl compound contains as its main ingredient polyethyleneglycol di(meth)acrylate represented by the following general formula (E1):

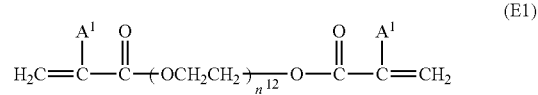

where $n^{12}$ is an integra of 5 to 15, and two $A^1$s may be the same or different and each independently represents a hydrogen atom or a methyl group.

46. The composition for conductive materials as claimed in claim 42, wherein the adjusting portion contains a ring structure.

47. The composition for conductive materials as claimed in claim 46, wherein the ring structure is an aromatic ring.

48. The composition for conductive materials as claimed in claim 47, wherein at least one of the reactive groups is directly bonded to the ring structure.

49. The composition for conductive materials as claimed in claim 48, wherein the vinyl compound contains divinylbenzene as its main ingredient.

50. The composition for conductive materials as claimed in claim 40, wherein the two substituents $X^1$ are identical with each other.

51. The composition for conductive materials as claimed in claim 40, wherein each substituent $X^1$ is bonded to the 3-, 4- or 5-position of the benzene ring.

52. The composition for conductive materials as claimed in claim 40, wherein the two substituents $R^1$ are identical with each other.

53. The composition for conductive materials as claimed in claim 40, wherein each substituent $R^1$ is bonded to the 4-position of the benzene ring.

54. The composition for conductive materials as claimed in claim 40, wherein the heterocycle contains at least one heteroatom selected from the group comprising nitrogen, oxygen, sulfur, selenium and tellurium.

55. The composition for conductive materials as claimed in claim 40, wherein the heterocycle is an aromatic heterocycle.

56. The composition for conductive materials as claimed in claim 40, wherein the group Y contains 1 to 5 heterocycles.

57. The composition for conductive materials as claimed in claim 40, wherein the group Y contains at least one substituted or unsubstituted aromatic hydrocarbon ring in addition to the heterocycle.

58. The composition for conductive materials as claimed in claim 57, wherein the group Y contains two aromatic hydrocarbon rings respectively bonded to each N in the general formula (A1) directly and at least one heterocycle existing between these aromatic hydrocarbon rings.

59. The composition for conductive materials as claimed in claim 40, wherein the group Y contains 2 to 75 carbon atoms in total.

60. A conductive material obtained by direct polymerization or polymerization via a vinyl compound of substituents $X^1$ of compounds each represented by the following general formula (A1) and contained in the composition for conductive materials defined by claim 1:

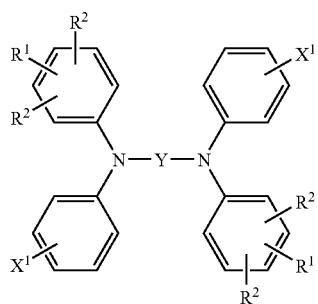
(A1)

wherein two $R^1$s may be the same or different and each independently represents a straight-chain alkyl group having 2 to 8 carbon atoms, four $R^2$s may be the same or different and each independently represents a hydrogen atom, a methyl group, or an ethyl group, Y represents a group containing at least one substituted or unsubstituted aromatic hydrocarbon ring or substituted or unsubstituted heterocycle, and two $X^1$s may be the same or different and each independently represents a substituent represented by the following general formula (A2):

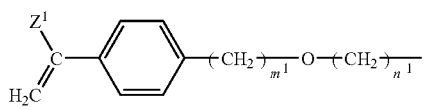
(A2)

wherein $n^1$ is an integer of 3 to 8, $m^1$ is an integer of 0 to 3, and $Z^1$ represents a hydrogen atom, a methyl group or an ethyl group.

61. The conductive material as claimed in claim 60, wherein the compounds are polymerized by light irradiation.

62. The conductive material as claimed in claim 60, wherein the compounds and the vinyl compound are polymerized by light irradiation.

63. A conductive layer mainly comprising the conductive material defined in claim 60.

64. The conductive layer as claimed in claim 63, wherein the conductive layer is a hole transport layer.

65. The conductive layer as claimed in claim 64, wherein the average thickness of the hole transport layer is in the range of 10 to 150 nm.

66. The conductive layer as claimed in claim 63, wherein the conductive layer is an electron transport layer.

67. The conductive layer as claimed in claim 66, wherein the average thickness of the electron transport layer is in the range of 1 to 100 nm.

68. The conductive layer as claimed in claim 63, wherein the conductive layer is an organic semiconductor layer.

69. The conductive layer as claimed in claim 68, wherein the average thickness of the organic semiconductor layer is in the range of 0.1 to 1,000 nm.

70. An electronic device comprising a laminated body which includes the conductive layer defined in claim 63.

71. The electronic device as claimed in claim 70, which is a light emitting device or a photoelectric transducer.

72. The electronic device as claimed in claim 71, wherein the light emitting device is an organic electroluminescent device.

73. The electronic device as claimed in claim 70, wherein the electronic device is a switching element.

74. The electronic device as claimed in claim 73, wherein the switching element is an organic thin film transistor.

75. Electronic equipment comprising the electronic device as claimed in claim 70.

* * * * *